(12) United States Patent
Yamashita et al.

(10) Patent No.: US 11,355,510 B2
(45) Date of Patent: Jun. 7, 2022

(54) SEMICONDUCTOR MEMORY DEVICE

(71) Applicant: Kioxia Corporation, Minato-ku (JP)

(72) Inventors: Tetsuya Yamashita, Yokkaichi (JP);
Takuyo Nakayama, Inagi (JP);
Takashi Ichikawa, Saitama (JP);
Tadayoshi Uechi, Kawasaki (JP);
Takashi Izumida, Kamakura (JP)

(73) Assignee: Kioxia Corporation, Minato-ku (JP)

( * ) Notice: Subject to any disclaimer, the term of this patent is extended or adjusted under 35 U.S.C. 154(b) by 225 days.

(21) Appl. No.: 16/801,312

(22) Filed: Feb. 26, 2020

(65) Prior Publication Data

US 2021/0091044 A1 Mar. 25, 2021

(30) Foreign Application Priority Data

Sep. 20, 2019 (JP) .............................. JP2019-171389

(51) Int. Cl.
*H01L 27/11575* (2017.01)
*H01L 27/11582* (2017.01)
*H01L 27/11565* (2017.01)
*H01L 27/11578* (2017.01)

(52) U.S. Cl.
CPC .. *H01L 27/11565* (2013.01); *H01L 27/11575* (2013.01); *H01L 27/11578* (2013.01); *H01L 27/11582* (2013.01)

(58) Field of Classification Search
CPC ......... H01L 27/11565; H01L 27/11575; H01L 27/11578–11582
See application file for complete search history.

(56) References Cited

U.S. PATENT DOCUMENTS

| | | | |
|---|---|---|---|
| 9,391,087 B2 | 7/2016 | Shibata et al. | |
| 10,217,757 B2 | 2/2019 | Shimojo | |
| 10,431,273 B2 | 10/2019 | Futatsuyama | |
| 10,685,973 B2* | 6/2020 | Song | ................. H01L 27/11578 |
| 2019/0067321 A1* | 2/2019 | Song | ..................... H01L 23/562 |
| 2020/0075616 A1 | 3/2020 | Hashimoto et al. | |
| 2020/0303300 A1* | 9/2020 | Kato | ................... H01L 23/5283 |

FOREIGN PATENT DOCUMENTS

| | | |
|---|---|---|
| JP | 6139370 B2 | 5/2017 |
| JP | 2017-163057 A | 9/2017 |
| JP | 6571208 B2 | 9/2019 |
| JP | 2020-35926 A | 3/2020 |

* cited by examiner

*Primary Examiner* — Julio J Maldonado
*Assistant Examiner* — Molly K Reida
(74) *Attorney, Agent, or Firm* — Oblon, McClelland, Maier & Neustadt, L.L.P.

(57) ABSTRACT

According to one embodiment, a semiconductor memory device includes a first stacked body in which a plurality of first conductive layers are stacked at intervals in a first direction above a semiconductor substrate; a second stacked body in which a plurality of second conductive layers are stacked at intervals in the first direction above the semiconductor substrate; and a first slit extending in a second direction perpendicular to the first direction, the first slit isolating the first stacked body and the second stacked body in a third direction perpendicular to the first and second directions.

10 Claims, 56 Drawing Sheets

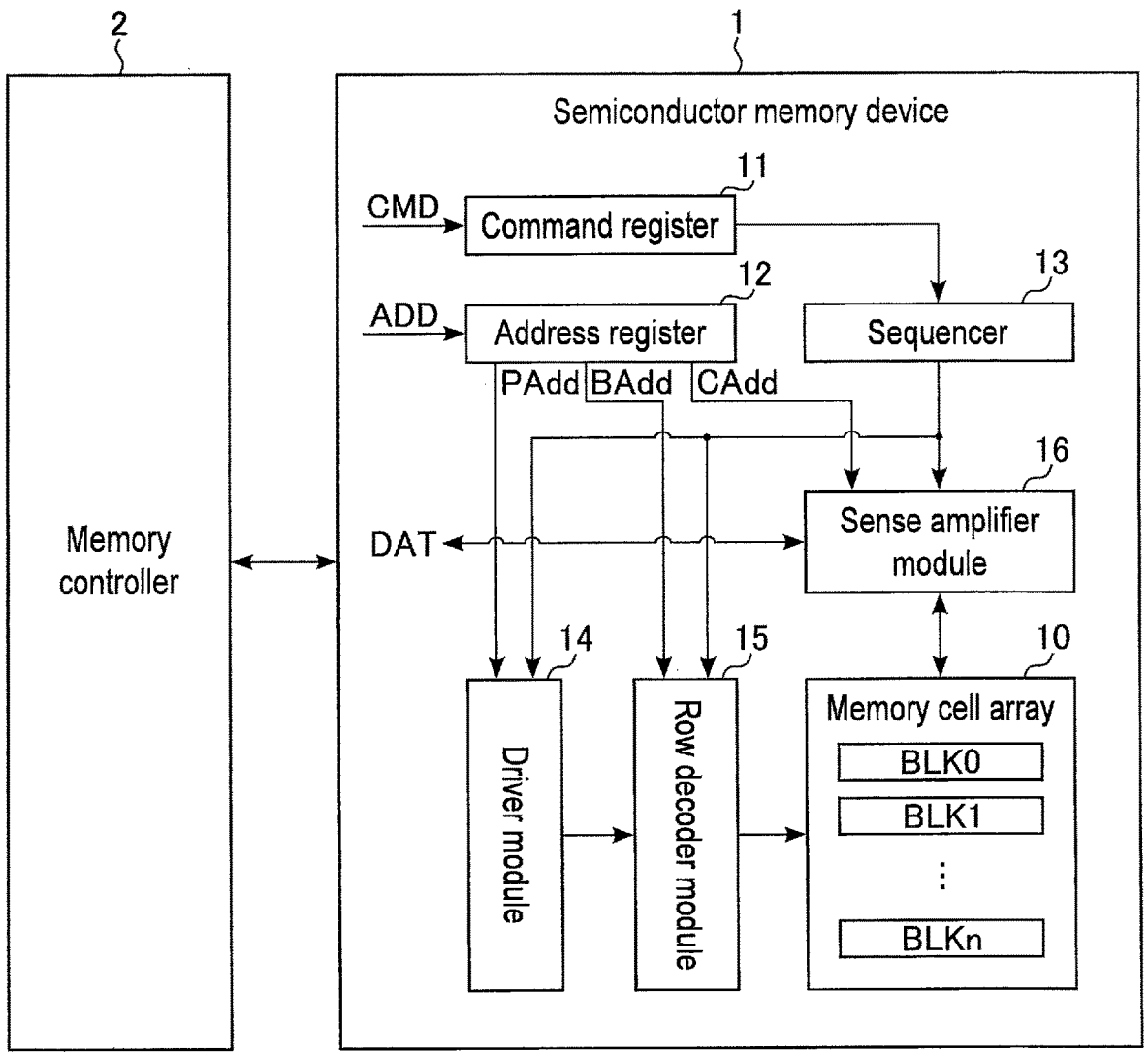
F I G. 1

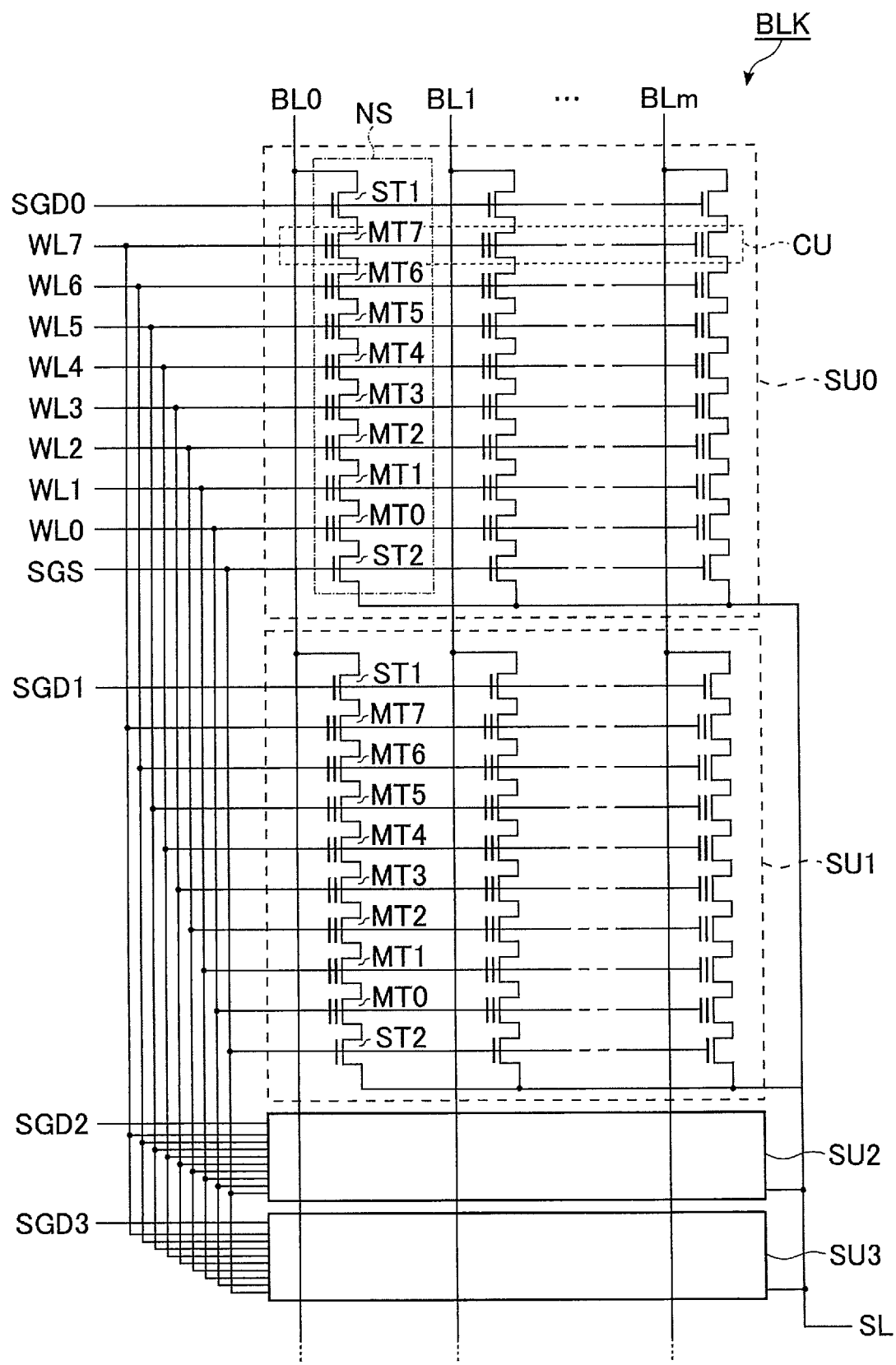
F I G. 2

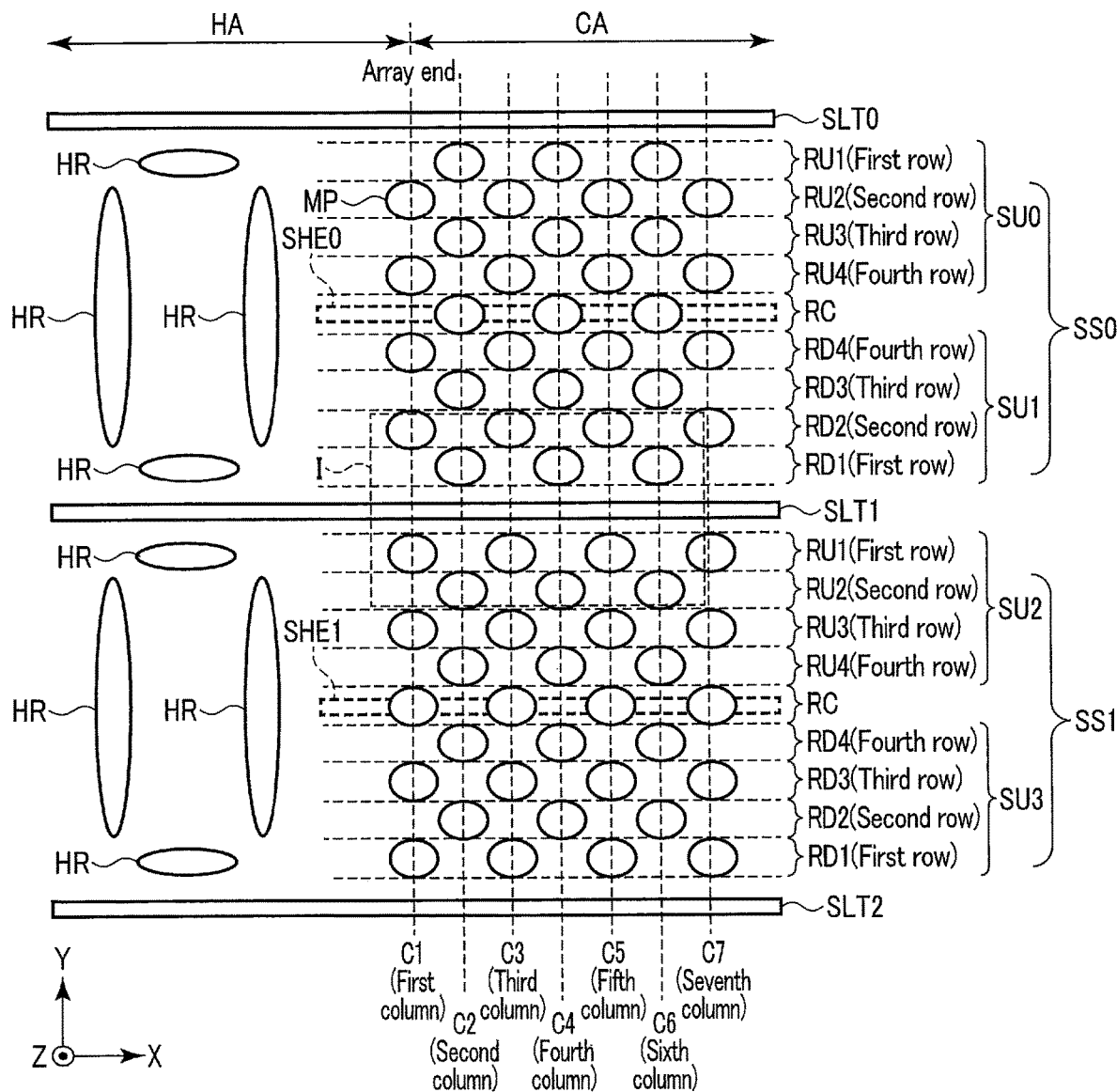
F I G. 10

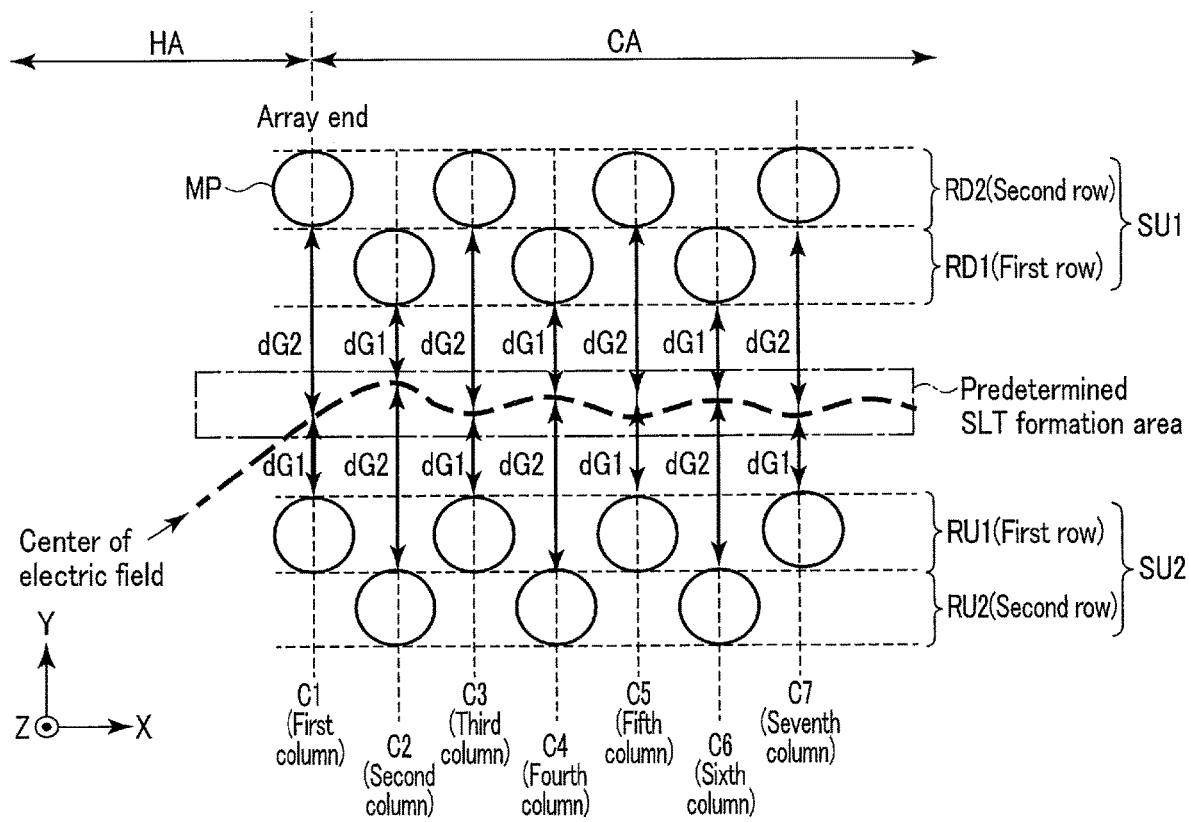
F I G. 11

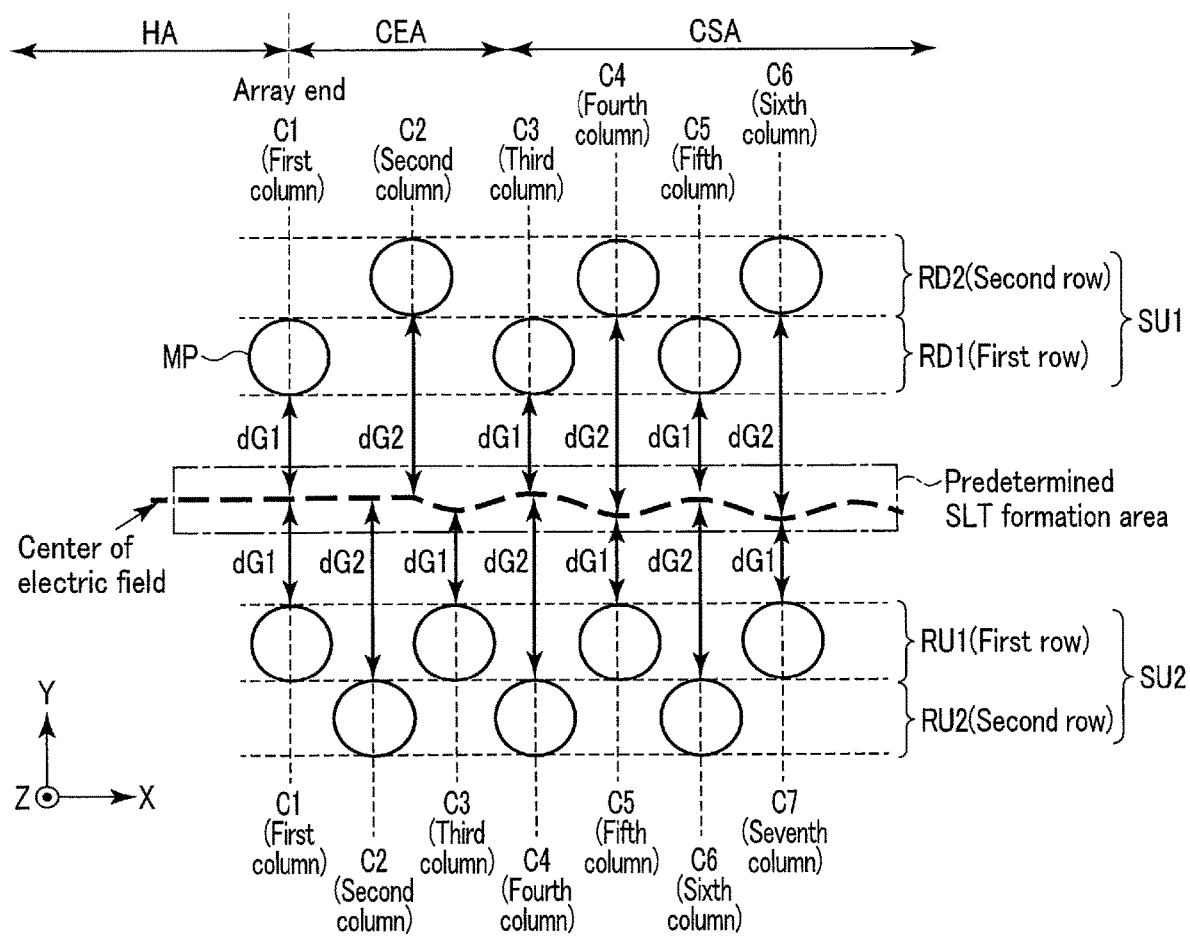
F I G. 13

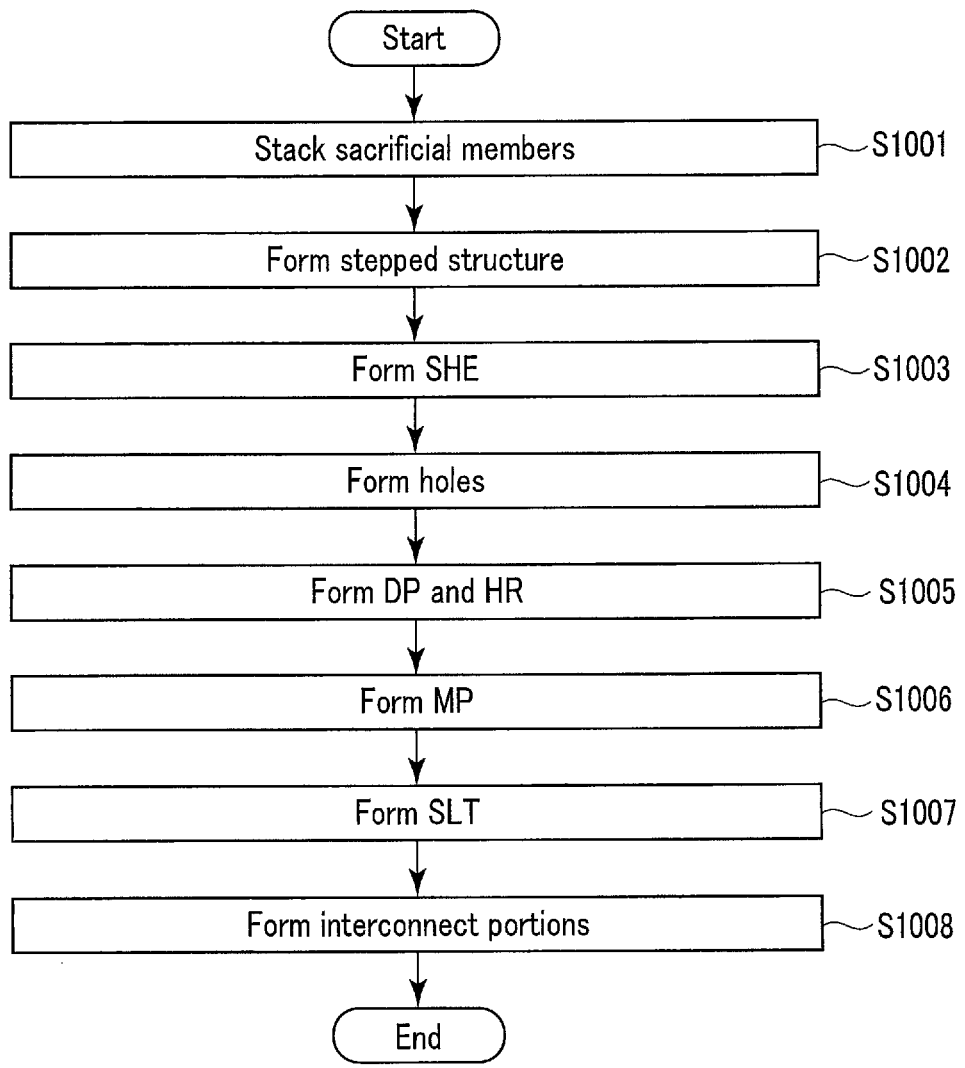
F I G. 20

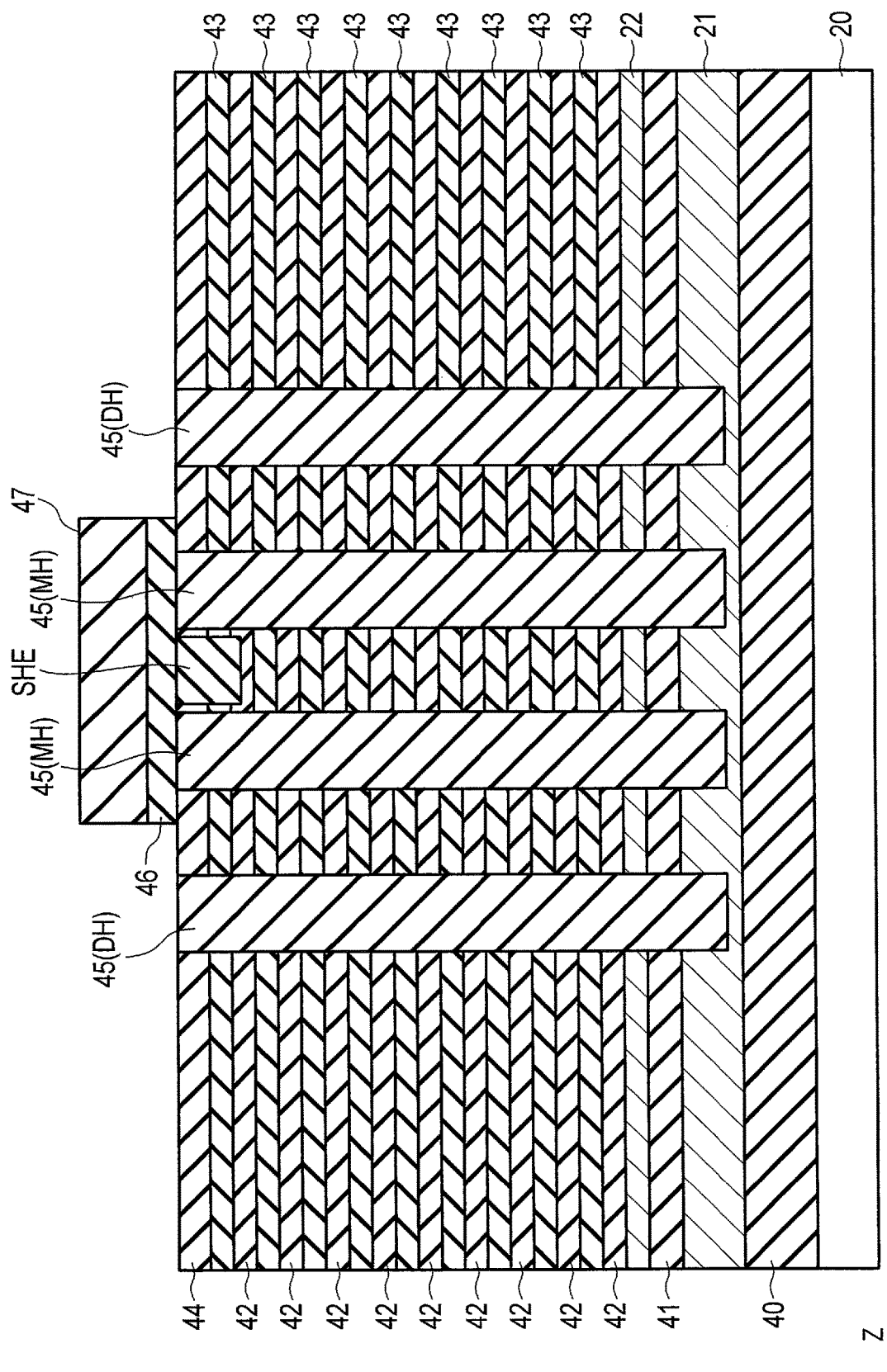
F I G. 30

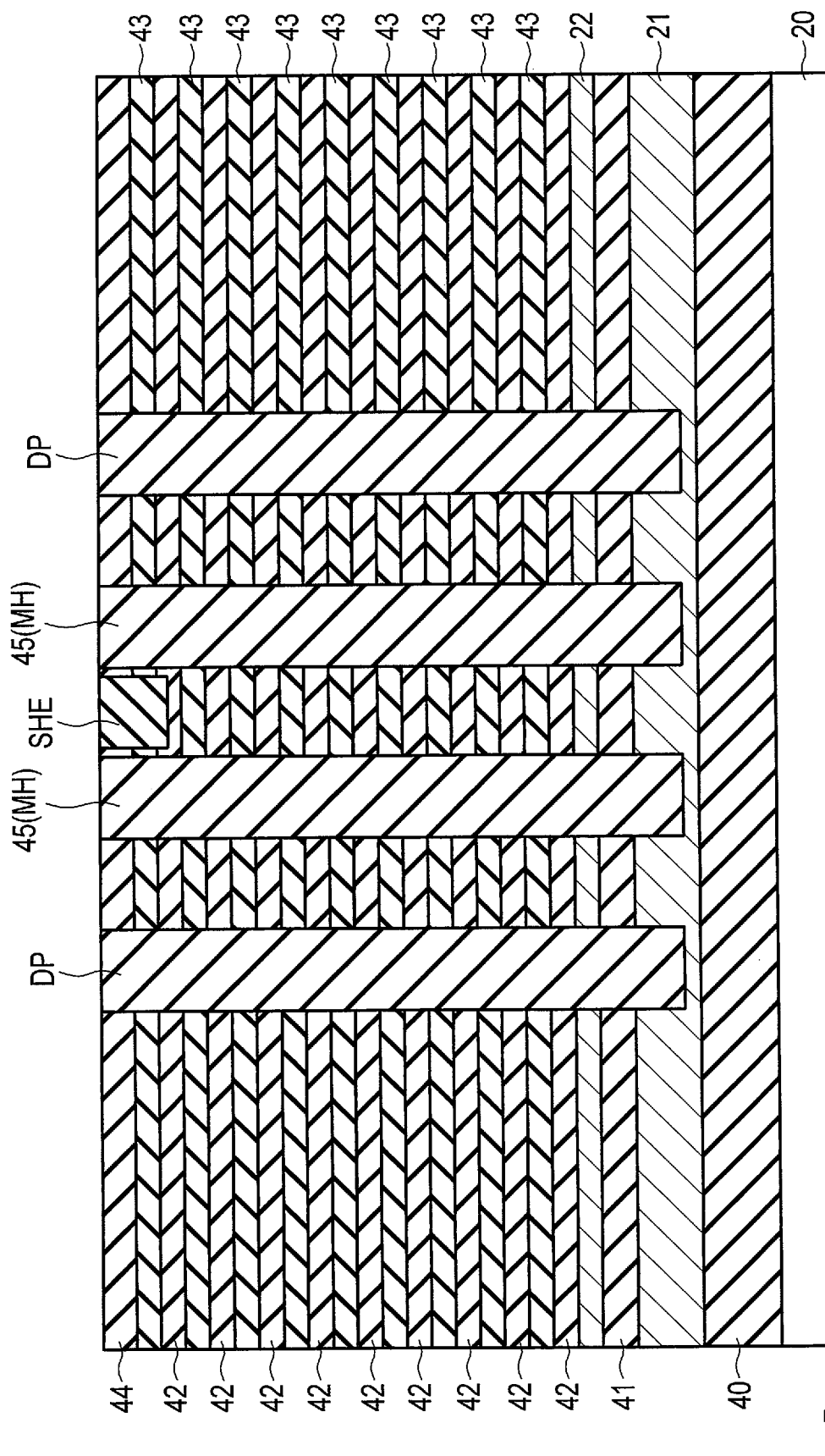
F I G. 35

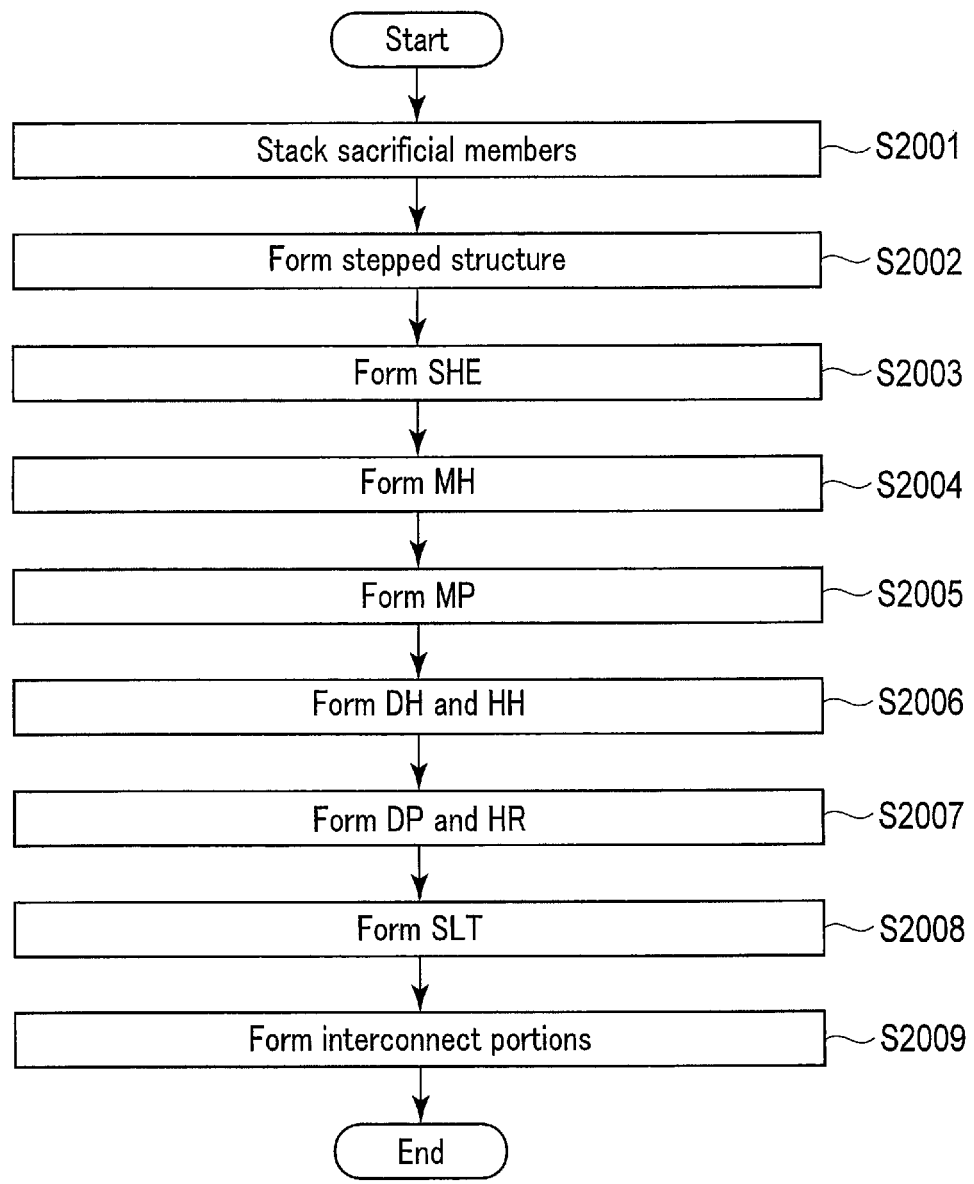
F I G. 47

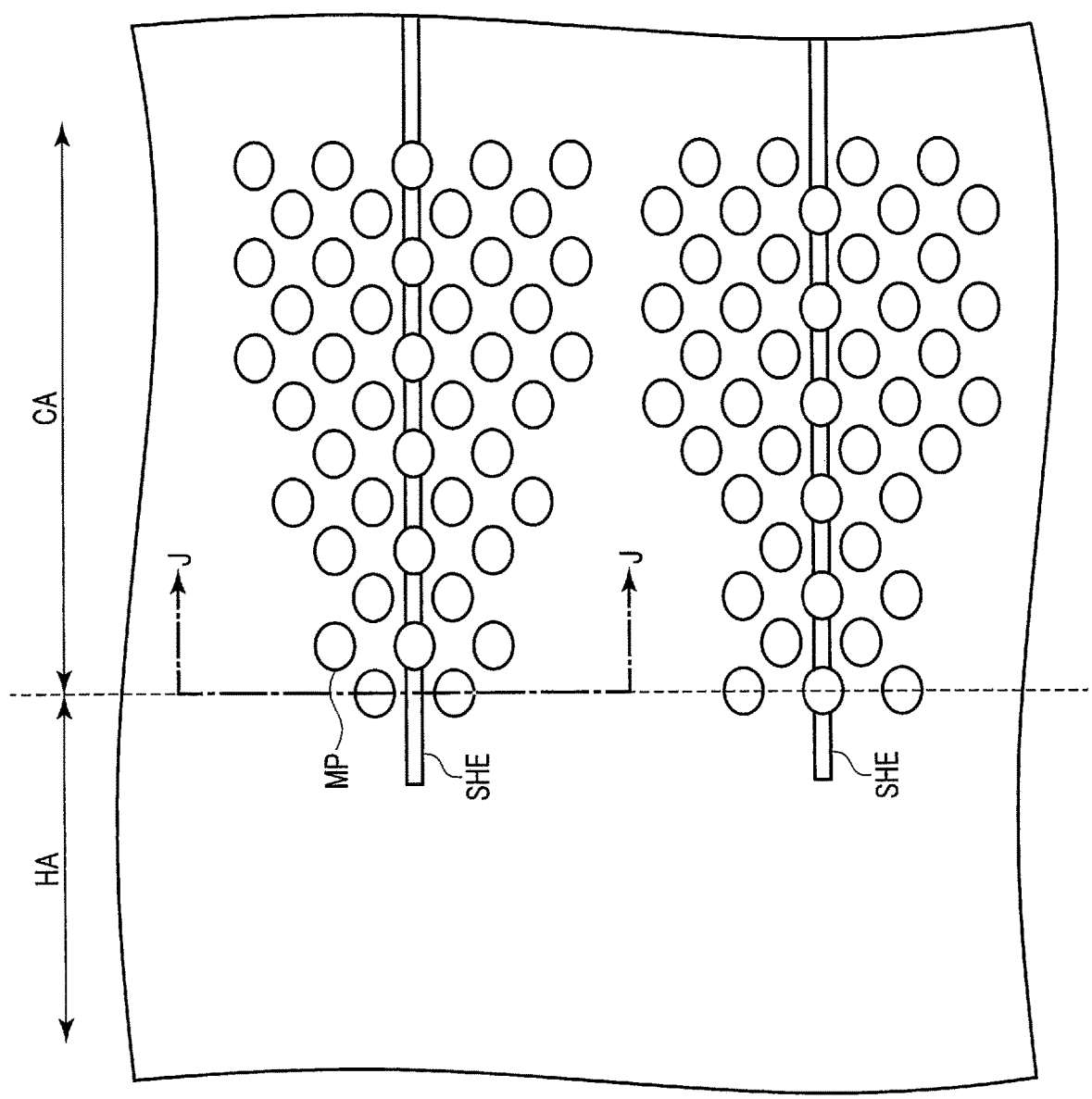
F I G. 50

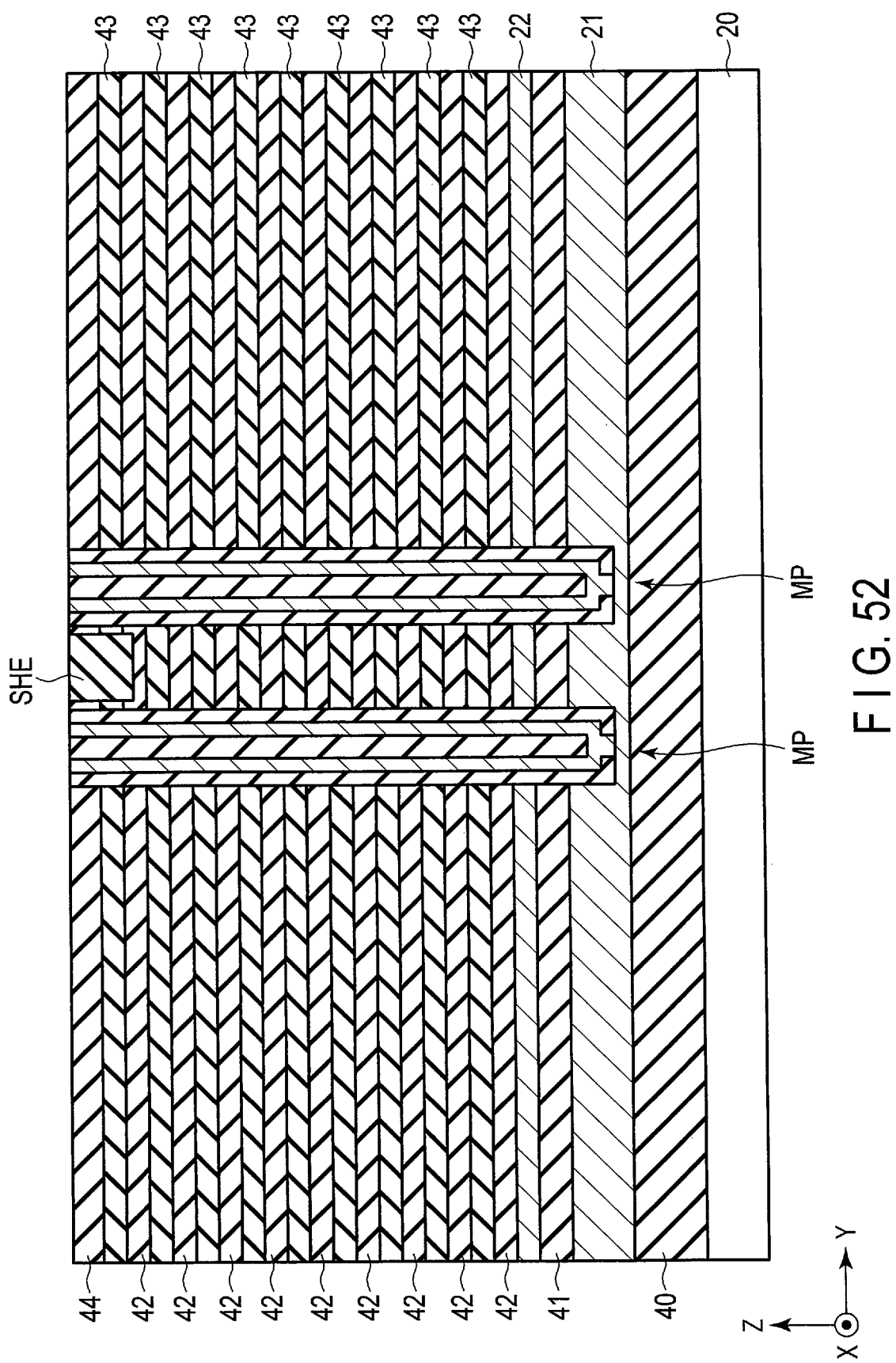
F I G. 52

SEMICONDUCTOR MEMORY DEVICE

CROSS-REFERENCE TO RELATED APPLICATIONS

This application is based upon and claims the benefit of priority from prior Japanese Patent Application No. 2019-171389, filed Sep. 20, 2019, the entire contents of which are incorporated herein by reference.

FIELD

Embodiments relate to a semiconductor memory device.

BACKGROUND

There is known a NAND-type flash memory that is capable of storing data in a nonvolatile manner.

BRIEF DESCRIPTION OF THE DRAWINGS

FIG. 1 is a block diagram illustrating a configuration example of a semiconductor memory device according to a first embodiment;

FIG. 2 is a circuit diagram illustrating an example of a circuit configuration of a memory cell array included in the semiconductor memory device according to the first embodiment;

FIG. 10 illustrates an example of a planar layout of a memory cell array in a boundary area between a hookup area and a cell area of a semiconductor memory device according to a comparative example, FIG. 10 illustrating "B" in FIG. 3 in an extracted manner;

FIG. 11 is a view illustrating, in enlarged scale, "I" in FIG. 10;

FIG. 13 illustrates an example of the planar layout of the memory cell array in the boundary area between the hookup area and the cell area of the semiconductor memory device according to the first embodiment;

FIG. 20 is a flowchart illustrating a first example of a manufacturing method of the semiconductor memory device according to the second embodiment;

FIG. 30 is a cross-sectional view taken along line J-J in FIG. 28, illustrating an example of a cross-sectional structure during the manufacture of the semiconductor memory device;

FIG. 35 is a cross-sectional view taken along line J-J in FIG. 34, illustrating an example of a cross-sectional structure during the manufacture of the semiconductor memory device;

FIG. 47 is a flowchart illustrating a second example of the manufacturing method of the semiconductor memory device according to the second embodiment;

FIG. 50 illustrates an example of the planar layout during the manufacture of the semiconductor memory device according to the second embodiment;

FIG. 52 is a cross-sectional view taken along line J-J in FIG. 50, illustrating an example of a cross-sectional structure during the manufacture of the semiconductor memory device;

DETAILED DESCRIPTION

Figure 3:
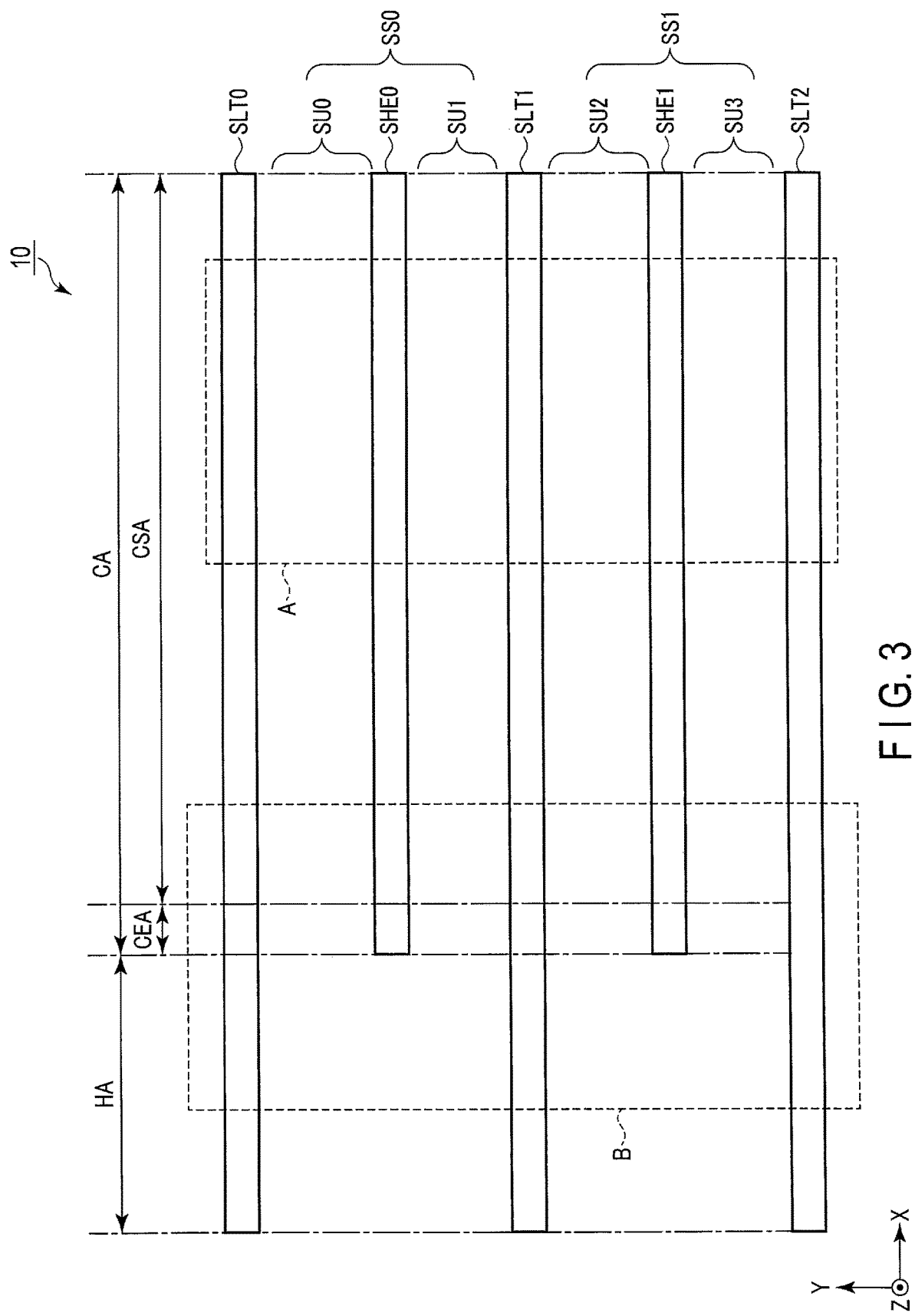
FIG. 3 is a plan view illustrating an example of a planar layout of the memory cell array included in the semiconductor memory device according to the first embodiment.

In generally, according to one embodiment, a semiconductor memory device includes a first stacked body in which a plurality of first conductive layers are stacked at intervals in a first direction above a semiconductor substrate; a second stacked body in which a plurality of second conductive layers are stacked at intervals in the first direction above the semiconductor substrate; a first slit extending in a second direction perpendicular to the first direction, the first slit isolating the first stacked body and the second stacked body in a third direction perpendicular to the first and second directions; a first pillar group including a plurality of first pillars which penetrate the first stacked body in the first direction and are formed of a substantially identical material with a substantially identical cross-sectional area; and a second pillar group including a plurality of second pillars which penetrate the second stacked body in the first direction and are formed of a substantially identical material to the material of the first pillars with a substantially identical cross-sectional area to the cross-sectional area of the first pillars, the first stacked body including: a first area in which the first pillar group is not provided; a second area which neighbors the first area in the second direction and in which the first pillar group is provided; and a third area which neighbors the second area in the second direction and in which the first pillar group is provided, the third area being configured such that an intersection portion between the first pillar and the first conductive layer functions as a memory cell transistor, and the second stacked body including: a fourth area in which the second pillar group is not provided; a fifth area which neighbors the fourth area in the second direction and in which the second pillar group is provided; and a sixth area which neighbors the fifth area in the second direction and in which the second pillar group is provided, the sixth area being configured such that an intersection portion between the second pillar and the second conductive layer functions as a memory cell transistor, wherein the first pillar and the second pillar, which neighbor the first slit in the third direction, are provided in the third direction at positions which are included in the second and fifth areas and neighbor the first and fourth areas, and a distance to the first slit from the first pillar neighboring the first slit in the third direction and a distance to the first slit from the second pillar neighboring the first slit in the third direction are substantially identical, and the first pillar and the second pillar, which neighbor the first slit in the third direction, are provided in the third direction in the third and sixth areas, and a distance to the first slit from the first pillar neighboring the first slit in the third direction and a distance to the first slit from the second pillar neighboring the first slit in the third direction are different.

Hereinafter, embodiments will be described with reference to the accompanying drawings. Each embodiment illustrates an example of a device or a method for embodying a technical concept of the invention. The drawings are schematic or conceptual ones. The dimensions, ratios, etc. in the drawings do not necessarily agree with the actual ones. The technical concept of the present invention is not specified by shapes, structures, dispositions, etc. of constituent elements.

In the description below, constituent elements having substantially the same functions and configurations will be denoted by the same reference signs. Numerals after the letters constituting the reference signs are used to distinguish elements which are denoted by the reference signs including the same letters and which have similar configurations. When there is no need to mutually distinguish the elements which are denoted by the reference signs that include the same letters, these elements are denoted by the reference signs that include only the letters.

<1> First Embodiment

Hereinafter, a semiconductor memory device 1 according to a first embodiment will be described.

<1-1> Entire Configuration of Semiconductor Memory Device 1

FIG. 1 illustrates a configuration example of the semiconductor memory device 1 according to the embodiment. The semiconductor memory device 1 is a NAND-type flash memory which can store data nonvolatilely, and is controlled by an external memory controller 2. Communication between the semiconductor memory device 1 and the memory controller 2 supports, for example, a NAND interface standard.

As illustrated in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of 1 or more). The block BLK is a set of a plurality of memory cells which can store data nonvolatilely, and the block BLK is used, for example, as an erase unit of data. In addition, in the memory cell array 10, a plurality of bit lines and a plurality of word lines are provided. Each memory cell is associated with, for example, one bit line and one word line. A detailed configuration of the memory cell array 10 will be described later.

The command register 11 holds a command CMD which the semiconductor memory device 1 has received from the memory controller 2. The command CMD includes, for example, instructions to cause the sequencer 13 to perform a read operation, a write operation, an erase operation and the like.

The address register 12 holds address information ADD which the semiconductor memory device 1 has received from the memory controller 2. The address information ADD includes, for example, a block address BAdd, a page address PAdd, and a column address CAdd. For example, the block address BAdd, page address PAdd and column address CAdd are used to select a block BLK, a word line and a bit line, respectively.

The sequencer 13 controls the operation of the entire semiconductor memory device 1. For example, the sequencer 13 controls the driver module 14, the row decoder module 15, the sense amplifier module 16 and the like, based on the command CMD held in the command register 11, thereby executing a read operation, a write operation, an erase operation and the like.

The driver module 14 generates a voltage that is to be used in the read operation, write operation, erase operation and the like. Then, the driver module 14 applies the generated voltage to a signal line corresponding to a selected word line, for example, based on the page address PAdd held in the address register 12.

Based on the block address BAdd held in the address register 12, the row decoder module 15 selects one corresponding block BLK in the memory cell array 10. Then, the row decoder module 15 transfers, for example, a voltage applied to the signal line corresponding to the selected word line, to the selected word line in the selected block BLK.

In the write operation, the sense amplifier module 16 apples a desired voltage to each bit line in accordance with write data DAT received from the memory controller 2. In the read operation, the sense amplifier module 16 determines data stored in a memory cell, based on the voltage of the bit line, and transfers a result of the determination to the memory controller 2 as read data DAT. The above-described semiconductor memory device 1 and memory controller 2 may be combined to constitute one semiconductor device. Examples of this semiconductor device include a memory card such as an SD™ card, a solid-state drive (SSD), and the like.

<1-2> Circuit Configuration of Memory Cell Array 10

FIG. 2 illustrates an example of a circuit configuration of the memory cell array 10 included in the semiconductor memory device 1 according to the present embodiment, by extracting one of the blocks BLK included in the memory cell array 10. As illustrated in FIG. 2, the block BLK includes, for example, four string units SU0 to SU3.

Each string unit SU includes a plurality of NAND strings NS which are associated with bit lines BL0 to BLm (m is an integer of 1 or more), respectively. Each NAND string NS includes, for example, memory cell transistors MT0 to MT7, and select transistors ST1 and ST2. The memory cell transistor MT includes a control gate and a charge storage layer, and stores data nonvolatilely. Each of the select transistors ST1 and ST2 is used to select the string unit SU during various operations.

In each NAND string NS, the memory transistors MT0 to MT7 are connected in series. The drain of the select transistor ST1 is connected to the associated bit line BL, and the source of the select transistor ST1 is connected to one end of the series-connected memory transistors MT0 to MT7.

The drain of the select transistor ST2 is connected to the other end of the series-connected memory transistors MT0 to M7. The source of the select transistor ST2 is connected to the source line SL.

In the same block BLK, the control gates of the memory cell transistors MT0 to MT7 are commonly connected to word lines WL0 to WL7, respectively. The gates of the select transistors ST1 in the string units SU0 to SU3 are commonly connected to select gate lines SGD0 to SGD3, respectively. The gates of the select transistors ST2 are commonly connected to a select gate line SGS.

In the above-described circuit configuration of the memory cell array 10, the bit line BL is shared by the NAND strings NS to which the same column address is allocated between the string units SU. The source line SL is shared by, for example, a plurality of blocks BLK.

A set of memory cell transistors MT connected to a common word line WL in one string unit SU is referred to as, for example, a cell unit CU. For example, the storage capacity of the cell unit CU including memory cell transistors MT each storing one-bit data is defined as "one-page data." The cell unit CU may have a storage capacity of data of two or more pages, according to the number of bits of data to be stored in the memory cell transistor MT.

Note that the circuit configuration of the memory cell array 10 included in the semiconductor memory 1 according to the present embodiment is not limited to the configuration described above. For example, the number of memory cell transistors MT and the number of select transistors ST1 and ST2, which are included in each NAND string NS, may be freely selected. The number of string units SU included in each block BLK may be freely selected.

<1-3> Structure of Memory Cell Array 10

Hereinafter, an example of a structure of the memory cell array 10 in the embodiment will be described.

Note that in the drawings to be referred to below, a Y direction corresponds to the extending direction of the bit line BL, an X direction corresponds to the extending direction of the word line WL, and a Z direction corresponds to a direction perpendicular to the surface of a semiconductor substrate 20 on which the semiconductor memory device 1 is formed. Hatching is added to plan views as appropriate for the purpose of easier understanding of the drawing. The hatching added to the plan views is not necessarily related to the materials or properties of the constituent elements to which hatching is added. In cross-sectional views, the depiction of insulating layers (interlayer insulating films), interconnects, contacts and the like is omitted as appropriate for the purpose of easier understanding of the drawing.

<1-3-1> Planar Layout of Memory Cell Array 10

Referring to FIG. 3, a description is given of an example of a planar layout of the memory cell array 10 included in the semiconductor memory device 1 according to the first embodiment.

FIG. 3 illustrates an example of the planar layout of the memory cell array 10 included in the semiconductor memory device 1 according to the first embodiment, and illustrates, in an extracted manner, an area corresponding to one block BLK (i.e. string units SU0 to SU3).

As illustrated in FIG. 3, the planar layout of the memory cell array 10 is divided into, for example, a cell area CA and a hookup area HA in the X direction. In addition, the memory cell array 10 includes a plurality of slits SLT (in FIG. 3, SLT0 to SLT2) and a plurality of slits SHE (SHE 0 and SHE1).

The cell area CA is an area in which NAND strings NS are formed. The cell area CA includes an array end area CEA which neighbors the hookup area HA, and a memory area CSA which neighbors the array end area CEA. A NAND string NS included in the array end area CEA is used, for example, as a dummy. A NAND string NS included in the memory area CSA is used as an area for storing data.

The hookup area HA is an area where contacts are formed for electrically connecting the word lines WL and select gate lines SGS and SGD, which are connected to the NAND strings NS, and the row decoder module 15.

The slits SLT are provided to extend in the X direction, and are arranged in the Y direction. The slits SLT extend across the hookup area HA and cell area CA in the X direction.

For example, one slit SHE is laid out between mutually neighboring slits SLT. The slit SHE is provided to extend in the X direction, and extends across the cell area CA in the X direction.

Specifically, the slits SLT divide interconnect layers corresponding to, for example, the word lines WL0 to WL7, select gate line SGD, and select gate line SGS. In other words, the slits SLT extend in the X direction and isolate, in the Y direction, the interconnect layers corresponding to the word lines WL0 to WL7, select gate line SGD, and select gate line SGS. The slits SHE divide an interconnect layer corresponding to the select gate line SGD. In other words, the slits SHE extend in the X direction and isolate, in the Y direction, the interconnect layer corresponding to the select gate line SGD.

Each of the slits SLT and slits SHE has such a structure that an insulating member is buried in a trench. A conductor may be buried in the slit SLT via the insulating member, and the conductor may be used as a contact of the source line SL.

In the above-described planar layout of the memory cell array 10, each of areas partitioned in the cell area CA by the slits SLT and slits SHE corresponds to one string unit SU. Specifically, in the present example, the string units SU0 to SU3 each extending in the X direction are arranged in the Y direction. In addition, in the memory cell array 10, the layout illustrated in, for example, FIG. 3, is repeatedly disposed in the Y direction.

Specifically, it is assumed that NAND strings NS provided in an area between the slit SLT0 ad slit SHE0 in the Y direction are a string unit SU0. In addition, it is assumed that NAND strings NS provided in an area between the slit SHE0 and slit SLT0 in the Y direction are a string unit SU1. Further, the string units SU0 and SU1 provided in an area between the slit SLT0 and slit SLT1 are labeled as a string unit set SS0. Similarly, it is assumed that NAND strings NS provided in an area between the slit SLT1 ad slit SHE1 in the Y direction are a string unit SU2. In addition, it is assumed that NAND strings NS provided in an area between the slit SHE1 and slit SLT2 in the Y direction are a string unit SU3. Further, the string units SU2 and SU3 provided in an area between the slit SLT1 and slit SLT2 are labeled as a string unit set SS1.

Note that in the above-described planar layout of the memory cell array 10, the number of slits SHE laid out between mutually neighboring slits SLT may be freely selected. The number of string units SU between two mutually neighboring slits SLT varies, based on the number of slits SHE laid out between the two mutually neighboring slits SLT.

<1-3-2> Structure of Memory Cell Array 10 in Cell Area CA

Next, a description is given of a detailed planar layout of the memory cell array 10 in the cell area CA of the semiconductor memory device 1 according to the first embodiment.

Figure 4:
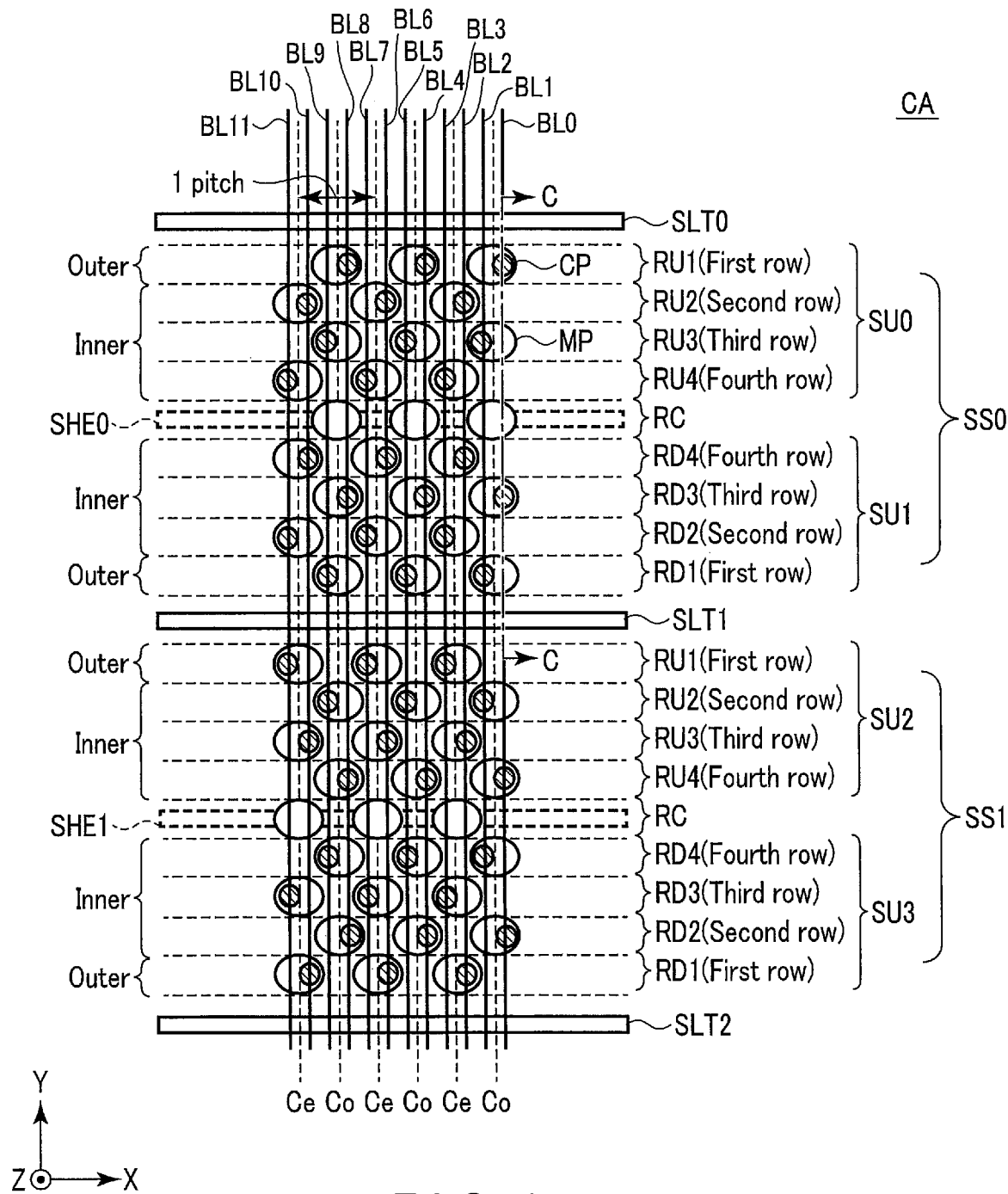
FIG. 4 illustrates an example of a detailed planar layout of the memory cell array in a cell area of the semiconductor memory device according to the first embodiment, FIG. 4 illustrating "A" in FIG. 3 in an extracted manner.

FIG. 4 illustrates an example of the detailed planar layout of the memory cell array 10 in the cell area CA of the semiconductor memory device 1 according to the first embodiment, by extracting an area ("A" in FIG. 3) corresponding to the string units SU0 to SU3.

As illustrated in FIG. 4, in the cell area CA, the memory cell array 10 further includes a plurality of memory pillars MP, a plurality of contacts CP, and a plurality of bit lines BL.

Each of the memory pillars MP functions, for example, as one NAND string NS.

The memory pillars MP are provided in a plurality of "columns" and "rows".

The "columns" in which the memory pillars MP are arranged extend in the Y direction, and generally include even-numbered columns Ce and odd-numbered columns Co. The even-numbered columns Ce and odd-numbered columns Co are alternately provided in the X direction.

For example, as illustrated in FIG. 4, between the slits SLT in the string units SU0 and SU0, four memory pillars MP are provided in the even-numbered column Ce, and five memory pillars MP are provided in the odd-numbered column Co. Note that the numbers of memory pillars are not limited to these.

In addition, for example, as illustrated in FIG. 4, between the slits SLT in the string units SU2 and SU3, five memory pillars MP are provided in the even-numbered column Ce, and four memory pillars MP are provided in the odd-numbered column Co. Note that the numbers of memory pillars are not limited to these.

The "rows" in which the memory pillars MP are arranged extend in the X direction, and a plurality of rows (in this example, nine rows) are provided in the Y direction between the slits SLT.

Here, a set of four rows near the slit SLT is labeled as RUG or RDG. The set RUG is located near the upper-side slit SLT, and the set RDG is located near the lower-side slit SLT.

In addition, a row provided between the sets RUG and RDG in the Y direction is labeled as RC.

The four rows included in the set RUG are labeled as RU1, RU2, RU3 and RU4 in the order from the row closest to the slit SLT in the Y direction. Besides, the row RU1 may be expressed as "first row", the row RU2 may be expressed as "second row", the row RU3 may be expressed as "third row", and the row RU4 may be expressed as "fourth row". Similarly, the four rows included in the set RDG are labeled as RD1, RD2, RD3 and RD4 in the order from the row closest to the slit SLT in the Y direction. Besides, the row RD1 may be expressed as "first row", the row RD2 may be expressed as "second row", the row RD3 may be expressed as "third row", and the row RD4 may be expressed as "fourth row".

In each row, the memory pillars MP are provided in association with either the even-numbered column Ce or the odd-numbered column Co.

Specifically, as illustrated in FIG. 4, in the case of the string units SU0 and SU1, the memory pillars MP provided in the rows RU1, RU3, RD1 and RD3 are provided in the odd-numbered columns Co. In addition, the memory pillars MP provided in the rows RU2, RU4, RD2 and RD4 are provided in the even-numbered columns Ce.

Besides, as illustrated in FIG. 4, in the case of the string units SU2 and SU3, the memory pillars MP provided in the rows RU1, RU3, RD1 and RD3 are provided in the even-numbered columns Ce. In addition, the memory pillars MP provided in the rows RU2, RU4, RD2 and RD4 are provided in the odd-numbered columns Co.

Note that the memory pillars MP provided in the mutually neighboring even-numbered column Ce and odd-numbered column Co may also be described as being arranged in a staggering fashion in the Y direction.

The memory pillars MP arranged in the row RC are laid out in a manner to overlap the slit SHE. The memory pillars MP arranged in the row RC are not designed to function as NAND strings NS, but are treated as dummy NAND strings NS.

The bit lines BL extend in the Y direction and are arranged in the X direction. Each bit line BL is laid out in a manner to overlap at least one memory pillar MP in each string unit SU. In the present example, two bit lines BL are laid out in a manner to overlap each memory pillar MP. A contact CP is provided between one of the bit lines BL overlapping a memory pillar MP, and the memory pillar MP. Each memory pillar MP is electrically connected to the corresponding bit line BL via the contact CP.

As described above, the memory pillars MP overlapping the slit SHE serve as dummies. Thus, contacts between the memory pillars MP overlapping the slit SHE and the bit lines BL are omitted. The numbers and layouts of memory pillars MP and slits SHE between the mutually neighboring slits SLT are not limited to those in the configuration described with reference to FIG. 4, and may be changed as appropriate.

Next, referring to FIG. 4, a description is given of the relationship between the memory pillars MP of the string units SU0 and SU1 and the memory pillars MP of the string units SU2 and SU3.

As illustrated in FIG. 4, the memory pillars MP of the string units SU0 and SU1 and the memory pillars MP of the string units SU2 and SU3 are in a reversed relationship in the vertical and horizontal directions, with the slit SLT being interposed.

Alternatively, the distance between two memory pillars MP, which neighbor in the row direction, is defined as "1 pitch". In this case, it can also be said that the memory pillars MP of the string units SU0 and SU1 are displaced from the memory pillars MP of the string units SU2 and SU3 by a ½ pitch in the X direction, with the slit SLT being interposed. Specifically, as illustrated in FIG. 4, in the present embodiment, the layout of the memory pillars MP is asymmetric, with the slit SLT being interposed.

A description is given of the reason why the layout of the memory pillars MP is made asymmetric, with the slit SLT being interposed, as in the present embodiment. For this purpose, with reference to FIG. 4 and FIG. 5, a description is given of the difference between the case where the layout of the memory pillars MP is symmetric with respect to the slit SLT, and the case where the layout of the memory pillars MP is asymmetric with respect to the slit SLT.

Figure 5:
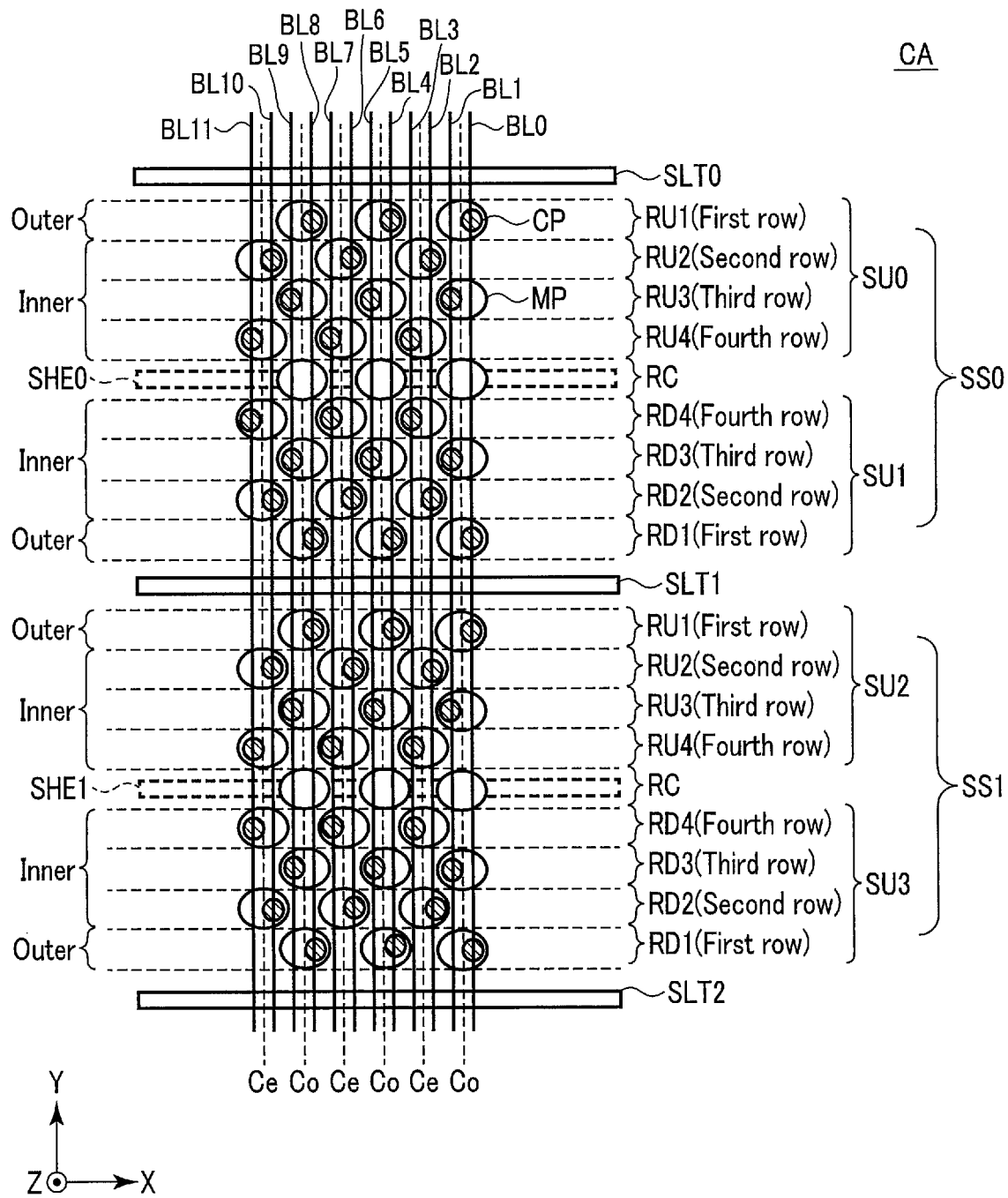
FIG. 5 illustrates an example of a planar layout of the memory cell array in the cell area in a case where a layout of memory pillars is unchanged with a slit interposed.

FIG. 5 illustrates an example of the planar layout of the memory cell array 10 in the cell area CA in the case where the layout of the memory pillars MP is symmetric, with the slit SLT being interposed.

FIG. 5 is a view for explaining the bit lines BL, and the kinds of memory pillars MP connected to the bit lines BL.

The memory pillars MP can generally be classified into two kinds, namely "inner" and "outer". The inner is a memory pillar MP which is surrounded by memory pillars MP. The outer is a memory pillar, a part of which is not surrounded by memory pillars MP.

There is a possibility that the memory pillar MP belonging to the inner has a greater capacitance than the memory pillar MP belonging to the outer.

In the examples of FIG. 4 and FIG. 5, the memory pillars MP laid out in the rows RD2, RD3, RD4, RU2, RU3 and RU4 belong to the inner, and the memory pillars MP laid out in the rows RD1 and RU1 belong to the outer.

As illustrated in FIG. 5, when the layout of memory pillars MP is symmetric, with slit SLT being interposed, there exists a bit line BL connected to the memory pillars MP which all belong to the inner. Specifically, as illustrated in FIG. 5, each of the bit lines BL2, BL3, BL6, BL7, BL10 and BL11 does not pass over the memory pillar MP belonging to the outer. Thus, each of the bit lines BL2, BL3, BL6, BL7, BL10 and BL11 is not connected to the memory pillar MP belonging to the outer. In other words, each of the bit lines BL2, BL3, BL6, BL7, BL10 and BL11 is connected to only the memory pillars MP belonging to the inner.

The capacitance of the bit line BL occurs due to the capacitance of the memory pillars MP to which the bit line BL is connected. Thus, the capacitance of the bit line BL, which is connected to the memory pillars MP that all belong to the inner, is greater than the capacitance of the bit line BL which is connected to the memory pillars MP belonging to the outer. It is not preferable that the capacitance varies between the bit lines BL in this manner. Further, when the variance in capacitance of the bit lines BL is adjusted, it is possible that the area of circuitry increases.

Taking the above into account, according to the present embodiment, as illustrated in FIG. 4, the layout of the memory pillars MP is asymmetric, with the slit SLT being interposed. Thus, there exists no bit line BL which is connected to only the memory pillars MP belonging to the inner. Specifically, each bit line BL is connected to the memory pillars MP belonging to the inner and the memory pillars MP belonging to the outer. As a result, the variance in capacitance of each bit line BL is suppressed, and there is no need to increase the area of circuitry.

<1-3-3> Cross-Sectional Structure in Cell Area CA of Memory Cell Array 10

Figure 6:
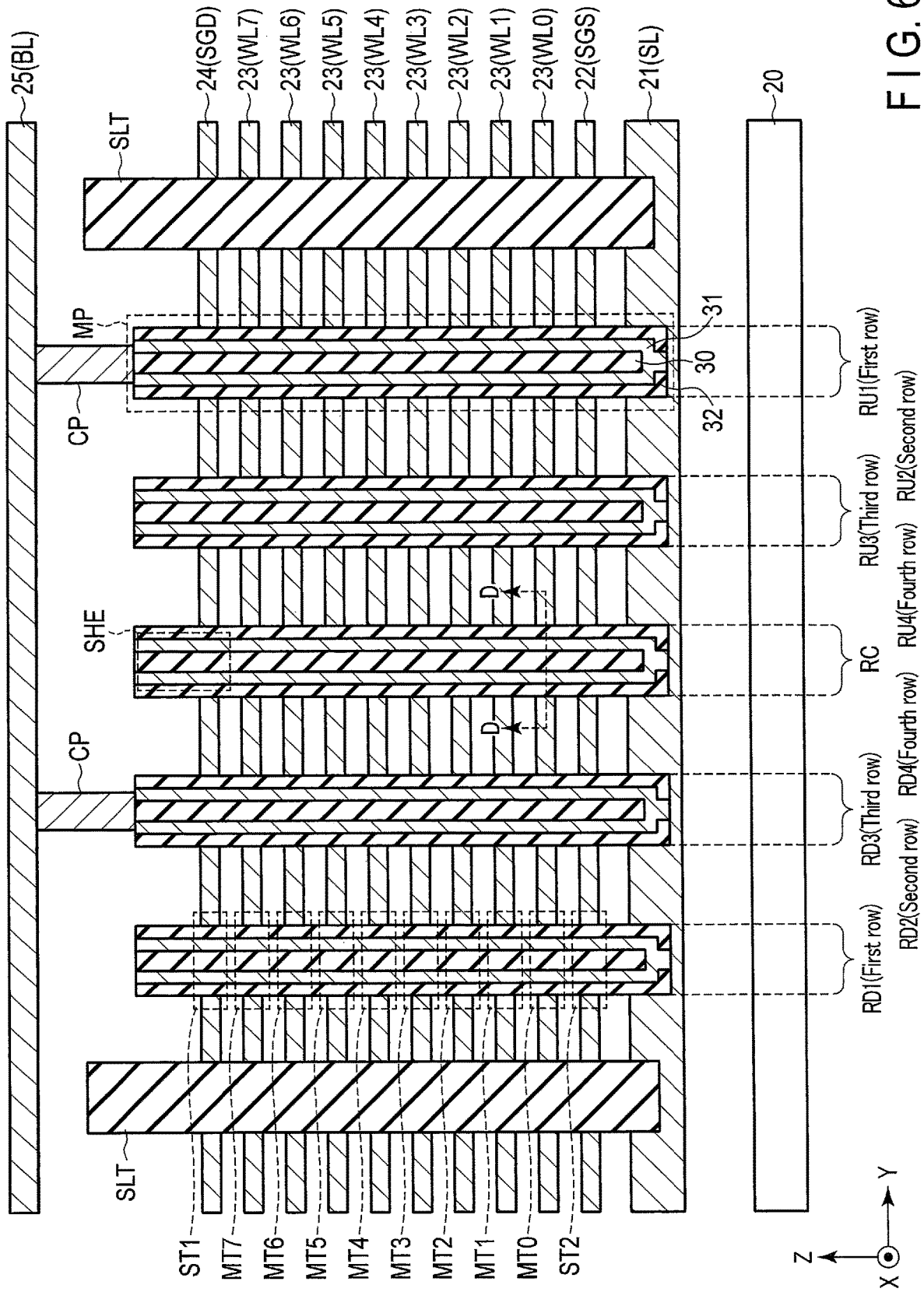
FIG. 6 is a cross-sectional view taken along line C-C in FIG. 4, illustrating a cross-sectional structure in the cell area of the memory cell array included in the semiconductor memory device according to the first embodiment.

Next, referring to FIG. 6, a description is given of an example of a cross-sectional structure in the cell area CA of the memory cell array 10 included in the semiconductor memory device 1 according to the first embodiment.

FIG. 6 is a cross-sectional view, taken along line C-C in FIG. 4, illustrating an example of the cross-sectional configuration in the cell area CA of the memory cell array 10 included in the semiconductor memory device 1 according to the first embodiment. In addition, in FIG. 6, a part overlapping the slit SHE in the X direction is indicated by a broken line. As illustrated in FIG. 6, the memory cell array 10 further includes conductive layers 21 to 25. The conductive layers 21 to 25 are provided above the semiconductor substrate 20.

Specifically, the conductive layer 21 is provided above the semiconductor substrate 20 via an insulating layer. Although depiction is omitted, circuitry corresponding to, for example, the row decoder module 15, sense amplifier module 16 and the like may be provided in the insulating layer between the semiconductor substrate 20 and conductive layer 21. The conductive layer 21 is formed, for example, in a plate shape extending along the XY plane, and is used as the source line SL. The conductive layer 21 includes, for example, silicon (Si).

The conductive layer 22 is provided above the conductive layer 21 via an insulating layer. The conductive layer 22 is formed, for example, in a plate shape extending along the XY plane, and is used as the select gate line SGS. The conductive layer 22 includes, for example, silicon.

Above the conductive layer 22, insulating layers (not shown) and the conductive layers 23 are alternately stacked. Each conductive layer 23 is formed, for example, in a plate shape extending along the XY plane. For example, the stacked conductive layers 23 are used as word lines WL0 to WL7 in an order from the semiconductor substrate 20 side. The conductive layers 23 include, for example, tungsten (W).

Above the uppermost conductive layer 23, a conductive layer 24 is stacked via an insulating layer (not shown). The conductive layer 24 is formed, for example, in a plate shape extending along the XY plane. For example, the conductive layer 24 corresponds to the select gate line SGD. The conductive layer 24 includes, for example, tungsten.

The conductive layer 25 is provided above the conductive layer 24 via an insulating layer (not shown). The conductive layer 25 is formed, for example, in a line shape extending in the Y direction, and is used as a bit line BL. The conductive layer 25 incudes, for example, copper (Cu).

Note that a plurality of conductive layers 23 may be described as "stacked structure".

Each of the memory pillars MP is provided to extend in the Z direction, and penetrates the conductive layers 22 to 24. Each memory pillar MP is formed in the inside of a memory hole MH.

The memory hole MH penetrates the conductive layers 22 to 24, and a bottom part thereof is in contact with the conductive layer 21.

In addition, each memory pillar MP includes, for example, a core member 30, a semiconductor layer 31, and a stacked film 32.

Specifically, the core member 30 is provided to extend in the Z direction. For example, an upper end of the core member 30 is included in a layer which is higher than the conductive layer 24, and a lower end of the core member 30 is included in a layer in which the conductive layer 21 is provided. The semiconductor layer 31 includes, for example, a portion covering a side surface and a bottom surface of the core member 30, and a columnar portion extending in the Z direction at a bottom portion of the core member 30. For example, a bottom portion of the columnar portion of the semiconductor layer 31 is included in the layer in which the conductive layer 21 is provided. The stacked film 32 covers a side surface and a bottom surface of the semiconductor layer 31, except for a portion where the columnar portion of the semiconductor layer 31 is provided. For example, a bottom portion of the stacked film 32 is included in the layer in which the conductive layer 21 is provided. The core member 30 includes, for example, an insulator such as silicon oxide ($SiO_2$). The semiconductor layer 31 includes, for example, silicon.

The columnar contact CP is provided on a top surface of the semiconductor layer 31 in the memory pillar MP. In the area illustrated, contacts CP corresponding to two memory pillars MP among five memory pillars MP are depicted. In an area not illustrated, contacts CP are connected to the memory pillars MP which, in the illustrated area, do not overlap the slit SHE and are not connected to the contacts CP.

One conductive layer 25, i.e., one bit line BL, is in contact with a top surface of the contact CP. One contact CP is connected to one conductive layer 25 in each of spaces (string units) which are divided by the slits SLT and SHE and by the memory pillar MP which is in contact with the slit SHE.

The slit SLT is formed, for example, in a plate shape extending along the XZ plane, and divides the conductive layers 22 to 24. An upper end of the slit SLT is included in a layer between the conductive layer 24 and the conductive layer 25. A lower end of the slit SLT is included, for example, in the layer in which the conductive layer 21 is provided. The slit SLT includes, for example, an insulator such as silicon oxide.

The slit SLT is formed as follows. Anisotropic etching is performed on sacrificial members which become conductive layers 22 to 24, and on insulating layers (not shown) provided between the conductive layers 21 to 24, thereby forming a trench, and an insulating member is provided on at least an inner wall of the trench. The anisotropic etching is, for example, RIE (Reactive Ion Etching). The RIE is a method in which acceleration voltage is applied to ions with chemical reactivity, and the ions are caused to impinge on a surface of an object to be processed, thereby performing etching by ion bombardment with directivity.

The slit SHE is formed, for example, in a plate shape extending along the XZ plane, and divides the conductive layer 24. An upper end of the slit SHE is included in the layer between the conductive layer 24 and the conductive layer 25. A lower end of the slit SHE is included, for example, in the layer between the conductive layer 23 and the conductive layer 24. The slit SHE includes, for example, an insulator such as silicon oxide. For example, the upper end of the slit SHE and the upper end of the memory pillar MP are aligned. However, the upper end of the memory pillar MP and the upper end of the slit SHE may not be aligned.

<1-3-4> Cross-Sectional Structure of Memory Pillar MP of Memory Cell Array 10

Figure 7:
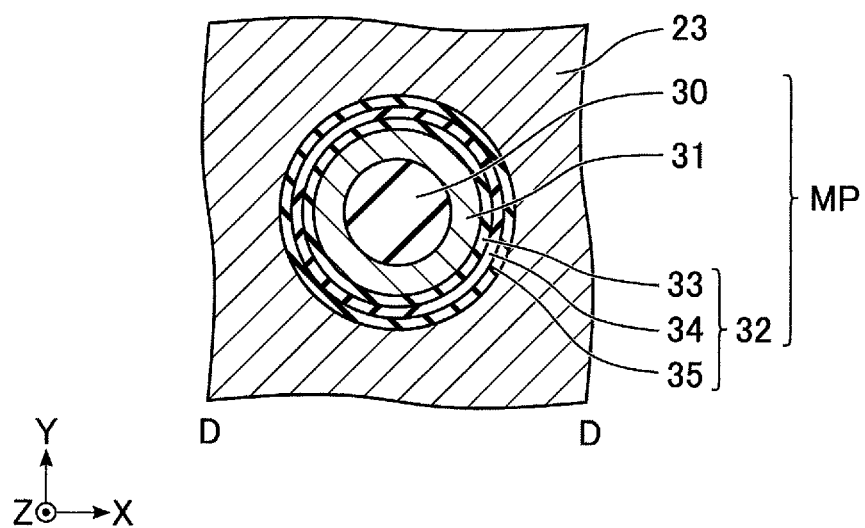
FIG. 7 is a cross-sectional view taken along line D-D in FIG. 6, illustrating an example of a cross-sectional structure of memory pillars in the semiconductor memory device according to the first embodiment.

FIG. 7 is a cross-sectional view, taken along line D-D in FIG. 6, illustrating an example of a cross-sectional structure of the memory pillar MP in the semiconductor memory device 1 according to the first embodiment. More specifically, FIG. 7 illustrates a cross-sectional structure of the memory pillar MP in a layer which is parallel to the surface of the semiconductor substrate 20 and includes the conductive layer 23.

As illustrated in FIG. 7, in the layer including the conductive layer 23, the core member 30 is provided, for example, in a central part of the memory pillar MP. The semiconductor layer 31 surrounds the side surface of the core member 30. The stacked film 32 surrounds the side surface of the semiconductor layer 31. The stacked film 32 includes, for example, a tunnel insulation film 33, an insulating film 34 and a block insulation film 35.

The tunnel insulation film 33 surrounds the side surface of the semiconductor layer 31. The insulating film 34 surrounds a side surface of the tunnel insulation film 33. The block insulation film 35 surrounds a side surface of the insulating film 34. The conductive layer 23 surrounds a side surface of the block insulation film 35. Each of the tunnel insulation film 33 and block insulation film 35 includes, for example, silicon oxide. The insulating film 34 includes, for example, silicon nitride (SiN). The insulating film 34 can trap electric charge.

As described above, the memory pillars MP penetrate the conductive layers 22 to 24 in the Z direction, and are formed of a substantially identical material with a substantially identical cross-sectional area.

In the above-described structure of the memory pillar MP, a portion (intersection portion) at which the memory pillar MP and conductive layer 22 intersect functions as the select transistor ST2. A portion at which the memory pillar MP and conductive layer 23 intersect functions as the memory cell transistor MT. A portion at which the memory pillar MP and conductive layer 24 intersect functions as the select transistor ST1.

Specifically, the semiconductor layer 31 is used as a channel of each of the memory cell transistors MT0 to MT7 and select transistors ST1 and ST2. The insulating film 34 is used as a charge storage layer of the memory cell transistor MT. Thereby, each of the memory pillars MP functions as one NAND string NS.

<1-3-5> Boundary Area Between Hookup Area HA and Cell Area CA of Memory Cell Array 10

Figure 8:
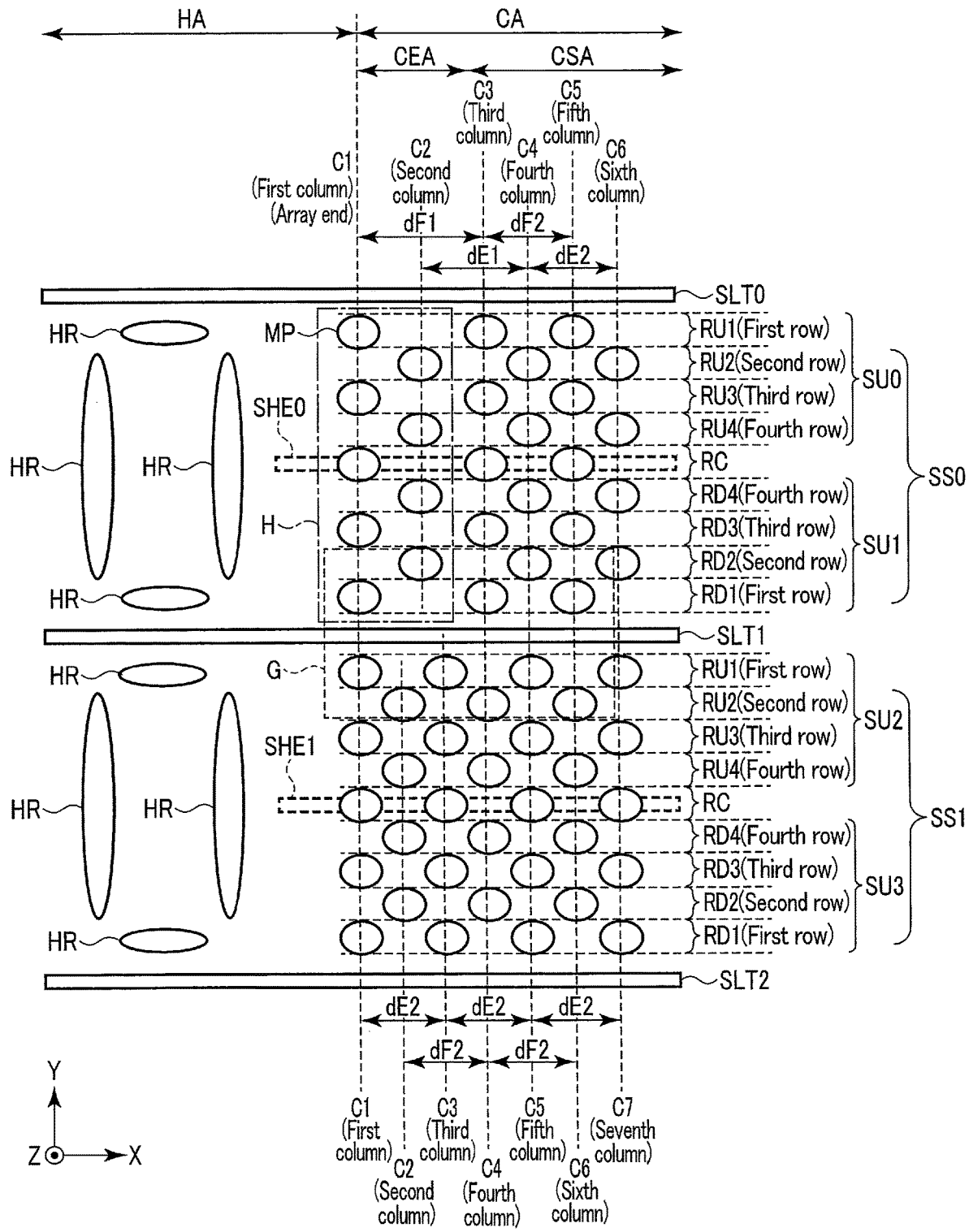
FIG. 8 illustrates an example of a planar layout of the memory cell array in a boundary area between a hookup area and the cell area of the semiconductor memory device according to the first embodiment, FIG. 8 illustrating "B" in FIG. 3 in an extracted manner.
Figure 9:
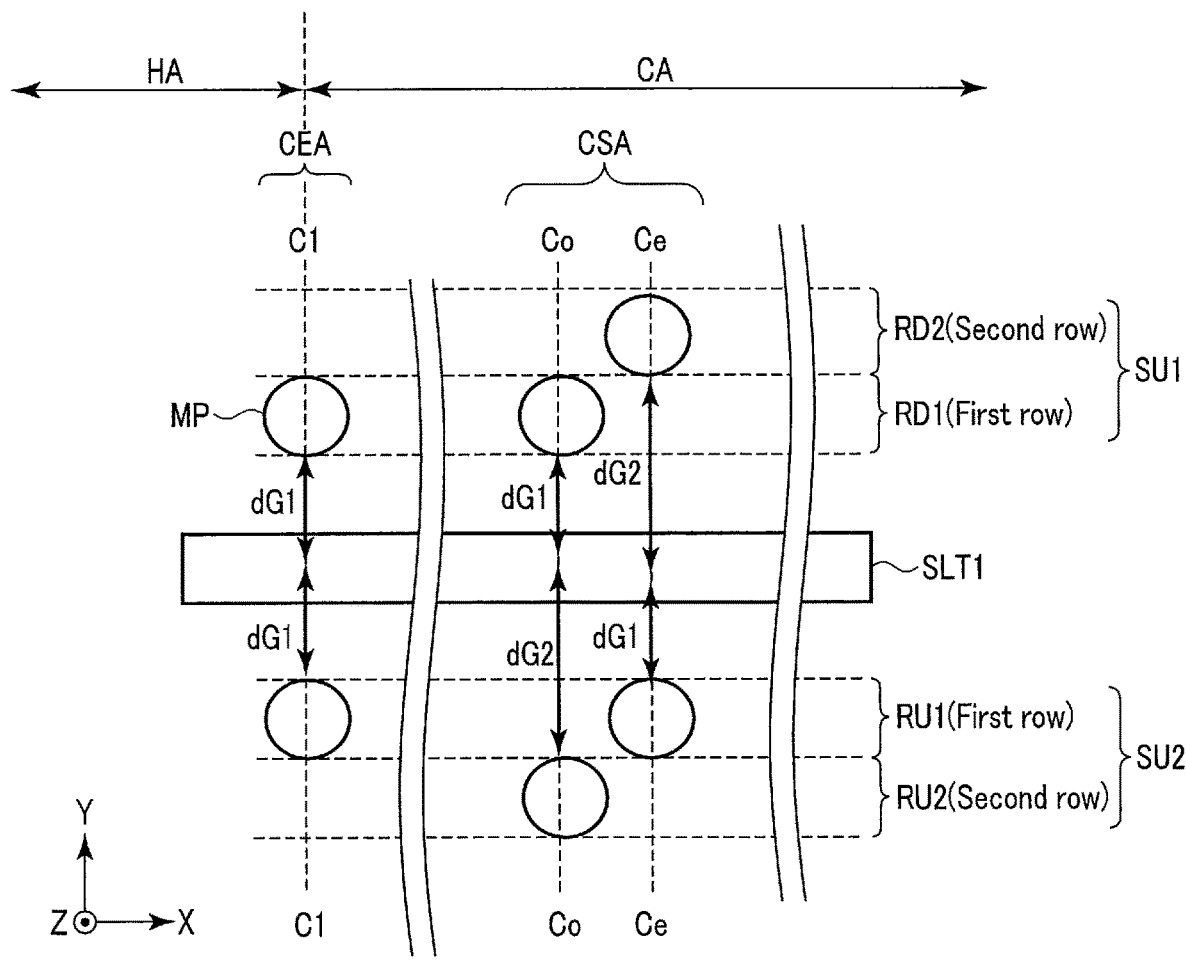
FIG. 9 illustrates an example of the planar layout of the memory cell array.

Next, referring to FIG. 8 and FIG. 9, a boundary area between the hookup area HA and cell area CA will be described. FIG. 8 illustrates an example of a planar layout of the memory cell array 10 in a boundary area between the hookup area HA and the cell area CA of the semiconductor memory device 1 according to the first embodiment, FIG. 8 illustrating an area ("B" in FIG. 3) corresponding to the string units SU0 to SU3 in an extracted manner. In FIG. 8, for the purpose of description, columns are labeled. Specifically, columns are labeled as C1, C2, C3, C4, . . . , in an order from a column belonging to the boundary area between the hookup area HA and the cell area CA toward the center of the cell area CA (in the right direction of the drawing sheet of FIG. 8). Further, C1, C2, C3, C4, . . . , may also be expressed as a first column, a second column, a third column, a fourth column, etc. FIG. 9 illustrates an example of the planar layout of the memory cell array 10.

As illustrated in FIG. 8, the hookup area HA includes a plurality of support pillars HR. Although not illustrated in FIG. 8, in the hookup area HA, end portions of the select gate line SGS, word lines WL0 to WL7 and select gate line SGD are provided in a stepped shape. Further, a plurality of contacts are provided in the hookup area HA.

For example, in the hookup area HA, the support pillars HR are arranged as appropriate in an area excluding an area where the slits SLT are formed and an area where the contacts (not shown) are formed. The support pillar HR has such a structure that an insulating member is buried in a hole extending in the Z direction, and penetrates stacked interconnect layers (e.g. word lines WL and select gate line SGD). For example, a plurality of support pillars HR are disposed around the contact (not shown).

Next, the cell area CA which neighbors the hookup area HA will be described.

A basic layout of the cell area CA (memory area CSA) is the layout illustrated in FIG. 4.

As illustrated in FIG. 8, an array end area CEA is laid out between the hookup area HA and the memory area CSA. For example, in the memory area CSA, memory pillars MP for storing data are provided. On the other hand, in the array end area CEA, memory pillars MP, which are not used for storing data, are provided. In addition, in the array end area CEA, only in the column (hereinafter, "array end") closest to (neighboring) the hookup area HA, the memory pillars MP are laid out in a manner to be symmetric, with the slit SLT being interposed. Specifically, the pattern of memory pillars MP in the XY plane in the array end area CEA is different from the pattern of memory pillars MP in the XY plane in the memory area CSA. Note that only the array end may be set as the array end area CEA, or the array end and a column near the array end may be set as the array end area CEA. In the example of FIG. 8, the columns C1 and C2 in the string units SU0 and SU1 and the columns C1 to C3 in the string units SU2 and SU3 are set as the array end area CEA.

Next, referring to FIG. 9, the memory pillars MP in the array end area CEA (array end) and the memory pillars MP in the memory area CSA are described.

In FIG. 9, among the memory pillars MP of the string unit SU1, attention is paid to the memory pillar MP provided near the slit SLT1, and, among the memory pillars MP of the string unit SU2, attention is paid to the memory pillar MP provided near the slit SLT1.

As illustrated in FIG. 9, it is assumed that a distance from the memory pillar MP belonging to each of the row RD1 and row RU1 to the slit SLT1 (e.g. the center of the slit SLT) is dG1. In addition, it is assumed that a distance from the memory pillar MP belonging to each of the row RD2 and row RU2 to the slit SLT1 (e.g. the center of the slit SLT) is dG2. Such a relationship that the distance dG2 is greater than the distance dG1 is established.

To begin with, a description is given of the relationship between the memory pillars MP of the string unit SU1 in the memory area CSA and the memory pillars MP of the string unit SU2 in the memory area CSA.

When the memory pillar MP is provided in the row RD1 in the string unit SU1, the memory pillar MP is provided in the row RU2 in the same column and in the string unit SU2.

In addition, when the memory pillar MP is provided in the row RD2 in the string unit Sill, the memory pillar MP is provided in the row RU1 in the same column and in the string unit SU2.

In this manner, in the memory area CSA, the distances from the two memory pillars MP, which are mutually opposed with the slit SLT1 interposed, to the slit SLT1 are different.

Next, a description is given of the relationship between the memory pillar MP of the string unit SU1 in the array end and the memory pillar MP of the string unit SU2 in the array end.

When the memory pillar MP is provided in the row RD1 in the string unit SU1, the memory pillar MP is provided in the row RU1 in the same column and in the string unit SU2. Each of the distance from the memory pillar MP belonging to the row RD1 to the slit SLT1 and the distance from the memory pillar MP belonging to the row RU1 to the slit SLT1 is dG1.

In this manner, in the array end, the distances from the two memory pillars MP, which are mutually opposed with the slit SLT1 interposed, to the slit SLT1 are substantially identical.

In the case of the present example, for instance, the layout of memory pillars MP of the string units SU2 and SU3 is not altered even near the array end. The positions (or the density of memory pillars MP) of the column that is the array end of the string units SU0 and SU1 and the column neighboring the array end are altered (see "H" in FIG. 8). Aside from this, only the position of the column that is the array end may be altered, or the positions of three or more columns may be altered. Such other examples will be described later.

Specifically, a distance between the memory pillar MP provided in the column C1 that is the array end of the string units SU0 and SU1 and the memory pillar MP, which is provided in the column C3 and neighbors the memory pillar MP provided in the column C1 in the X direction, is labeled as dF1. In addition, a distance between the memory pillar MP provided in the column C3 that is not the array end and the memory pillar MP, which is provided in the column C5 and neighbors the memory pillar MP provided in the column C3 in the X direction, is labeled as dF2. The distance dF1 is greater than the distance dF2.

A distance between the memory pillar MP provided in the column C2 neighboring the array end of the string units SU0 and SU1 and the memory pillar MP, which is provided in the column C4 and neighbors the memory pillar MP provided in the column C2 in the X direction, is labeled as dE1. In addition, a distance between the memory pillar MP provided in the column C4 that is not the array end and the memory pillar MP, which is provided in the column C6 and neighbors the memory pillar MP provided in the column C4 in the X direction, is labeled as dE2. The distance dE1 is greater than the distance dE2.

On the other hand, a distance between the memory pillar MP provided in the column C1 that is the array end of the string units SU2 and SU3 and the memory pillar MP, which is provided in the column C3 and neighbors the memory pillar MP provided in the column C1 in the X direction, is dE2. In addition, a distance between the memory pillar MP provided in the column C3 that is not the array end and the memory pillar MP, which is provided in the column C5 and neighbors the memory pillar MP provided in the column C3 in the X direction, is also dE2.

A distance between the memory pillar MP provided in the column C2 neighboring the array end of the string units SU2 and SU3 and the memory pillar MP, which is provided in the column C4 and neighbors the memory pillar MP provided in the column C2 in the X direction, is dF2. In addition, a distance between the memory pillar MP provided in the column C4 that is not the array end and the memory pillar MP, which is provided in the column C6 and neighbors the memory pillar MP provided in the column C4 in the X direction, is also dF2.

In this manner, the magnitude of the pitch of memory pillars MP provided in the string units SU2 and SU3 is not altered even near the array end, and only the memory pillars MP provided in the string units SU0 and SU1 are laid out with the pitch increasing toward the array end. In other words, the density of memory pillars MP in the array end area CEA is lower in the string units SU0 and SU1 than in the string units SU2 and SU3.

<1-4> Advantageous Effects

According to the above-described embodiment, in the cell area CA of the memory cell array 10, the memory pillars MP of a string unit set SS0 (first string unit set) and the memory pillars MP of a string unit set SS1 (second string unit set), which are disposed with the slit SLT being interposed, have layouts which are displaced from each other by a ½ pitch. However, in the array end at the boundary with the hookup area HA, the memory pillars MP of the first string unit set and the memory pillars MP of the second string unit set, which are disposed with the slit SLT being interposed, have layouts which are symmetric with respect to the slit SLT.

Figure 12:
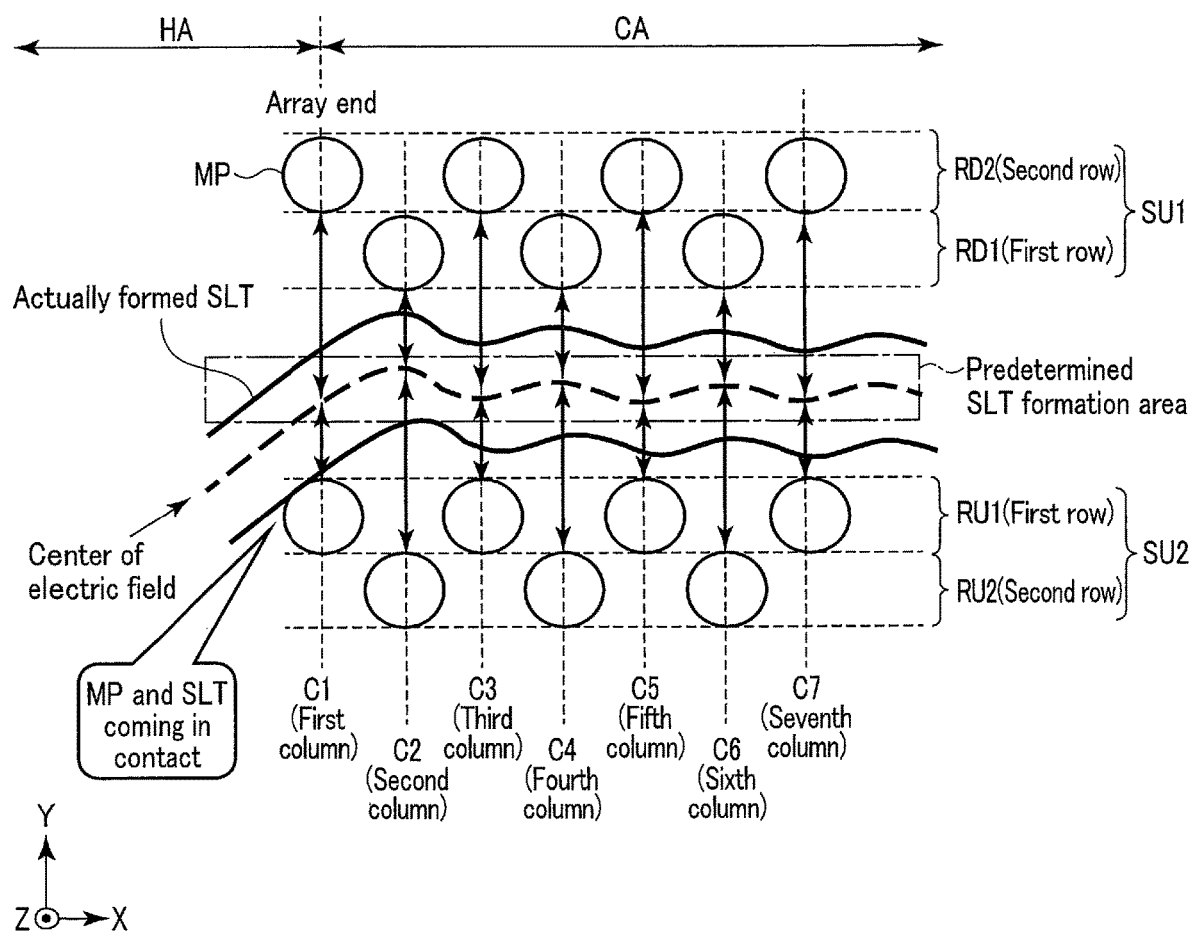
FIG. 12 is a view illustrating, in enlarged scale, "I" in FIG. 10.

Here, in order to explain the advantageous effects of the embodiment, a comparative example will be described with reference to FIG. 10 to FIG. 12. FIG. 10 illustrates an example of a planar layout of the memory cell array 10 in the boundary area between the hookup area HA and cell area CA of the semiconductor memory device 1 according to the comparative example, FIG. 10 illustrating an area ("B" in FIG. 3) corresponding to the string units SU0 to SU3 in an extracted manner. FIG. 11 and FIG. 12 illustrate, in enlarged scale, "I" shown in FIG. 10.

As illustrated in FIG. 10, in the comparative example, in the array end, the layout of memory pillars MP, which are disposed with the slit SLT interposed, is not line-symmetric.

In the meantime, in the manufacturing process of the memory cell array 10, there is a case in which electric charge is used. In addition, there is a case in which the electric charge stays in the insulating film 34 of the memory pillar MP, the semiconductor layer 31, or the like.

Thus, there is a case in which an electric field distribution is created by the charge accumulated in the memory pillars MP. The electric field distribution is determined in accordance with distances from the memory pillars MP. In the comparative example, when attention is paid to a predetermined formation area (predetermined SLT formation area) where the slit SLT is to be formed, distances from mutually neighboring memory pillars MP are different in the Y direction. As illustrated in FIG. 11, in the array end, a distance between the memory pillar MP, which is included in the string unit SU1 and the second row, and the predetermined SLT formation area is dG2, and a distance between the memory pillar MP, which is included in the string unit SU2 and the first row, and the predetermined SLT formation area is dG1 (dG1<dG2). In addition, in a column neighboring the array end, a distance between the memory pillar MP, which is included in the string unit SU1 and the first row, and the predetermined SLT formation area is dG1, and a distance between the memory pillar MP, which is included in the string unit SU2 and the second row, and the predetermined SLT formation area is dG2. In the example of FIG. 11, in the area near the array end, too, the distances from the memory pillars MP, which are disposed with the predetermined SLT formation area interposed, are different. Thus, in the comparative example, as illustrated in FIG. 11, the electric field has a zigzag shape, and, in particular, in the array end, there is a case in which the electric field shifts away from the center of the predetermined SLT formation area.

In addition, the slit SLT is formed by processing a trench by RIE and providing an insulating member in the trench.

If RIE is performed in such a place where the electric field distribution exists, ions are deflected by the influence of the electric field distribution, and there is a case in which such a slit SLT as illustrated in FIG. 12 is formed. As a result, in the array end, there is a case in which the slit SLT comes in contact with the memory pillar MP. In this case, there is concern that the conductive layers 22 to 24 are short-circuited via the slit SLT. Thus, there is a possibility that the memory cell array 10 becomes defective.

Figure 14:
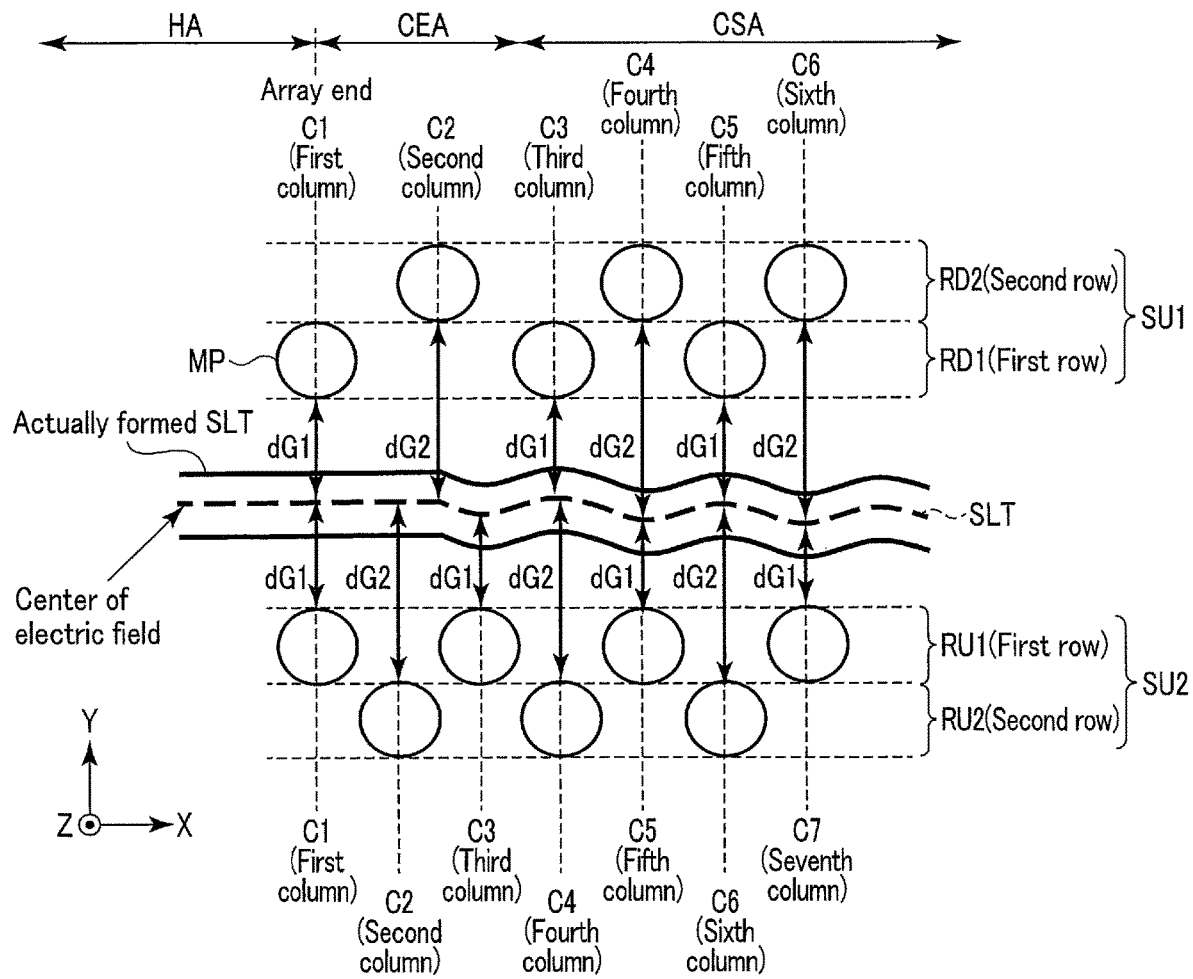
FIG. 14 illustrates an example of the planar layout of the memory cell array in the boundary area between the hookup area and the cell area of the semiconductor memory device according to the first embodiment.

Next, referring to FIG. 8, FIG. 13 and FIG. 14, the advantageous effects of the embodiment will be described. FIG. 13 and FIG. 14 are views illustrating, in enlarged scale, "G" shown in in FIG. 8.

In the above-described embodiment, as illustrated in FIG. 13, in the array end in which the electric field tends to be disturbed, the memory pillars MP are provided at substantially identical distances, with the predetermined formation area of the slit SLT being interposed. Thereby, the electric field distribution in the array end is not distorted and extends in the X direction.

As a result, as illustrated in FIG. 14, even when the slit SLT is formed by anisotropic etching using electric charge, contact between the slit SLT and the memory pillar MP can be suppressed.

As described above, according to the present embodiment, the layout of memory pillars MP in the array end area CEA is altered from the layout of memory pillars MP in the memory area CSA. Thereby, contact between the memory pillar MP of the array end and the slit SLT can be suppressed. Therefore, a semiconductor memory device with high quality, in which a defect is suppressed, can be provided.

<1-5> Modification

Next, a modification of the first embodiment will be described.

In the first embodiment, the layout of memory pillars MP of the array end (column) of the cell area CA, which neighbors the hookup area HA, and the position of the column neighboring the array end are altered. Aside from this, it is conceivable to alter the positions of three or more columns. Such a case is described in the present modification.

As described above, the memory pillars MP of the first string unit set and the memory pillars MP of the second string unit set, which are disposed with the slit SLT being interposed, have layouts which are displaced from each other by the ½ pitch. However, in the array end, the positions of the memory pillars MP are adjusted such that the memory pillars MP becomes line-symmetric with the slit SLT being interposed. In addition, in the array end area CEA, the memory pillars MP of the first string unit set and the memory pillars MP of the second string unit set, which are disposed with the slit SLT being interposed, have memory pillar densities, one of which is lower than the other.

Here, in the first embodiment, as regards the memory pillars MP of the first string unit set and the memory pillars MP of the second string unit set, which are disposed with the slit SLT being interposed, the layout of the memory pillars MP is not altered toward the array end on one side of the first string unit set and the second string unit set, and the positions of the memory pillars MP near the array end on the other side of the first string unit set and the second string unit set are adjusted. However, in the present modification, as regards both the memory pillars MP of the first string unit set and the memory pillars MP of the second string unit set, the positions of the memory pillars MP in the vicinity of the array end are adjusted so as to have such a layout that the memory pillar density becomes lower in the array end area CEA than in the memory area CSA.

Figure 15:
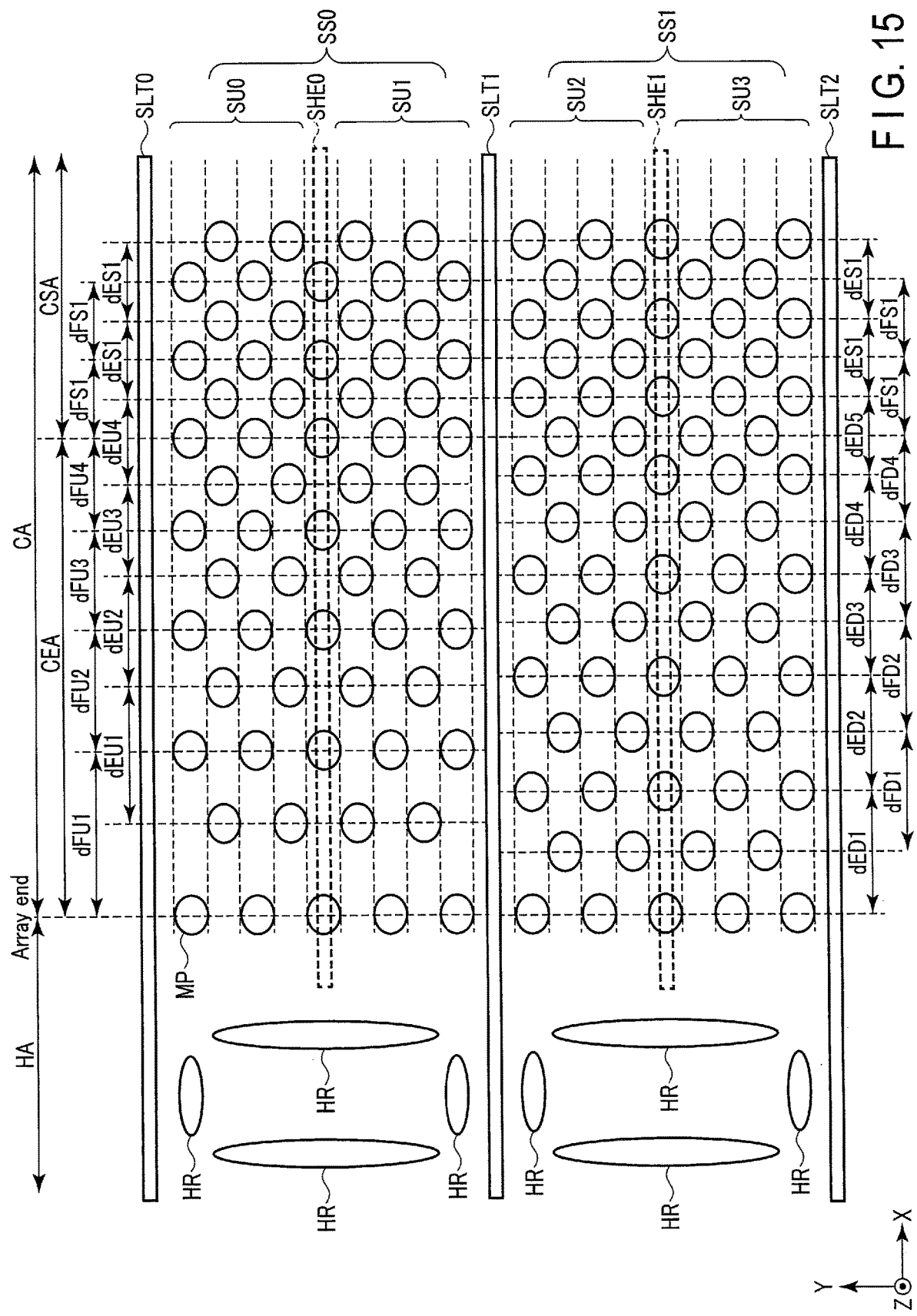
FIG. 15 illustrates an example of a planar layout of a memory cell array in a boundary area between a hookup area and a cell area of a semiconductor memory device according to a modification of the first embodiment.

Hereinafter, a concrete example will be described with reference to FIG. 15. FIG. 15 illustrates an example of the planar layout of the memory cell array in the boundary area between the hookup area HA and cell area CA of the semiconductor memory device 1 according to the modification of the first embodiment, FIG. 15 illustrating an area corresponding to the string units SU0 to SU3 in an extracted manner.

To begin with, attention is paid to the string units SU0 and Sill. As illustrated in FIG. 15, in the array end area CEA, the pitch of columns increases toward the array end. Specifically, the pitch between the memory pillar MP belonging to the array end and the memory pillar MP, which neighbors the memory pillar MP belonging to the array end in the X direction, is labeled as dFU1. The pitch between the memory pillar MP belonging to the column neighboring the array end and the memory pillar MP, which neighbors in the X direction, is labeled as dEU1. In this manner, with the memory pillar belonging to the array end being a starting point, the pitches between mutually neighboring memory pillars MP are labeled as dFU2, dFU3 and dFU4 from the array end toward the memory area CSA. In addition, with the memory pillar belonging to the column neighboring the array end being a starting point, the pitches between mutually neighboring memory pillars MP are labeled as dEU2, dEU3 and dEU4 from the array end toward the memory area CSA. In the present example, a relationship of dFU1>dFU2>dFU3>dFU4 is established. Similarly, in this example, a relationship of dEU1>dEU2>dEU3>dEU4 is established. Note that the number of columns in the array end area CEA and the pitch between memory pillars MP in the X direction may be changed as appropriate.

Next, attention is paid to the string units SU2 and SU3. As illustrated in FIG. 15, in the array end area CEA, the pitch of columns increases toward the array end. Specifically, the pitch between the memory pillar MP belonging to the array end and the memory pillar MP, which neighbors in the X direction, is labeled as dED1. The pitch between the memory pillar MP belonging to the column neighboring the array end and the memory pillar MP, which neighbors in the X direction, is labeled as dFD1. In this manner, with the memory pillar belonging to the array end being a starting point, the pitches between mutually neighboring memory pillars MP are labeled as dED2, dED3 and dED4 from the array end toward the memory area CSA. In addition, with the memory pillar belonging to the column neighboring the array end being a starting point, the pitches between mutually neighboring memory pillars MP are labeled as dFD2, dFD3 and dFD4 from the array end toward the memory area CSA. In the present example, a relationship of dED1>dED2>dED3>dED4 is established. Similarly, in this example, a relationship of dFD1>dFD2>dFD3>dFD4 is established. Note that the number of columns in the array end area CEA and the pitch between memory pillars MP in the X direction may be changed as appropriate.

In this example, a relationship of dFU1>dFD1 is established. Similarly, relationships of dFU2>dFD2, dFU3>dFD3, and dFU4>dFD4 are established. In addition, in this example, relationships of dEU1>dED1, dEU2>dED2, dEU3>dED3, and dEU4>dED4 are established.

The pitch between memory pillars MP in the array end area CEA is greater than a pitch dFS1 between memory pillars MP in the memory area CSA. Similarly, the pitch between memory pillars MP in the array end area CEA is greater than a pitch dES1 between memory pillars MP in the memory area CSA. Note that the pitch dFS1 between memory pillars MP in the memory area CSA is equal to the pitch dF2 in the first embodiment, and the pitch dES1 is equal to the pitch dE2 in the first embodiment. In the present modification, too, the same advantageous effects as in the first embodiment can be obtained.

<2> Second Embodiment

Next, a second embodiment will be described. In the first embodiment, in the cell area CA, the two string unit sets, which are disposed with the slit being interposed, are laid out with a displacement of a ½ pitch from each other, and only the array end of the cell area CA at the boundary with the hookup area HA is line-symmetric. In the second embodiment, however, a description is given of a case of altering the number of memory pillars MP in the vicinity of the array end of the cell area CA at the boundary with the hookup area HA. A description of the same parts as in the first embodiment is omitted.

<2-1> Layout

Hereinafter, a boundary area between the hookup area HA and cell area CA in the second embodiment will be described.

<2-1-1> First Example

Figure 16:
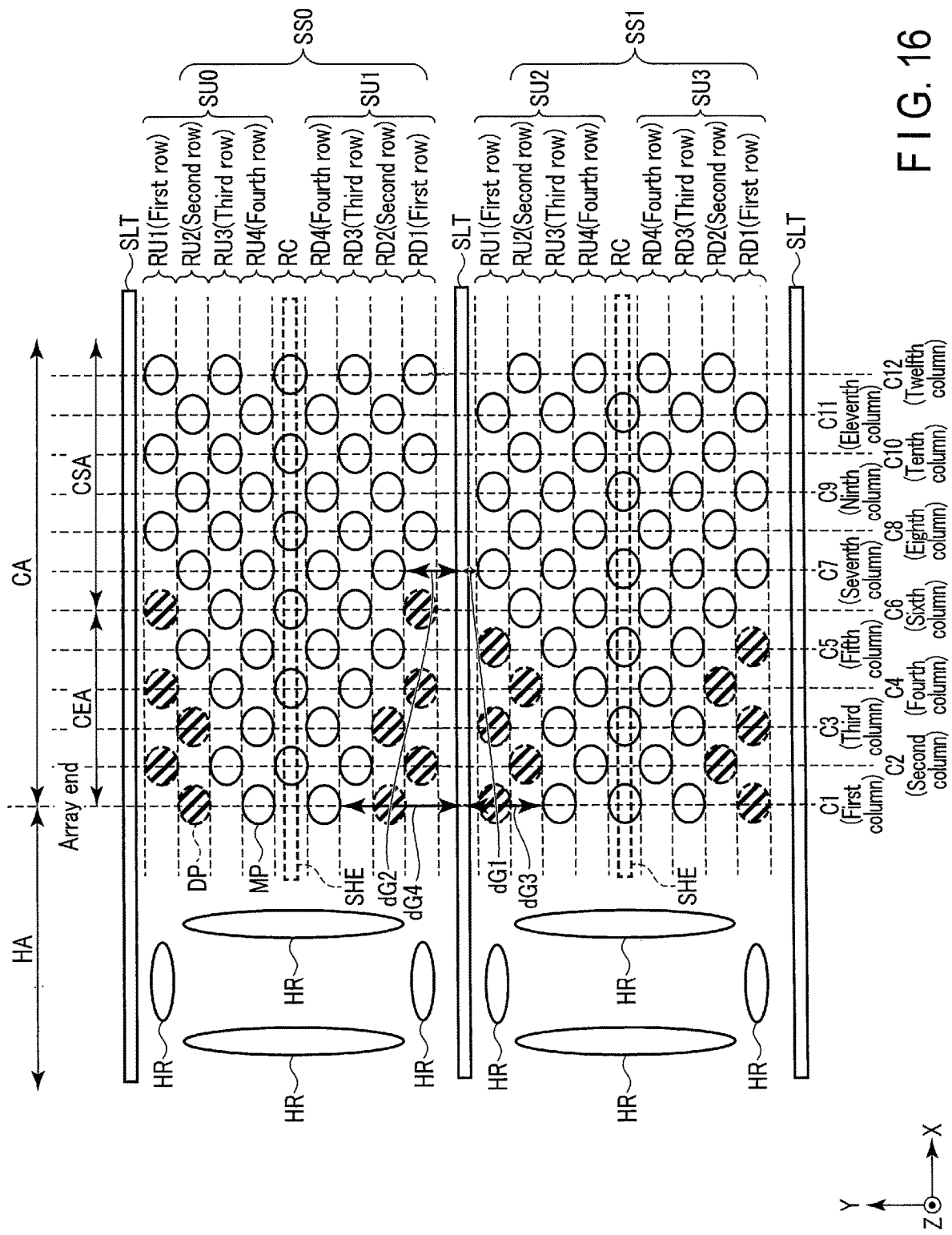
FIG. 16 illustrates a first example of a planar layout of a memory cell array in a boundary area between a hookup area and a cell area of a semiconductor memory device according to a second embodiment, FIG. 16 illustrating "B" in FIG. 3 in an extracted manner.

Referring to FIG. 16, a description is given of a first example of a planar layout of a memory cell array 10 in a boundary area between a hookup area HA and a cell area CA of a semiconductor memory device 1 according to the second embodiment.

FIG. 16 illustrates the first example of the planar layout of the memory cell array 10 in the boundary area between the hookup area HA and cell area CA of the semiconductor memory device 1 according to the second embodiment, FIG. 16 illustrating an area ("B" in FIG. 3) corresponding to the string units SU0 to SU3 in an extracted manner.

In FIG. 16, for the purpose of description, columns are labeled. Specifically, columns are labeled as C1, C2, C3, C4, . . . , in an order from a column belonging to the array end toward the center of the cell area CA (in the right direction of the drawing sheet of FIG. 16). In addition, C1, C2, C3, C4, . . . , may also be expressed as a first column, a second column, a third column, a fourth column, . . . .

In the second embodiment, memory pillars are not disposed near the slits SLT in the array end area CEA in the vicinity of the array end of the cell area CA.

In a first example, as illustrated in FIG. 16, protection pillars DP are provided in place of memory pillars MP at intersections between the column C1 and the rows RU2 (SU0), RD2 (SU1), RU1 (SU2), and RD1 (SU3). The protection pillar DP may be formed, for example, such that an insulating member is buried in a memory hole. The material buried in the protection pillar DP is a material different from the insulating film 34 or semiconductor layer 31 used in the memory pillar MP (an insulating material having a less amount of fixed charge than the insulating film 34, or an insulating material having a charge amount which does not become greater than in the insulating film 34 at the time of the manufacture of the semiconductor memory device). In addition, in the first example, protection pillars DP are provided in place of memory pillars MP at intersections between the column C2 and the rows RU1 (SU0), RD1 (SU1), RU2 (SU2), and RD2 (SU3). Further, in the first example, protection pillars DP are provided in place of memory pillars MP at intersections between the column C3 and the rows RU2 (SU0), RD2 (SU1), RU1 (SU2), and RD1 (SU3). Besides, protection pillars DP are provided in place of memory pillars MP at intersections between the column C4 and the rows RU1 (SU0), RD1 (SU1), RU2 (SU2), and RD2 (SU3). In addition, in the first example, protection pillars DP are provided in place of memory pillars MP at intersections between the column C5 and the rows RU1 (SU2) and RD1 (SU3). Moreover, in the first example, protection pillars DP are provided in place of memory pillars MP at intersections between the column C6 and the rows RU1 (SU0) and RD1 (SU1).

In the example of FIG. 16, the array end area CEA includes the columns C1 to C6. In addition, the memory area CSA includes columns C7 onwards.

As illustrated in FIG. 16, it is assumed that a distance from the memory pillars MP belonging to the row RD4 and row RU4 to the slit SLT (e.g. the center of the slit SLT) is dG4. In addition, it is assumed that a distance from the memory pillars MP belonging to the row RD3 and row RU3 to the slit SLT (e.g. the center of the slit SLT) is dG3. Note that such a relationship that the distance dG4 is greater than the distance dG3 is established.

Specifically, in the array end area CEA, the memory pillar MP (column C1 and row RD4) and memory pillar MP (column C1 and row RU3), which both neighbor the slit SLT in the Y direction, are provided in the Y direction. Here, a distance to the slit SLT from the memory pillar MP (column C1 and row RD4), which neighbors the slit SLT in the Y direction, is dG4. A distance to the slit SLT from the memory pillar MP (column C1 and row RU3), which neighbors the slit SLT in the Y direction, is dG3.

In addition, in the memory area CSA which neighbors the array end area CEA, the memory pillar MP (column 7 and row RD2) and memory pillar MP (column 7 and row RU1), which both neighbor the slit SLT in the Y direction, are provided in the Y direction. Here, a distance to the slit SLT from the memory pillar MP (column C7 and row RD2), which neighbors the slit SLT in the Y direction, is set to be dG2. A distance to the slit SLT from the memory pillar MP (column C7 and row RU1), which neighbors the slit SLT in the Y direction, is set to be dG1. In the memory area CSA, since the memory pillars MP are laid out with a displacement of a ½ pitch between the two string unit sets which are disposed with the slit SLT being interposed, the distances from the two memory pillars MP, which are opposed to each other with the slit SLT interposed, to the slit SLT are different, as in the first embodiment, and have a relationship of dG1<dG2. As regards the memory pillars MP which neighbor the slit SLT in the Y direction, the distances dG1, dG2, dG3 and dG4 from these memory pillars MP to the slit have a relationship of dG1<dG2<dG3<dG4.

When attention is paid to the string unit SU1, the distance dG2 to the slit SLT from the memory pillar MP (column C7 and row RD2), which neighbors the slit SLT in the Y direction in the memory area CSA, and the distance dG4 to the slit SLT from the memory pillar MP (column C1 and row RD4), which neighbors the slit SLT in the Y direction in the array end area CEA, have a relationship of dG2<dG4. In addition, when attention is paid to the string unit SU2, the distance dG1 to the slit SLT from the memory pillar MP (column C7 and row RU1), which neighbors the slit SLT in the Y direction in the memory area CSA, and the distance dG3 to the slit SLT from the memory pillar MP (column C1 and row RU3), which neighbors the slit SLT in the Y direction in the array end area CEA, have a relationship of dG1<dG3. In other words, in the second embodiment, the number of memory pillars MP is decreased in the array end area CEA in the vicinity of the array end of the cell area CA, such that the distance from the memory pillar MP, which neighbors the slit SLT in the Y direction, becomes less in the memory area CSA than in the array end area CEA.

<2-1-2> Second Example

Figure 17:
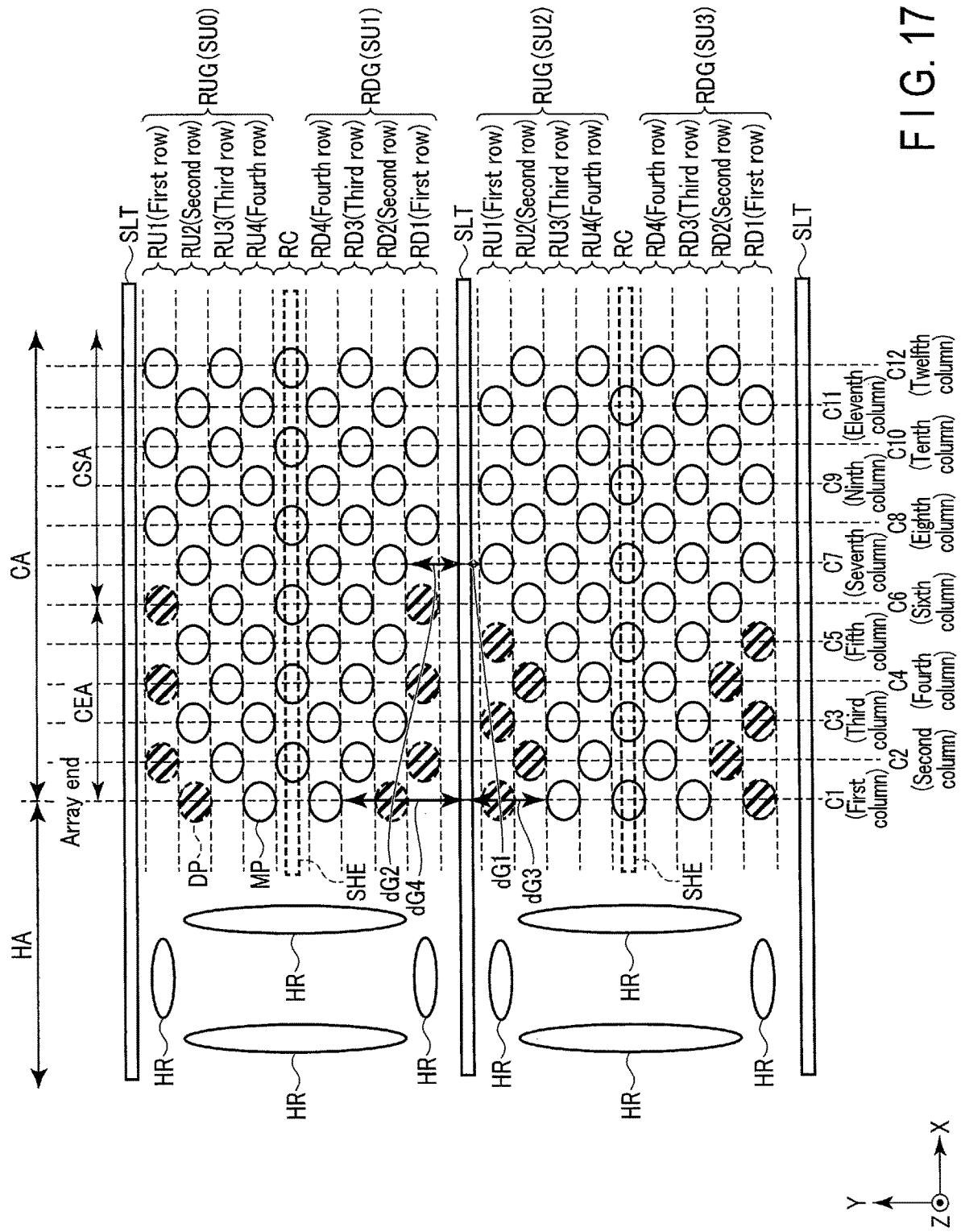
FIG. 17 illustrates a second example of the planar layout of the memory cell array in the boundary area between the hookup area and the cell area of the semiconductor memory device according to the second embodiment, FIG. 17 illustrating "B" in FIG. 3 in an extracted manner.

Referring to FIG. 17, a description is given of a second example of the planar layout of the memory cell array 10 in the boundary area between the hookup area HA and cell area CA of the semiconductor memory device 1 according to the second embodiment.

FIG. 17 illustrates the second example of the planar layout of the memory cell array 10 in the boundary area between the hookup area HA and cell area CA of the semiconductor memory device 1 according to the second embodiment, FIG. 17 illustrating an area ("B" in FIG. 3) corresponding to the string units SU0 to SU3 in an extracted manner.

In FIG. 17, too, the columns are labeled similarly as in FIG. 16.

Only differences between the second example and the first example will be described.

In the first example, the protection pillars DP are provided in place of the memory pillars MP at intersections between the column C3 and the rows RU2 (SU0) and RD2 (SU1). However, in the second example, the memory pillars MP are provided at intersections between the column C3 and the rows RU2 (SU0) and RD2 (SU1).

In the example of FIG. 17, the array end area CEA includes the columns C1 to C6.

<2-1-3> Third Example

Figure 18:
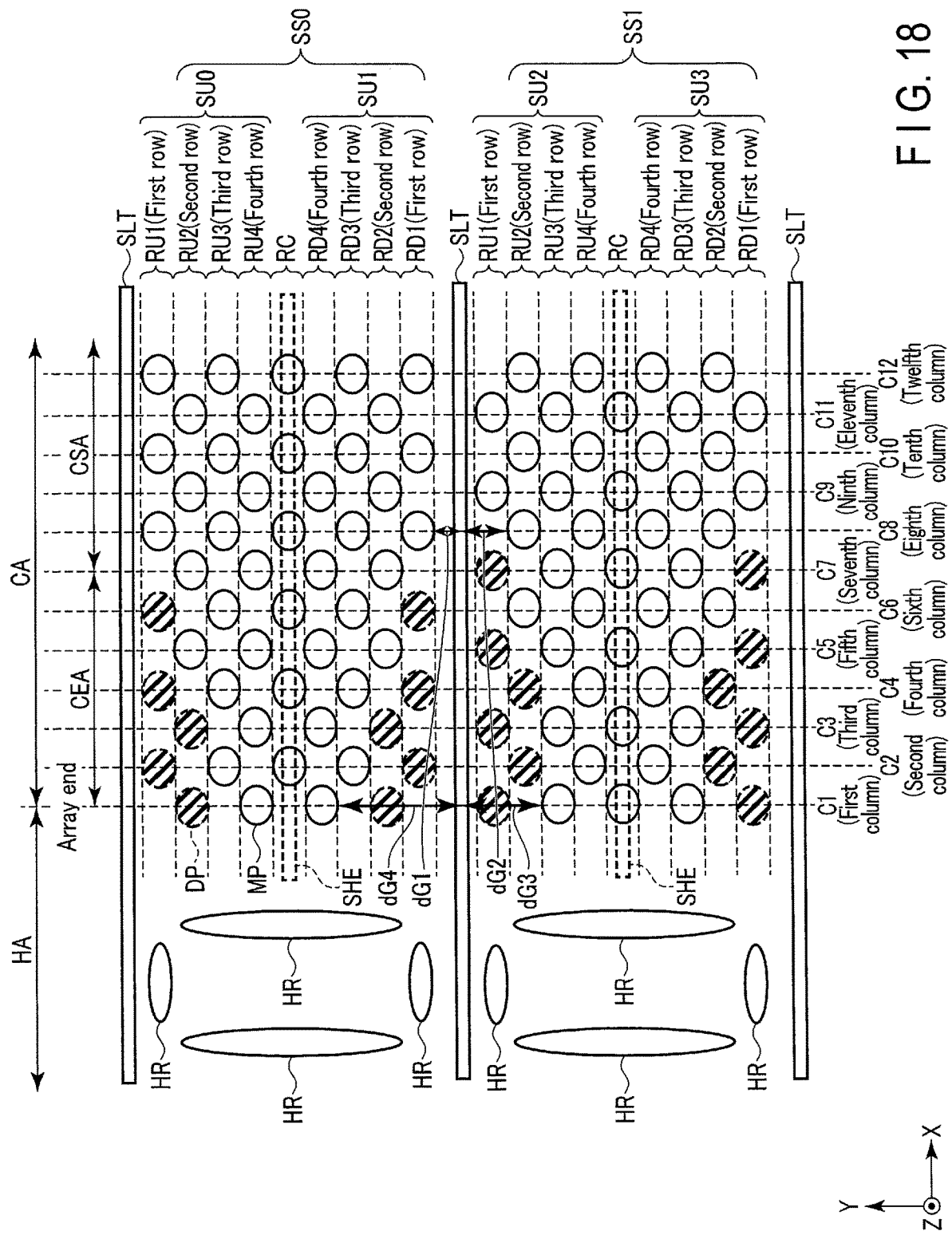
FIG. 18 illustrates a third example of the planar layout of the memory cell array in the boundary area between the hookup area and the cell area of the semiconductor memory device according to the second embodiment, FIG. 18 illustrating "B" in FIG. 3 in an extracted manner.

Referring to FIG. 18, a description is given of a third example of the planar layout of the memory cell array 10 in the boundary area between the hookup area HA and cell area CA of the semiconductor memory device 1 according to the second embodiment.

FIG. 18 illustrates the third example of the planar layout of the memory cell array 10 in the boundary area between the hookup area HA and cell area CA of the semiconductor memory device 1 according to the second embodiment, FIG. 18 illustrating an area ("B" in FIG. 3) corresponding to the string units SU0 to SU3 in an extracted manner.

In FIG. 18, too, the columns are labeled similarly as in FIG. 16.

Only differences between the third example and the first example will be described.

In the third example, in addition to the case of the first example, protection pillars DP are further provided in place of the memory pillars MP at intersections between the column C7 and the rows RU1 (SU2) and RD1 (SU3).

In the example of FIG. 18, the array end area CEA includes the columns C1 to C7.

<2-1-4> Fourth Example

Figure 19:
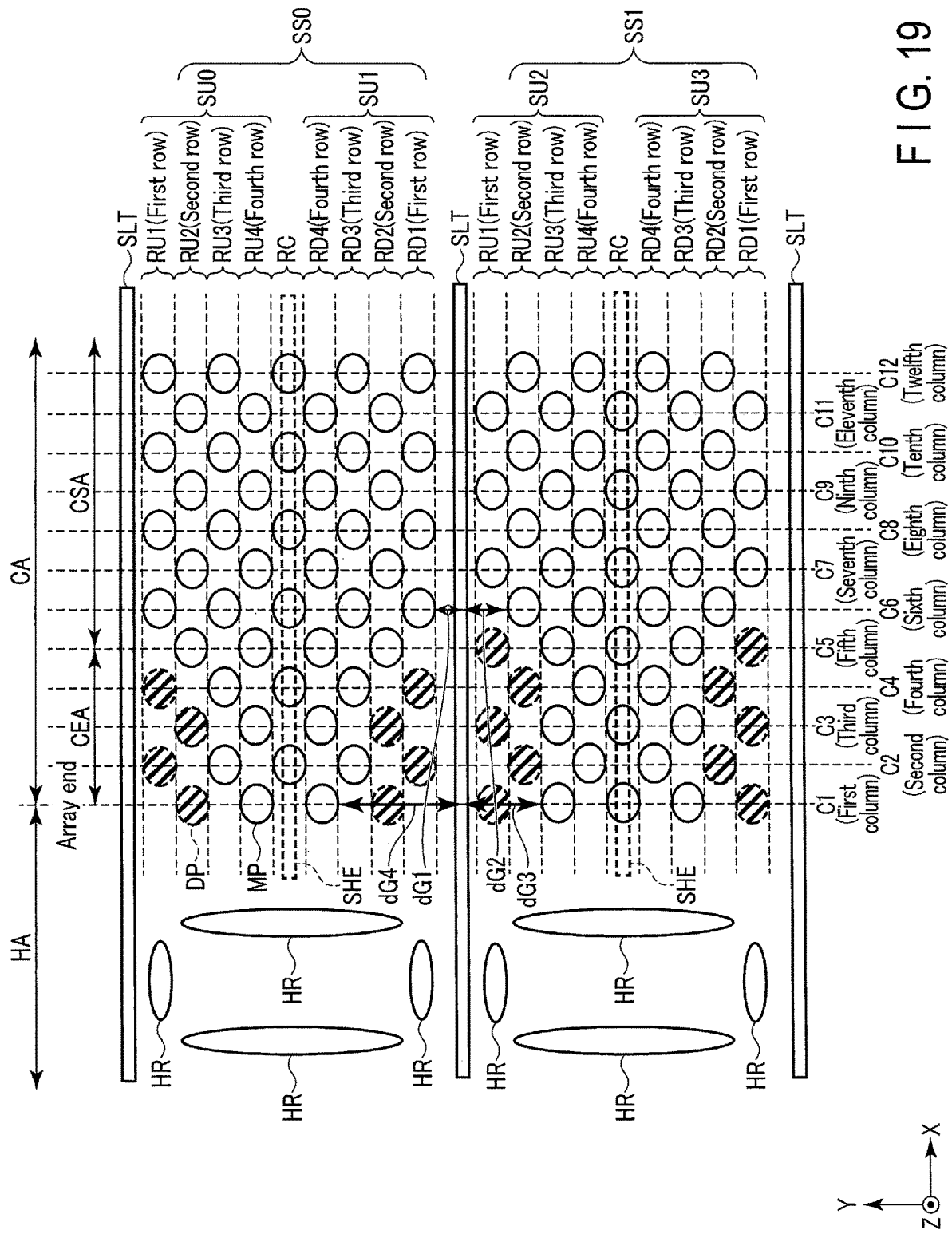
FIG. 19 illustrates a fourth example of the planar layout of the memory cell array in the boundary area between the hookup area and the cell area of the semiconductor memory device according to the second embodiment, FIG. 19 illustrating "B" in FIG. 3 in an extracted manner.

Referring to FIG. 19, a description is given of a fourth example of the planar layout of the memory cell array 10 in the boundary area between the hookup area HA and cell area CA of the semiconductor memory device 1 according to the second embodiment.

FIG. 19 illustrates the fourth example of the planar layout of the memory cell array 10 in the boundary area between the hookup area HA and cell area CA of the semiconductor memory device 1 according to the second embodiment, FIG. 19 illustrating an area ("B" in FIG. 3) corresponding to the string units SU0 to SU3 in an extracted manner.

In FIG. 19, too, the columns are labeled similarly as in FIG. 16.

Only differences between the fourth example and the first example will be described.

In the first example, the protection pillars DP are provided in place of the memory pillars MP at intersections between the column C6 and the rows RU1 (SU0) and RD1 (SU1). However, in the fourth example, the memory pillars MP are provided at intersections between the column C6 and the rows RU1 (SU0) and RD1 (SU1).

In the example of FIG. 19, the array end area CEA includes the columns C1 to C5.

In the above description, the protection pillar DP is illustrated as having the same shape (cross-sectional area) as the memory pillar MP, but the embodiment is not limited to this. For example, the protection pillar DP may have such a shape as to include a plurality of memory pillars MP. In addition, the protection pillar DP may be a support pillar HR. Specifically, it suffices if memory pillars MP are not provided near the slit SLT at least in the array end of the cell area CA, and the number of protection pillars DP may be freely selected and the protection pillar DP may have any shape.

In addition, near the array end of the cell area CA and in the vicinity of the slit SLT, memory pillars MP may be thinned out in a stepwise manner. Specifically, the number of memory pillars MP, which are thinned out in the vicinity of the array end of the cell area CA and in the first row neighboring the slit SLT in the Y direction is greater than the number of memory pillars MP, which are thinned out in the second row neighboring the slit SLT in the Y direction. In addition, the number of memory pillars MP, which are thinned out in the vicinity of the array end of the cell area CA and in the second row neighboring the slit SLT in the Y direction, may be determined based on the number of memory pillars MP, which are thinned out in the vicinity of the array end of the cell area CA and in the first row neighboring the slit SLT in the Y direction. Specifically, as illustrated in FIG. 16, when attention is paid to the row RD1 of the string unit SU1 and the row RU1 of the string unit SU2, the memory pillars MP of the row RU1 are provided closer to the array end side than the memory pillars MP of the row RD1. In the case of this state, it is possible that the electric field in the slit SLT deviates to the string unit SU2 side. Then, attention is paid to the row RD2 of the string unit SU1 and the row RU2 of the string unit SU2. In this case, the memory pillars MP of the row RD2 are provided closer to the array end side than the memory pillars MP of the row RU2 in such a manner as to compensate the above-described deviation of the electric field to the string unit SU2 side. In this manner, it is preferable that the number of memory pillars MP, which are thinned out in the second row which neighbors the slit SLT in the Y direction, is determined based on the number of memory pillars MP which are thinned out in the first row.

<2-2> Manufacturing Method

Next, a manufacturing method of the semiconductor memory device according to the second embodiment will be described in brief.

<2-2-1> First Example

Hereinafter, referring to FIG. 20 to FIG. 46, a description is given of an example of serial fabrication steps relating to the formation of a stacked interconnect structure in the memory cell array 10 in the semiconductor memory device 1 according to the second embodiment. FIG. 20 is a flowchart illustrating a first example of the manufacturing method of the semiconductor memory device 1 according to the second embodiment. Each of FIG. 21 to FIG. 46 illustrates an example of a planar layout or a cross-sectional structure during the manufacture of the semiconductor memory device 1 according to the second embodiment. In the description below of the manufacturing method, plan views which are to be referred to correspond to the area illustrated in FIG. 16.

[S1001]

Figure 21:
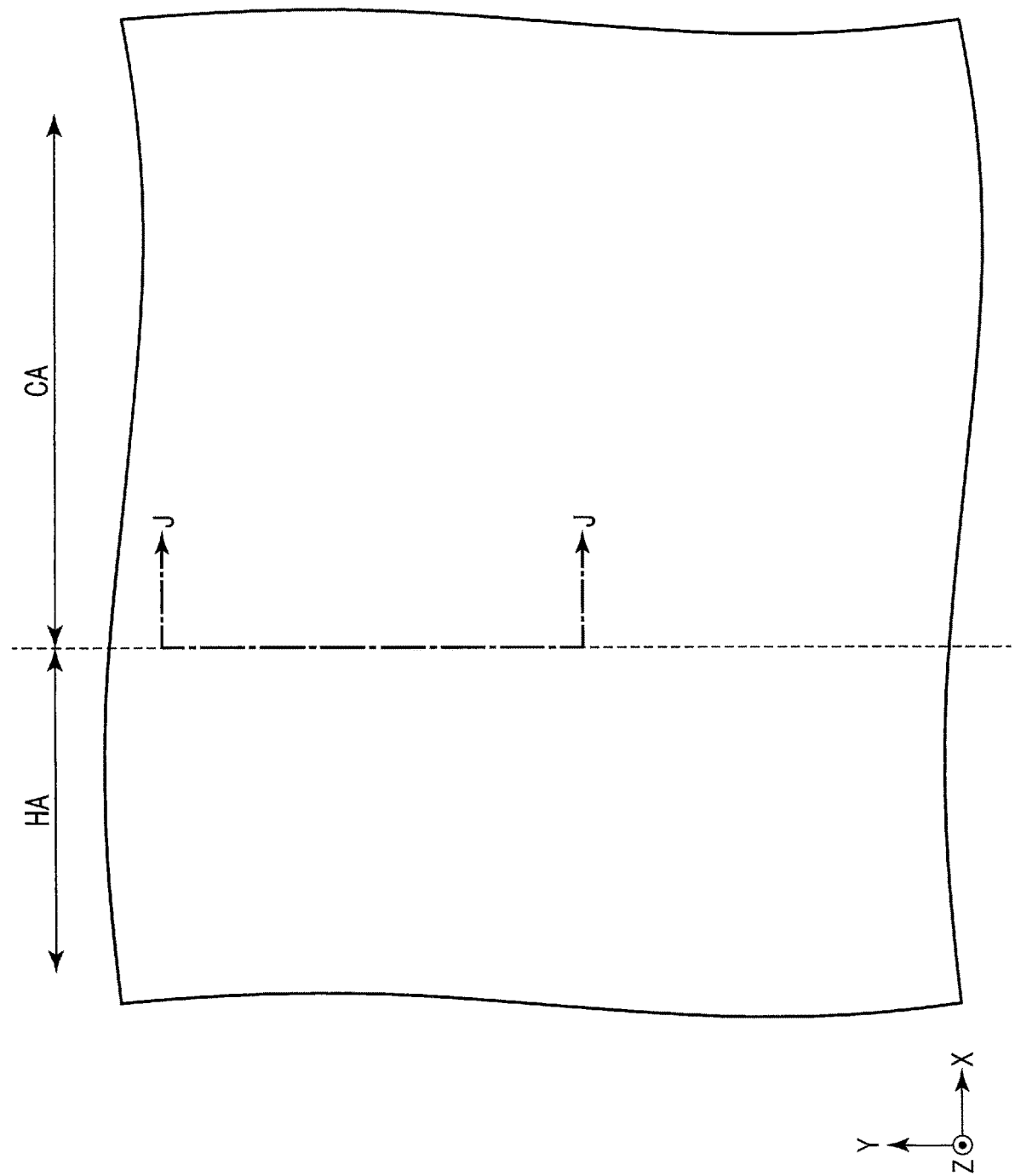
FIG. 21 illustrates an example of a planar layout during the manufacture of the semiconductor memory device according to the second embodiment.
Figure 22:
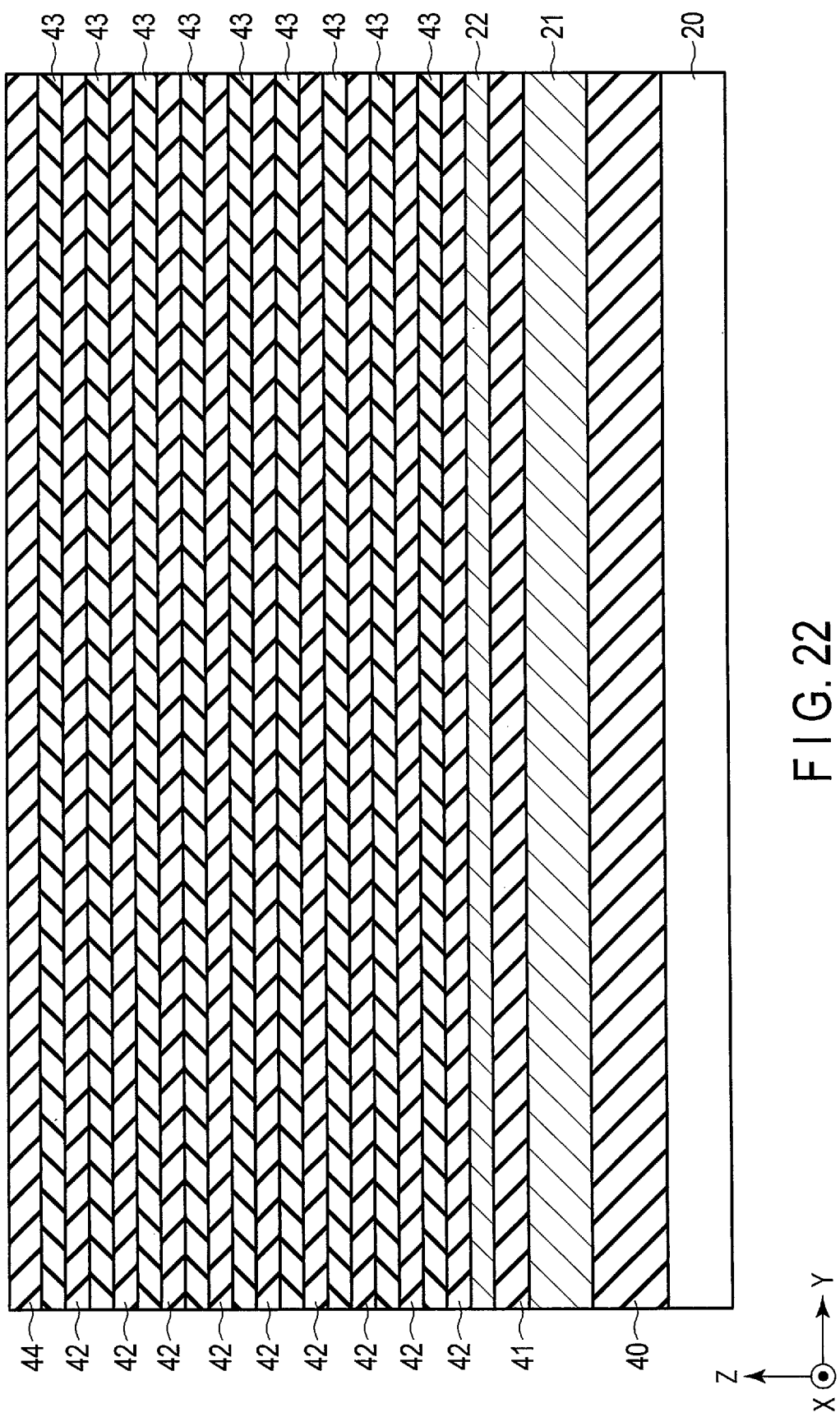
FIG. 22 is a cross-sectional view taken along line J-J in FIG. 21, illustrating an example of a cross-sectional structure during the manufacture of the semiconductor memory device.

Referring to FIG. 21 and FIG. 22, step S1001 is described. FIG. 21 illustrates an example of a planar layout during the manufacture of the semiconductor memory device 1 according to the second embodiment. FIG. 22 is a cross-sectional view taken along line J-J in FIG. 21, illustrating an example of a cross-sectional structure during the manufacture of the semiconductor memory device 1.

To start with, by a process of step S1001, sacrificial members 43 of interconnect portions are stacked as illustrated in FIG. 21 and FIG. 22. The sacrificial members 43 of interconnect portions correspond to stacked interconnects which memory holes MH to be formed in a subsequent step penetrate. In the present step, to begin with, an insulating layer 40, a conductive layer 21, an insulting layer 41 and a conductive layer 22 are successively stacked on a semiconductor substrate 20. Although depiction is omitted, circuitry corresponding to the row decoder module 15, sense amplifier module 16 and the like may be formed in the insulating layer 40. Thereafter, insulating layers 42 and sacrificial members 43 are alternately stacked on the conductive layer 22, and an insulating layer 44 is formed on the uppermost sacrificial member 43. The stacking of the layers is performed, for example, by CVD (Chemical Vapor Deposition).

The conductive layer 21 is used as a source line SL. The conductive layer 21 includes, for example, silicon (Si). The conductive layer 22 is used as a select gate line SGS. The conductive layer 22 includes, for example, silicon. Each of the insulating layers 41, 42 and 44 includes, for example, silicon oxide ($SiO_2$). For example, the number of layers, in which the sacrificial members 43 are formed, corresponds to the number of word lines WL and select gate line SGD. The sacrificial member 43 includes, for example, silicon nitride (SiN).

[S1002]

Next, by a process of step S1002, a stepped structure in the hookup area HA is formed. Specifically, to begin with, by photolithography or the like, a mask covering, for example, a part of a stepped area in the hookup area HA is formed. Then, stepped portions in the Y direction or X direction are formed in the sacrificial members 43 provided in the hookup area HA, by a combination between anisotropic etching using the formed mask and a slimming process of the mask. Thereafter, an insulating layer (not shown) is formed in a manner to fill the space formed on the stepped structure in the hookup area HA, and a top surface of the insulating layer is planarized by CMP or the like.

[S1003]

Figure 23:
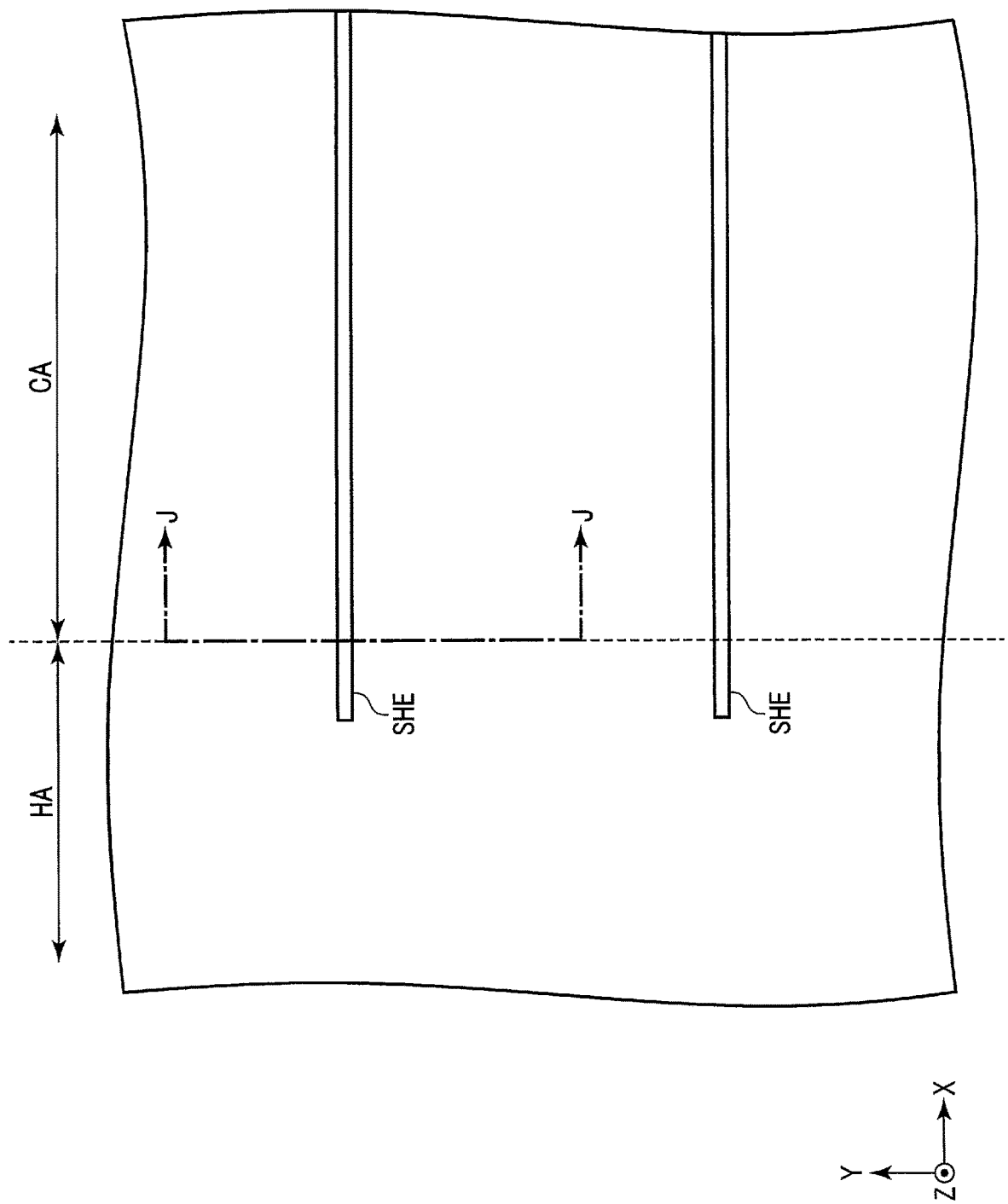
FIG. 23 illustrates an example of the planar layout during the manufacture of the semiconductor memory device according to the second embodiment.
Figure 24:
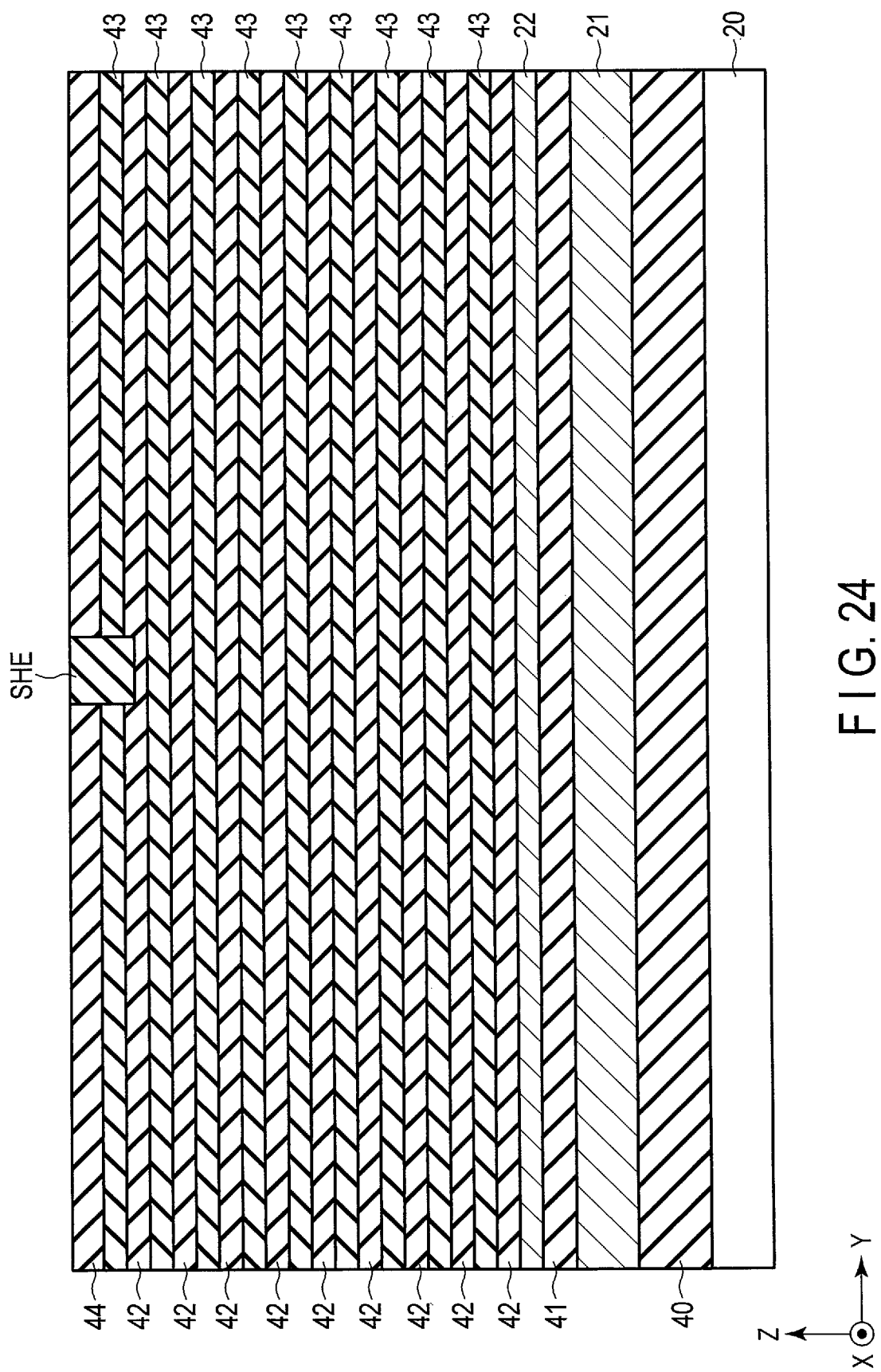
FIG. 24 is a cross-sectional view taken along line J-J in FIG. 23, illustrating an example of a cross-sectional structure during the manufacture of the semiconductor memory device.

Referring to FIG. 23 and FIG. 24, step S1003 is described. FIG. 23 illustrates an example of the planar layout during the manufacture of the semiconductor memory device 1 according to the second embodiment. FIG. 24 is a cross-sectional view taken along line J-J in FIG. 23, illustrating an example of a cross-sectional structure during the manufacture of the semiconductor memory device 1. Next, by a process of step S1003, a slit SHE is formed as illustrated in FIG. 23 and FIG. 24. Specifically, to begin with, by photolithography or the like, a mask with an opening in an area corresponding to the slit SHE is formed. Then, a trench extending in the X direction is formed by anisotropic etching using the formed mask. Then, an insulator is buried in the trench by CVD or the like, and the slit SHE is formed.

The slit SHE formed in the present step divides the uppermost stacked sacrificial member 43 in the cell area CA, and a bottom portion of the slit SHE stops in a layer in which, for example, the insulating layer 42 immediately below the uppermost stacked sacrificial member 43 is formed. The anisotropic etching in this step is, for example, RIE.

[S1004]

Figure 25:
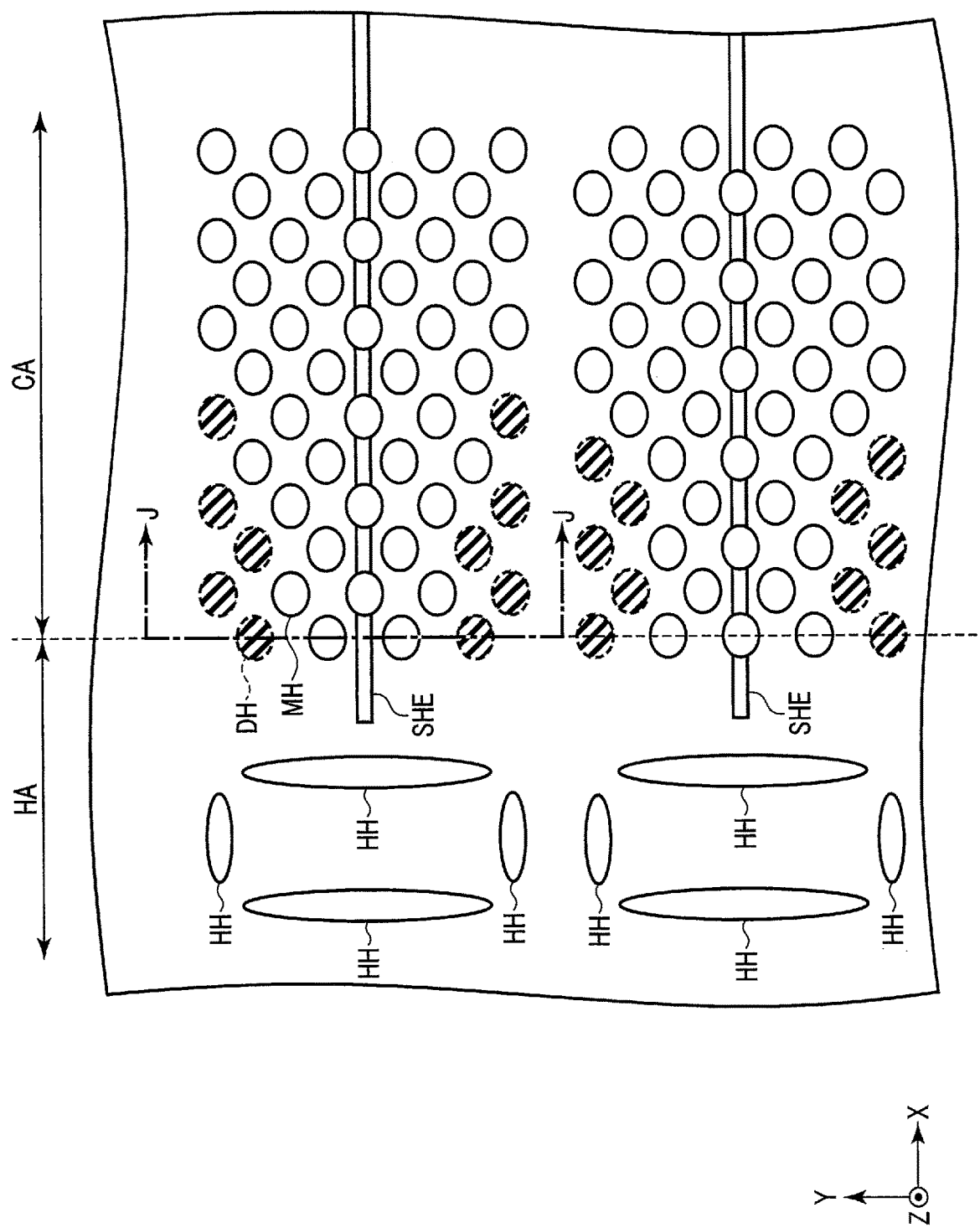
FIG. 25 illustrates an example of the planar layout during the manufacture of the semiconductor memory device according to the second embodiment.
Figure 26:
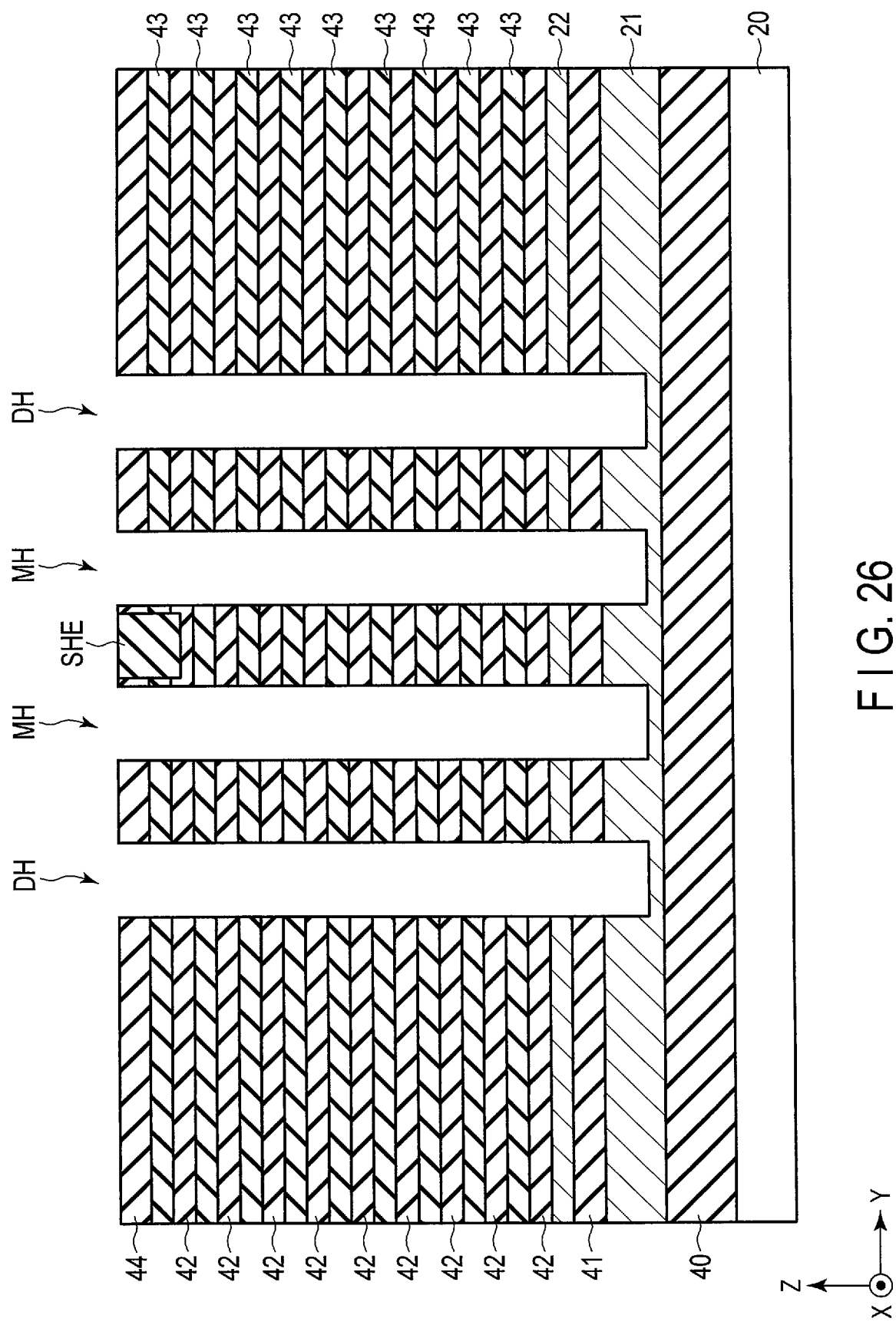
FIG. 26 is a cross-sectional view taken along line J-J in FIG. 25, illustrating an example of a cross-sectional structure during the manufacture of the semiconductor memory device.
Figure 27:
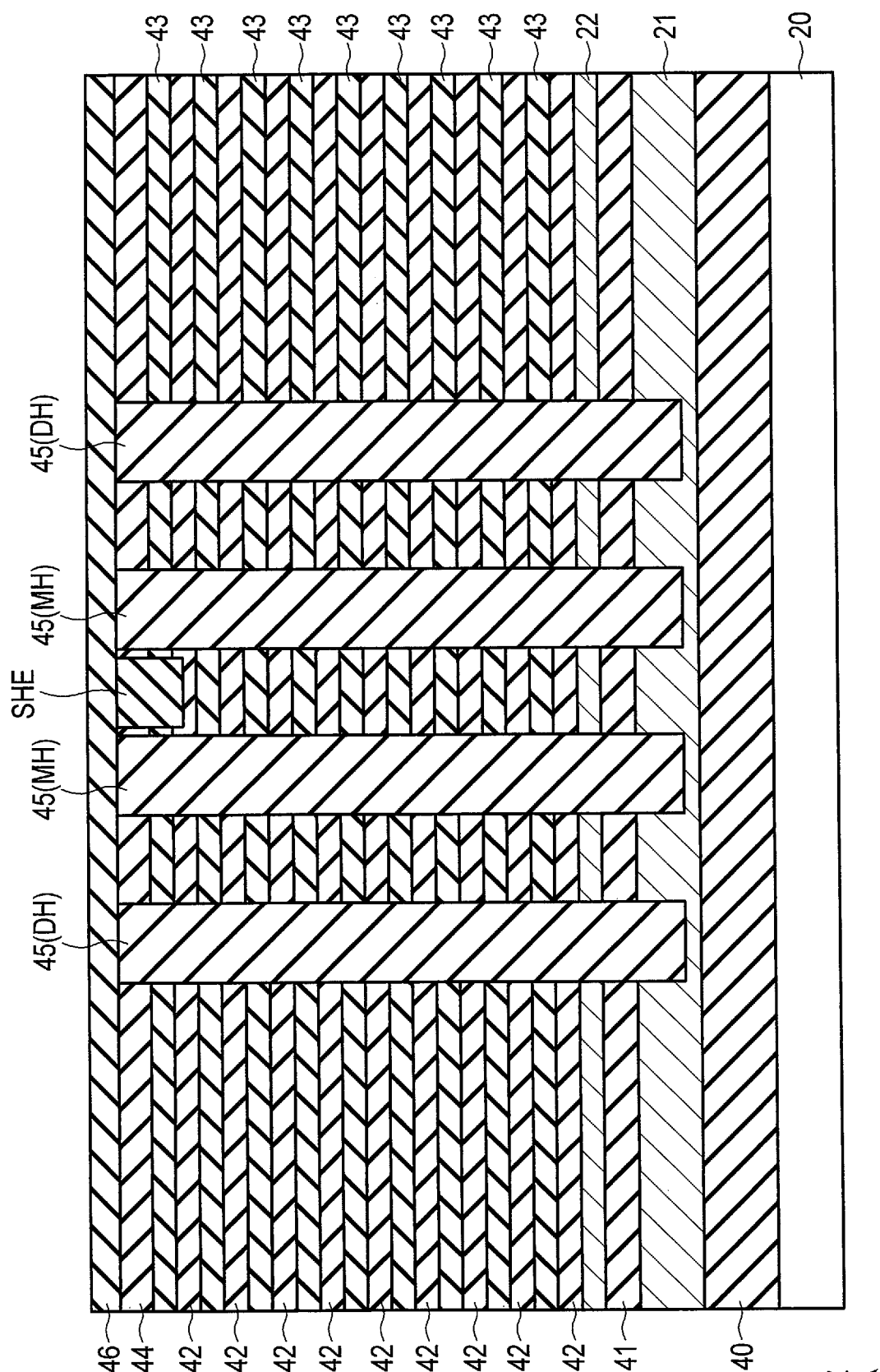
FIG. 27 is a cross-sectional view taken along line J-J in FIG. 25, illustrating an example of a cross-sectional structure during the manufacture of the semiconductor memory device.

Referring to FIG. 25 to FIG. 27, step S1004 is described. FIG. 25 illustrates an example of the planar layout during the manufacture of the semiconductor memory device 1 according to the second embodiment. Each of FIG. 26 and FIG. 27 is a cross-sectional view taken along line J-J in FIG. 25, illustrating an example of a cross-sectional structure during the manufacture of the semiconductor memory device 1.

Next, by a process of step S1004, memory holes MH which are opened in shapes of memory pillars MP, protection holes DH which are opened in shapes of protection pillars DP, and support pillar holes HH which are opened in shapes of support pillars HR, are formed as illustrated in FIG. 26 and FIG. 27. Specifically, to start with, by photolithography or the like, a mask with openings in areas corresponding to the memory holes MH, protection holes DH and support pillar holes HH is formed. Then, by anisotropic etching using the formed mask, the memory holes MH, protection holes DH and support pillar holes HH are formed. In plan view, the memory holes MH, protection holes DH and support pillar holes HH formed in this step correspond to the memory pillars MP, protection pillars DP and support pillars HR illustrated, for example, in FIG. 16.

The memory holes MH, protection holes DH and support pillar holes HH formed in the present step penetrate the insulating layers 41, 42 and 44 and sacrificial members 43, and bottom parts of the memory holes MH, protection holes DH and support pillar holes HH stop, for example, in the conductive layer 21. The anisotropic etching in this step is, for example, RIE.

Then, as illustrated in FIG. 27, sacrificial members 45 are buried in the memory holes MH, protection holes DH and support pillar holes HH by CVD or the like. Thereafter, by CVD or the like, an insulating layer 46 is formed to cover the entire insulating layer 44 and sacrificial members 45.

For example, the sacrificial members 45 includes polysilicon. In addition, the insulating layer 46 includes, for example, silicon oxide ($SiO_2$).

[S1005]

Figure 28:
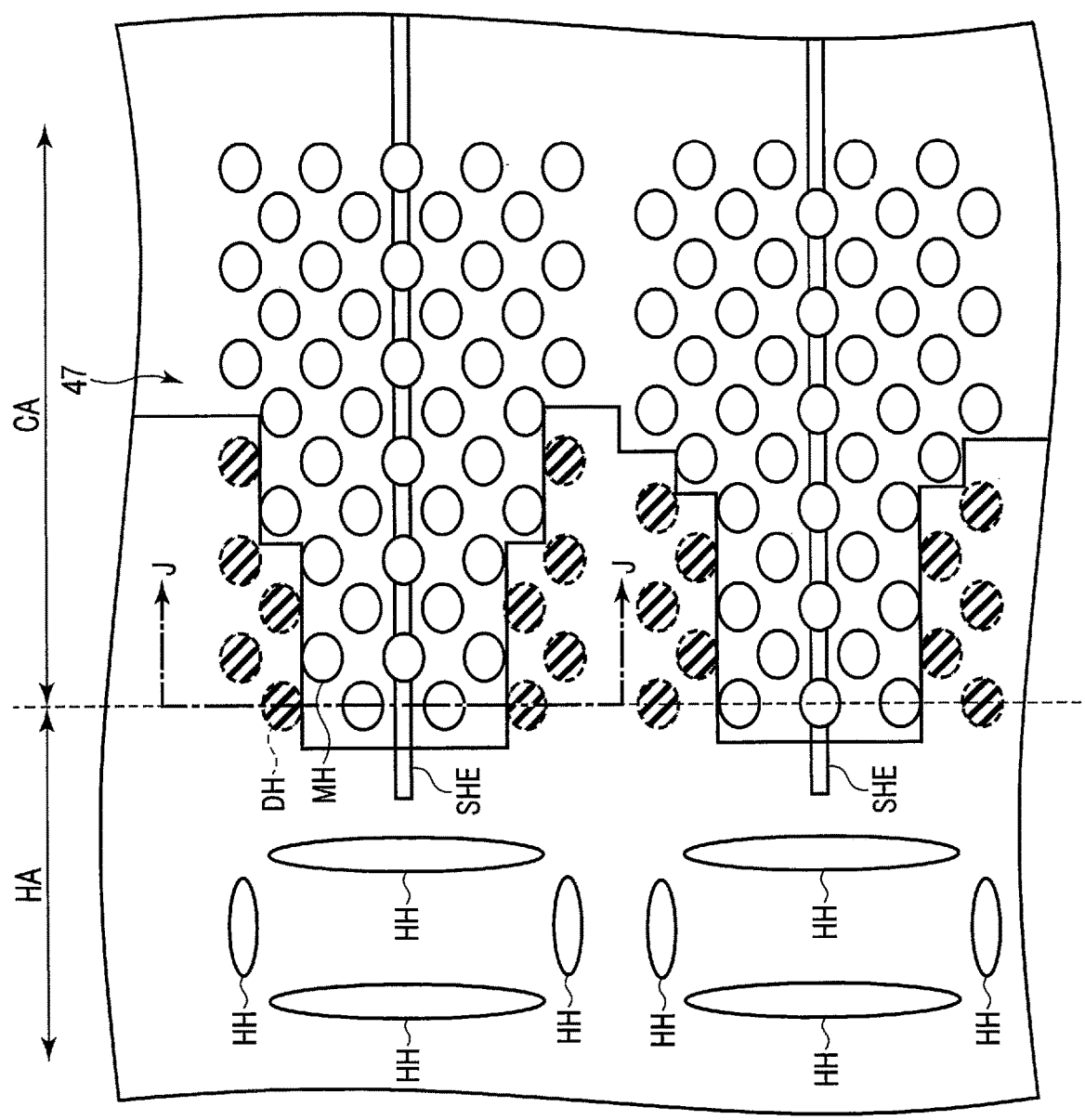
FIG. 28 illustrates an example of the planar layout during the manufacture of the semiconductor memory device according to the second embodiment.
Figure 28:
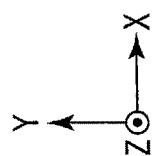
Figure 29:
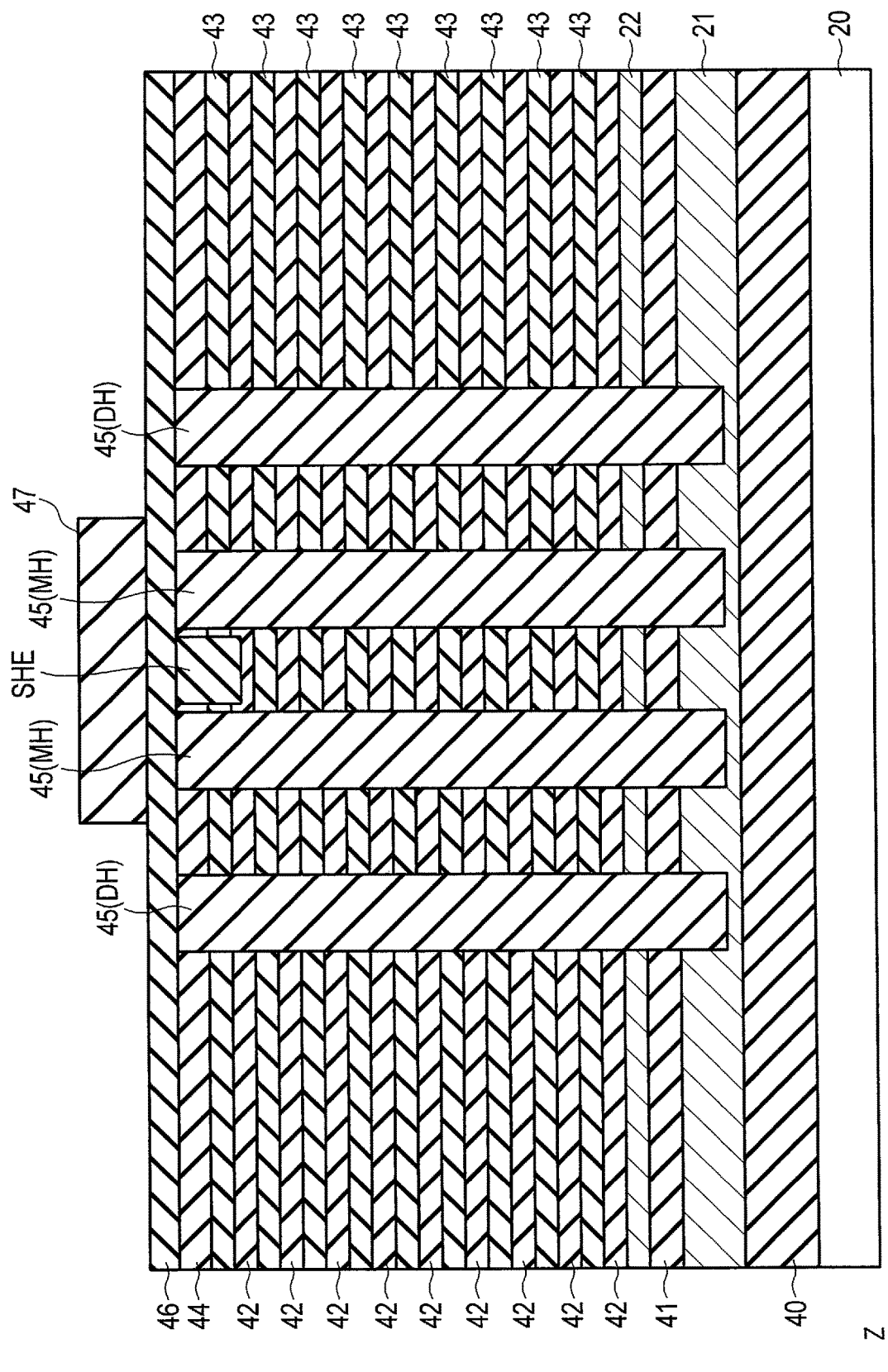
FIG. 29 is a cross-sectional view taken along line J-J in FIG. 28, illustrating an example of a cross-sectional structure during the manufacture of the semiconductor memory device.
Figure 31:
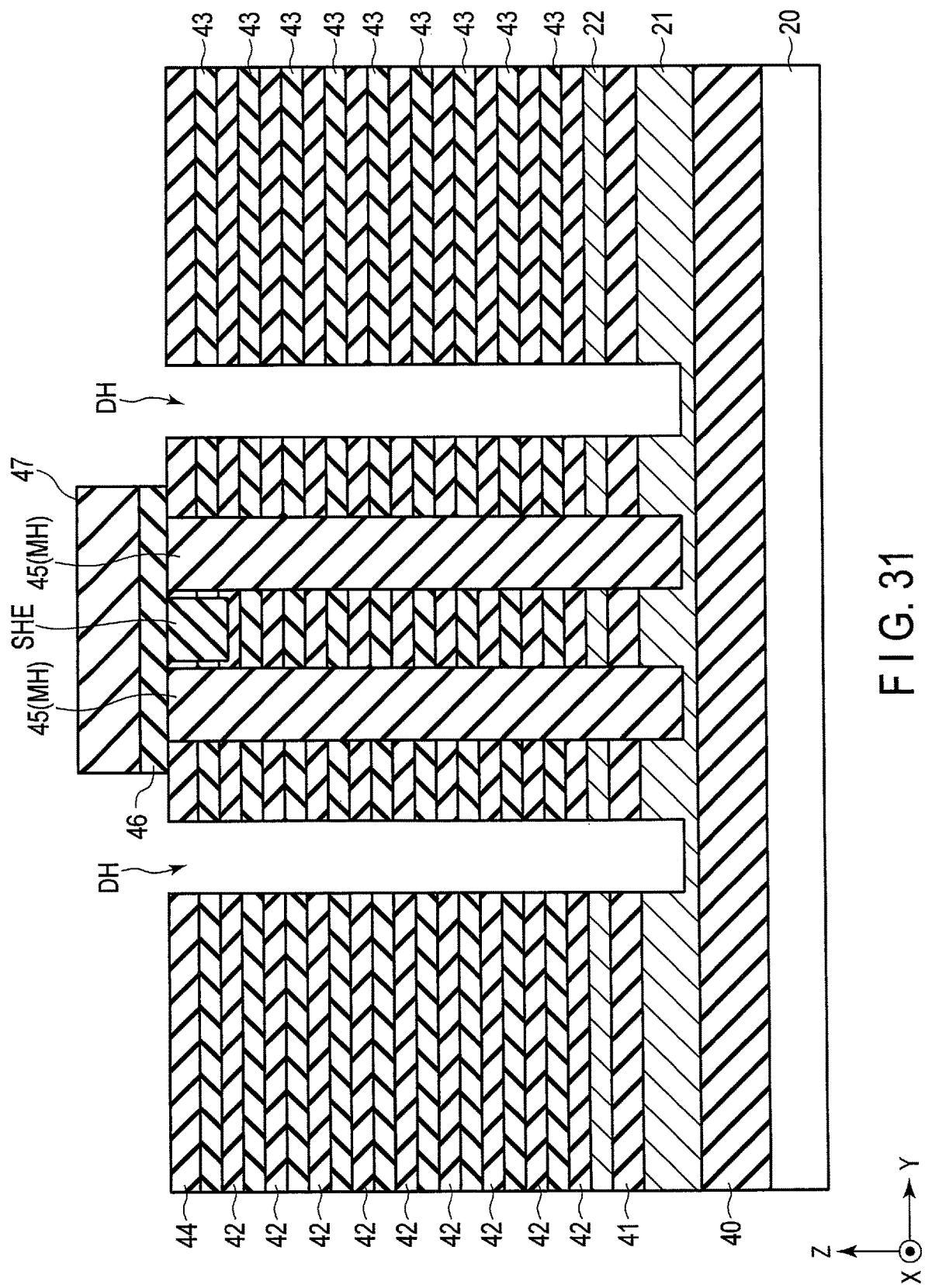
FIG. 31 is a cross-sectional view taken along line J-J in FIG. 28, illustrating an example of a cross-sectional structure during the manufacture of the semiconductor memory device.
Figure 32:
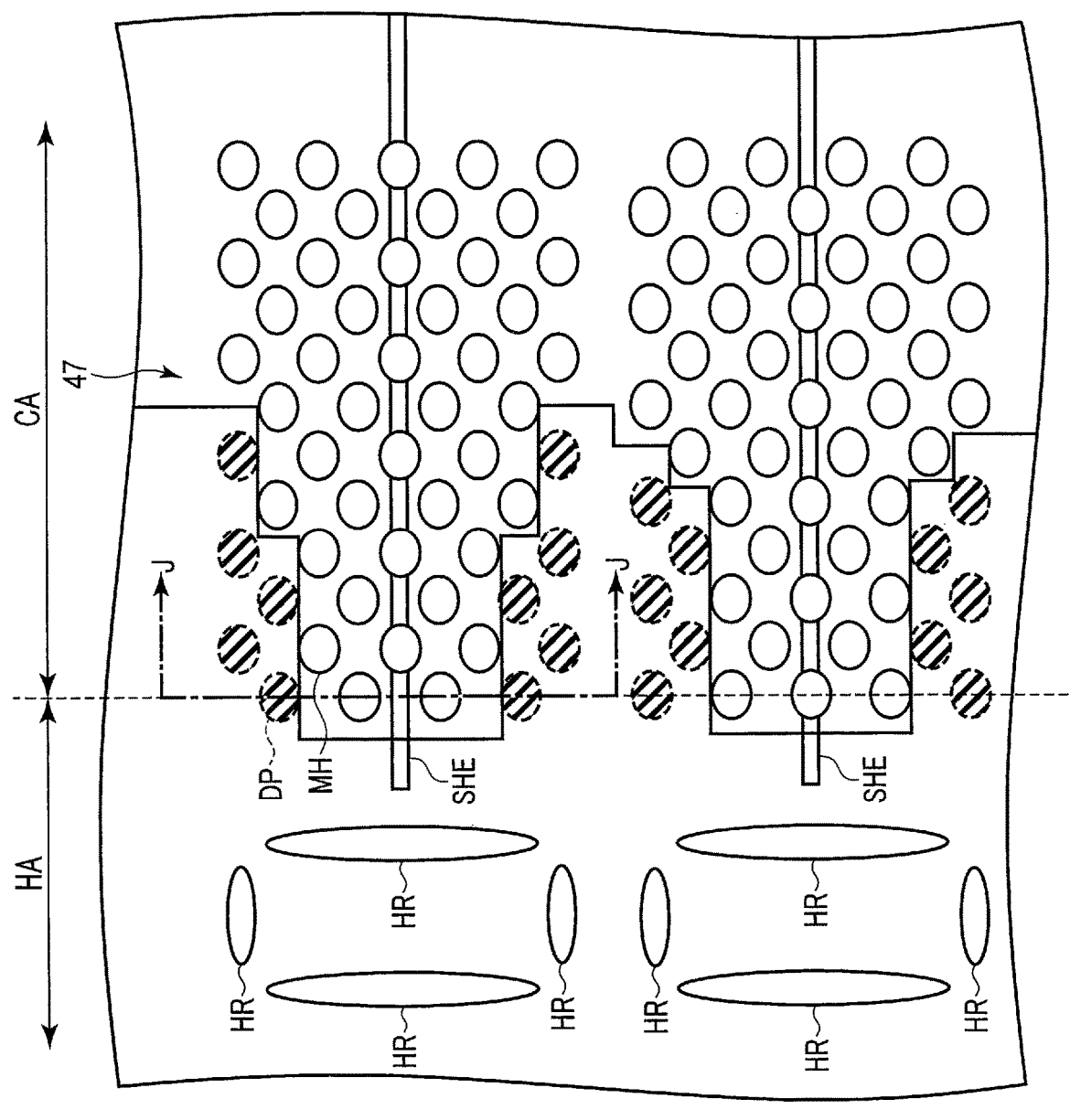
FIG. 32 illustrates an example of the planar layout during the manufacture of the semiconductor memory device according to the second embodiment.
Figure 33:
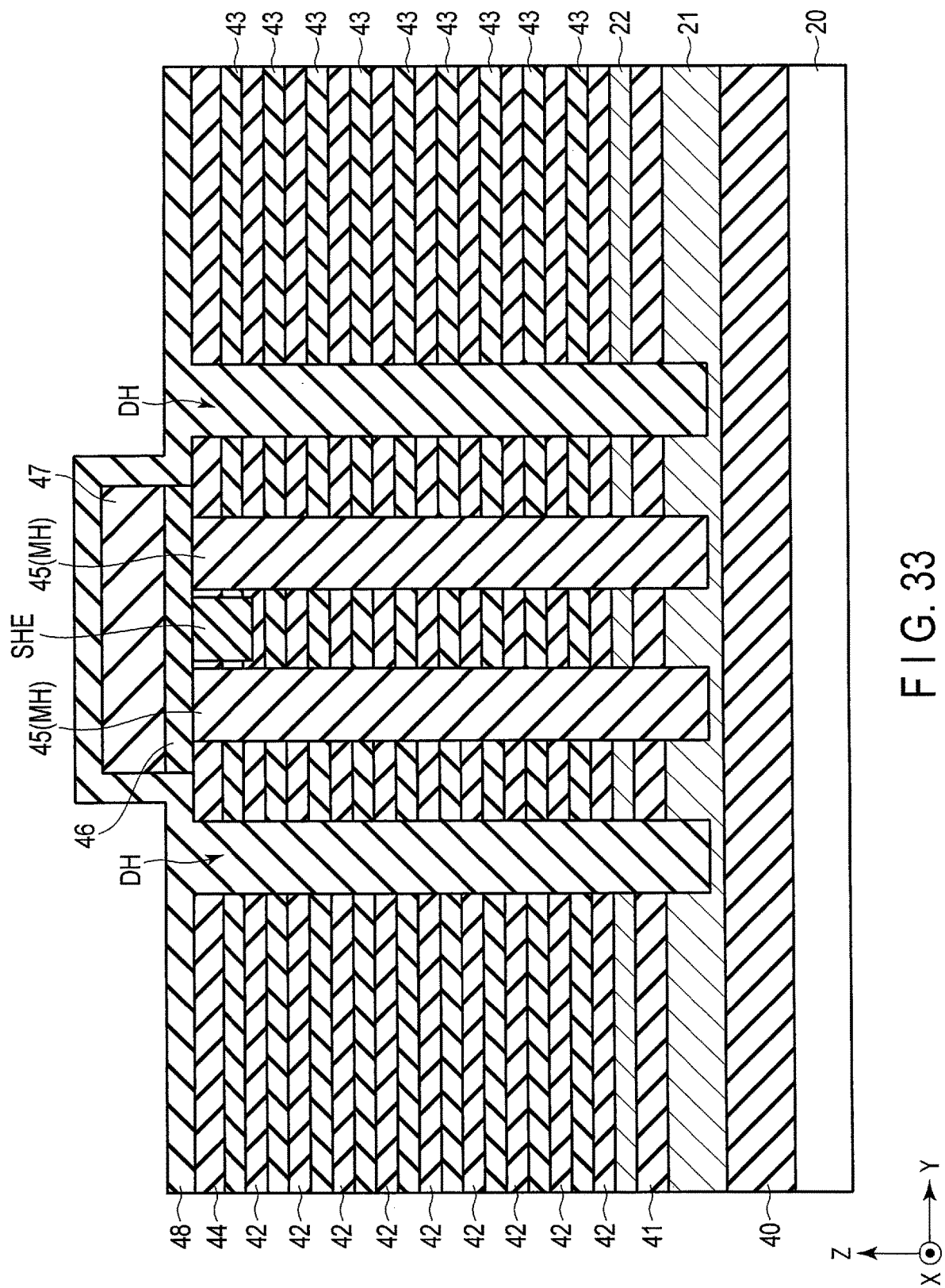
FIG. 33 is a cross-sectional view taken along line J-J in FIG. 32, illustrating an example of a cross-sectional structure during the manufacture of the semiconductor memory device.
Figure 34:
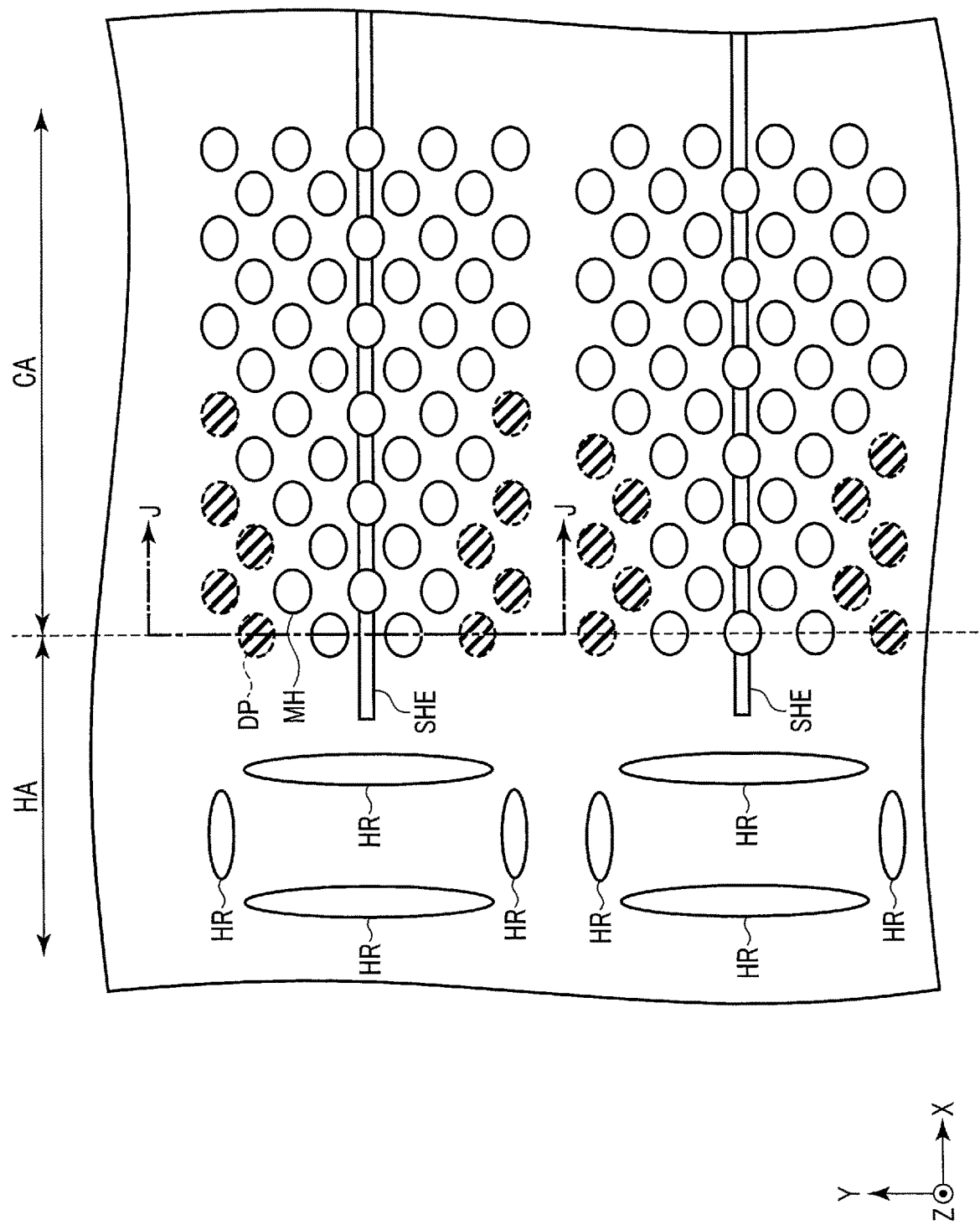
FIG. 34 illustrates an example of the planar layout during the manufacture of the semiconductor memory device according to the second embodiment.

Referring to FIG. 28 to FIG. 35, step S1005 is described. Each of FIG. 28, FIG. 32 and FIG. 34 illustrates an example of the planar layout during the manufacture of the semiconductor memory device 1 according to the second embodiment. Each of FIG. 29 to FIG. 31 is a cross-sectional view taken along line J-J in FIG. 28, illustrating an example of a cross-sectional structure during the manufacture of the semiconductor memory device 1. FIG. 33 is a cross-sectional view taken along line J-J in FIG. 32, illustrating an example of a cross-sectional structure during the manufacture of the semiconductor memory device 1. FIG. 35 is a cross-sectional view taken along line J-J in FIG. 34, illustrating an example of a cross-sectional structure during the manufacture of the semiconductor memory device 1. Note that in FIG. 28, the depiction of the insulating layer 46 is omitted for the purpose of easier understanding of the drawing. In FIG. 32, the depiction of an insulating layer 48, which is provided on the insulating layer 44 and a mask 47, is omitted for the purpose of easier understanding of the drawing.

Next, by a process of step S1005, protection pillars DP and support pillars HR are formed. Specifically, as illustrated in FIG. 28 and FIG. 29, to begin with, by photolithography or the like, a mask 47 with openings in areas in which the protection holes DH and support pillar holes HH are formed (in other words, areas in which memory holes MH are not formed) is formed.

Then, as illustrated in FIG. 30, by anisotropic etching using the formed mask 47, the insulating layer 46 is removed.

Subsequently, as illustrated in FIG. 31, for example, by wet etching, the sacrificial members 45 provided in the protection holes DH and support pillar holes HH are removed.

Further, as illustrated in FIG. 32 and FIG. 33, by CVD or the like, an insulating layer 48 is formed in the protection holes DH and support pillar holes HH and on the insulating layer 44 and mask 47.

Then, as illustrated in FIG. 34 and FIG. 35, for example, by CMP (Chemical Mechanical Polishing) or the like, the insulating layer 46, mask 47 and insulating layer 48, which are formed on the insulating layer 44, are removed. Thereby, the protection pillars DP and support pillars HR, which are configured such that the insulating layer 48 is buried in the protection holes DH and support pillar holes HH, are formed. The insulating member, which is buried in the protection holes DH and support pillar holes HH, includes, for example, silicon oxide ($SiO_2$). As the material which is buried in the protection holes DH and support pillar holes HH, use is made of a material which is different from the insulating film 34 and semiconductor layer 31 which are used in the memory pillar MP.

[S1006]

Figure 36:
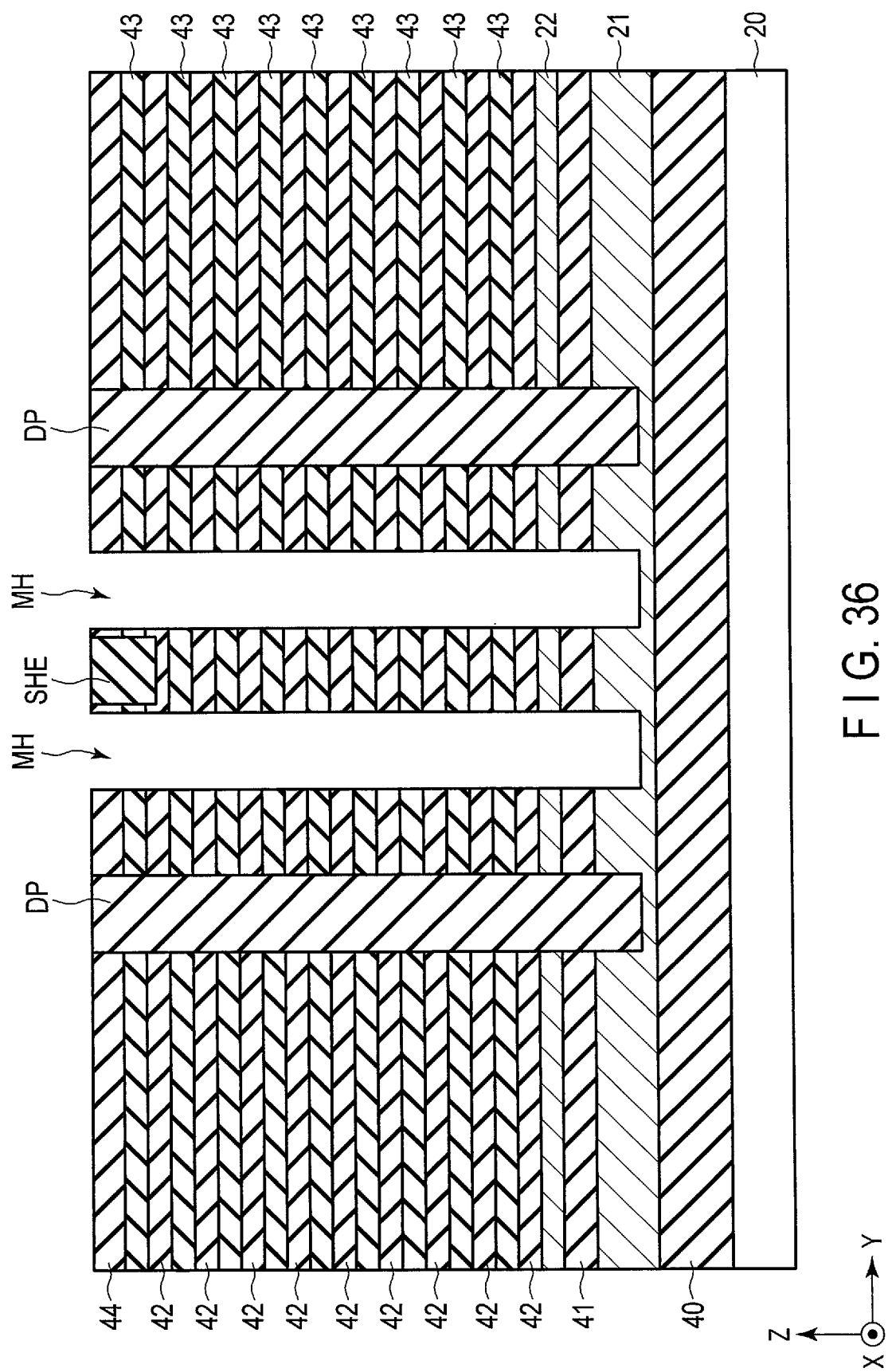
FIG. 36 is a cross-sectional view taken along line J-J in FIG. 34, illustrating an example of a cross-sectional structure during the manufacture of the semiconductor memory device.
Figure 37:
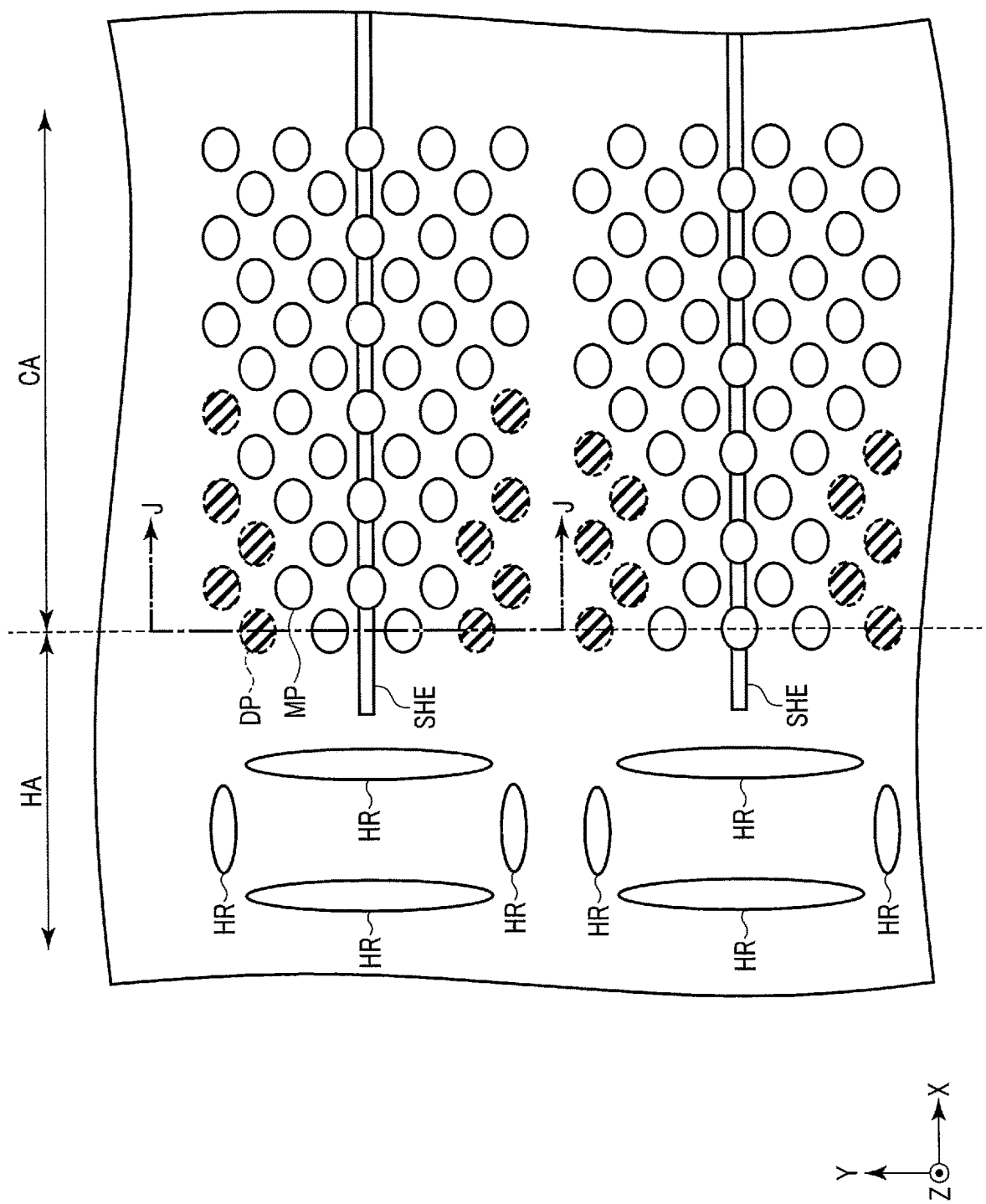
FIG. 37 illustrates an example of the planar layout during the manufacture of the semiconductor memory device according to the second embodiment.
Figure 38:
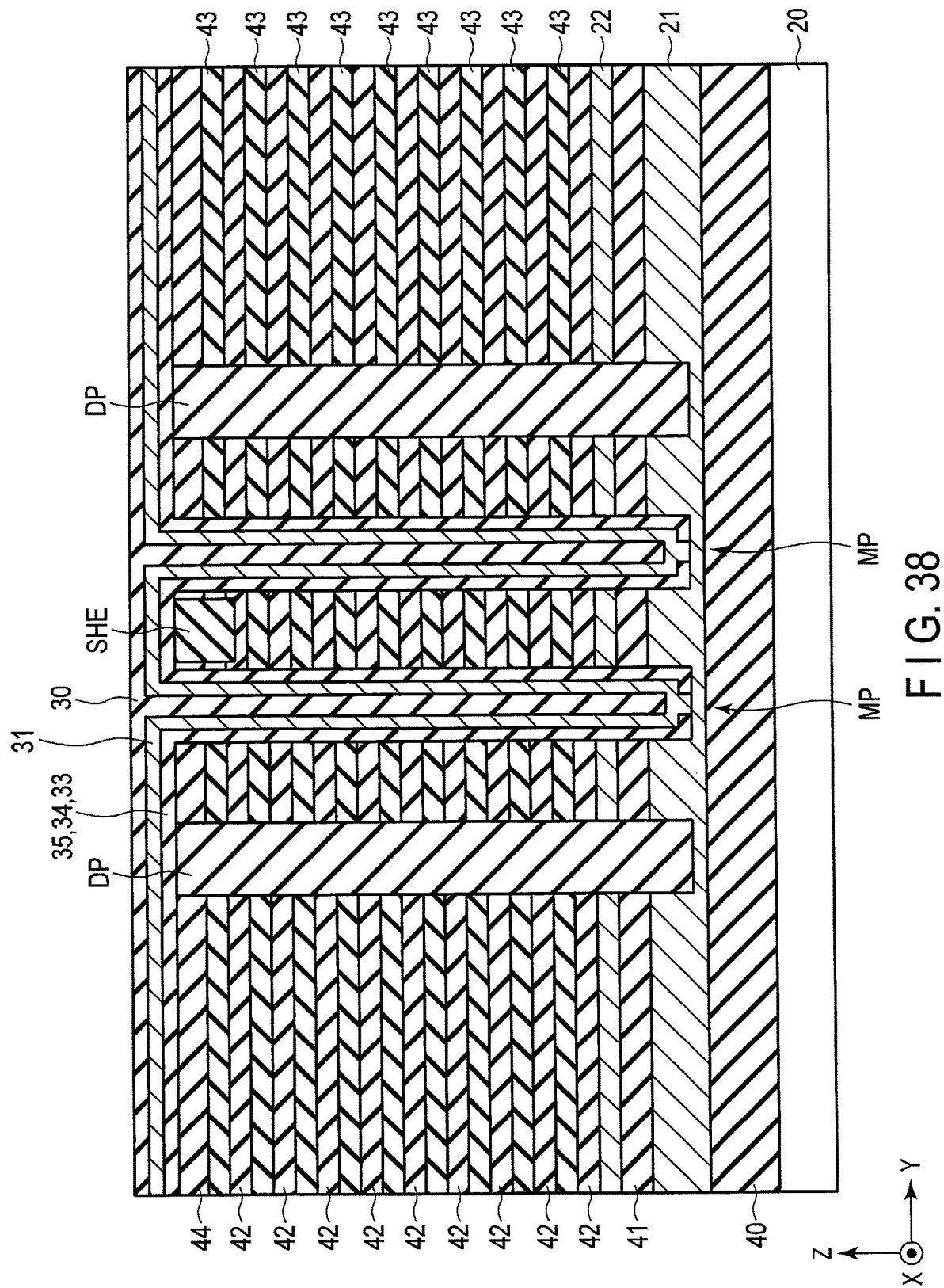
FIG. 38 is a cross-sectional view taken along line J-J in FIG. 37, illustrating an example of a cross-sectional structure during the manufacture of the semiconductor memory device.
Figure 39:
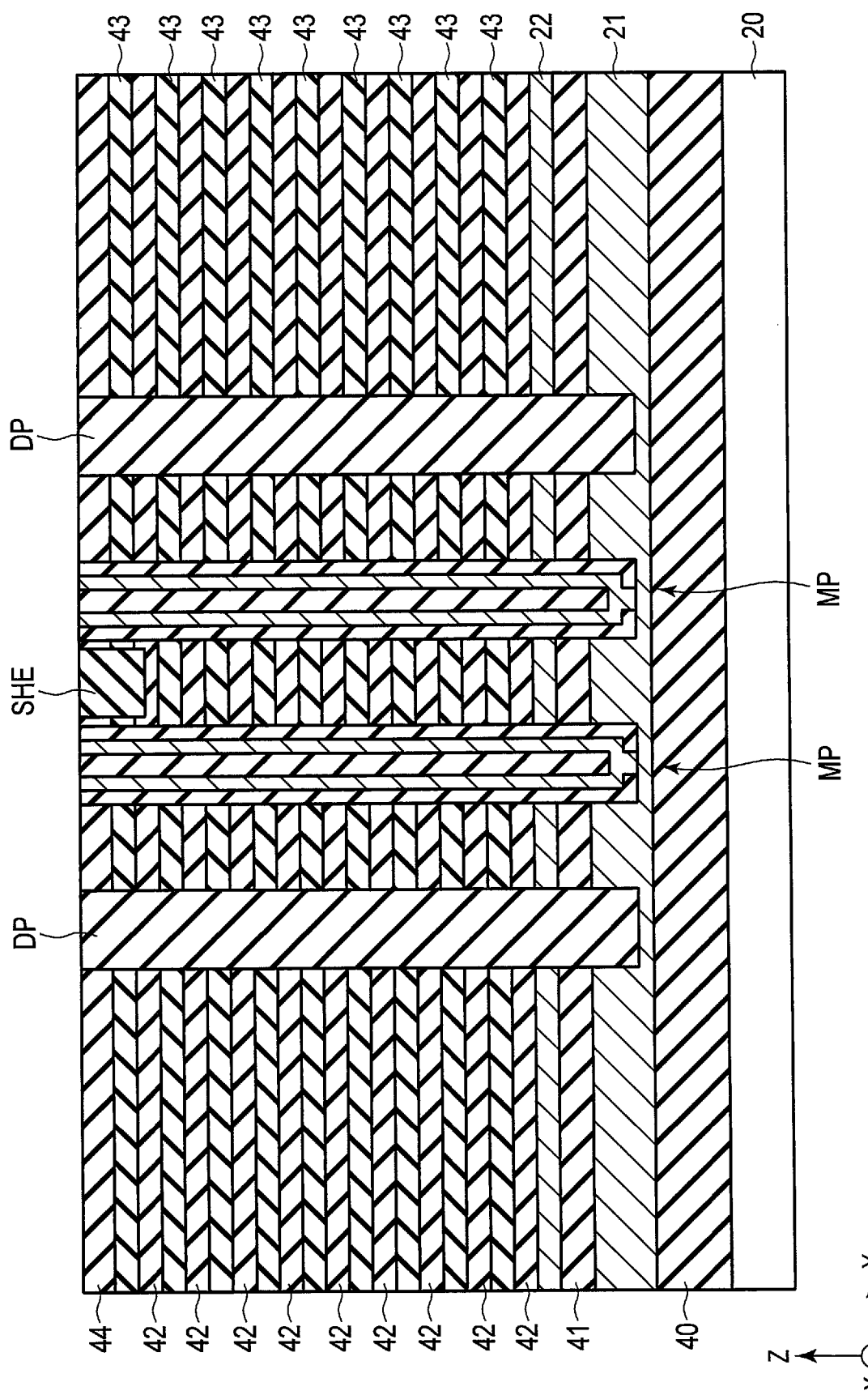
FIG. 39 is a cross-sectional view taken along line J-J in FIG. 37, illustrating an example of a cross-sectional structure during the manufacture of the semiconductor memory device.
Figure 40:
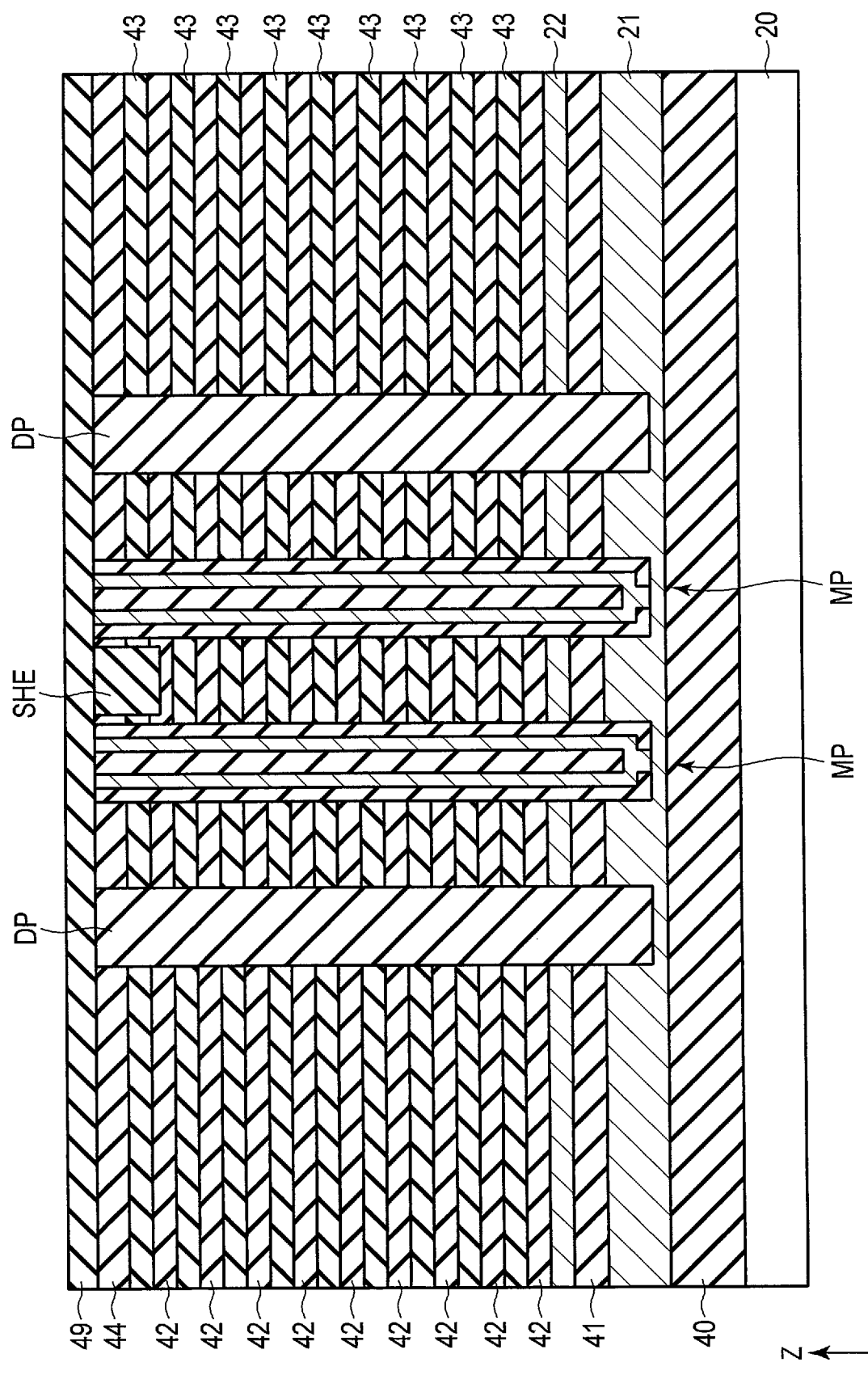
FIG. 40 is a cross-sectional view taken along line J-J in FIG. 37, illustrating an example of a cross-sectional structure during the manufacture of the semiconductor memory device.

Referring to FIG. 34, and FIG. 36 to FIG. 40, step S1006 is described. FIG. 36 is a cross-sectional view taken along line J-J in FIG. 34, illustrating an example of a cross-sectional structure during the manufacture of the semiconductor memory device 1. FIG. 37 illustrates an example of the planar layout during the manufacture of the semiconductor memory device 1 according to the second embodiment. Each of FIG. 38 to FIG. 40 is a cross-sectional view taken along line J-J in FIG. 37, illustrating an example of a cross-sectional structure during the manufacture of the semiconductor memory device 1. In FIG. 37, for the purpose of easier understanding of the drawing, the depiction of the block insulation film 35, insulating film 34, tunnel insulation film 33, semiconductor layer 31 and core member 30, which are provided on the insulating film 44, is omitted.

Next, by a process of step S1006, memory pillars MP are formed in the memory holes MH. Specifically, as illustrated in FIG. 34 and FIG. 36, for example, by wet etching, the sacrificial members 45 in the memory holes MH are removed. Thus, memory holes MH, which are opened in shapes of the memory pillars MP, are formed.

Subsequently, as illustrated in FIG. 37 and FIG. 38, by CVD or the like, a block insulation film 35, an insulating film 34 and a tunnel insulation film 33 are successively formed on a side surface and a bottom surface of the memory hole MH and on a top surface of the insulating layer 44. Then, by CVD or the like, a semiconductor layer 31 and a core member 30 are successively formed, and the core member 30 is buried in the memory hole MH.

As illustrated in FIG. 39, the block insulation film 35, insulating film 34, tunnel insulation film 33, semiconductor layer 31 and core member 30, which are left in layers above the insulating layer 44 in the present step, are removed by, for example, CMP. Thereby, a structure body corresponding to the memory pillar MP is formed in the memory hole MH.

As illustrated in FIG. 40, after the memory pillar MP is formed, for example, an insulating layer 49 is formed by CVD or the like on top surfaces of the memory pillars MP and on the insulating layer 44. The insulating layer 49 includes, for example, silicon oxide.

[S1007]

Figure 41:
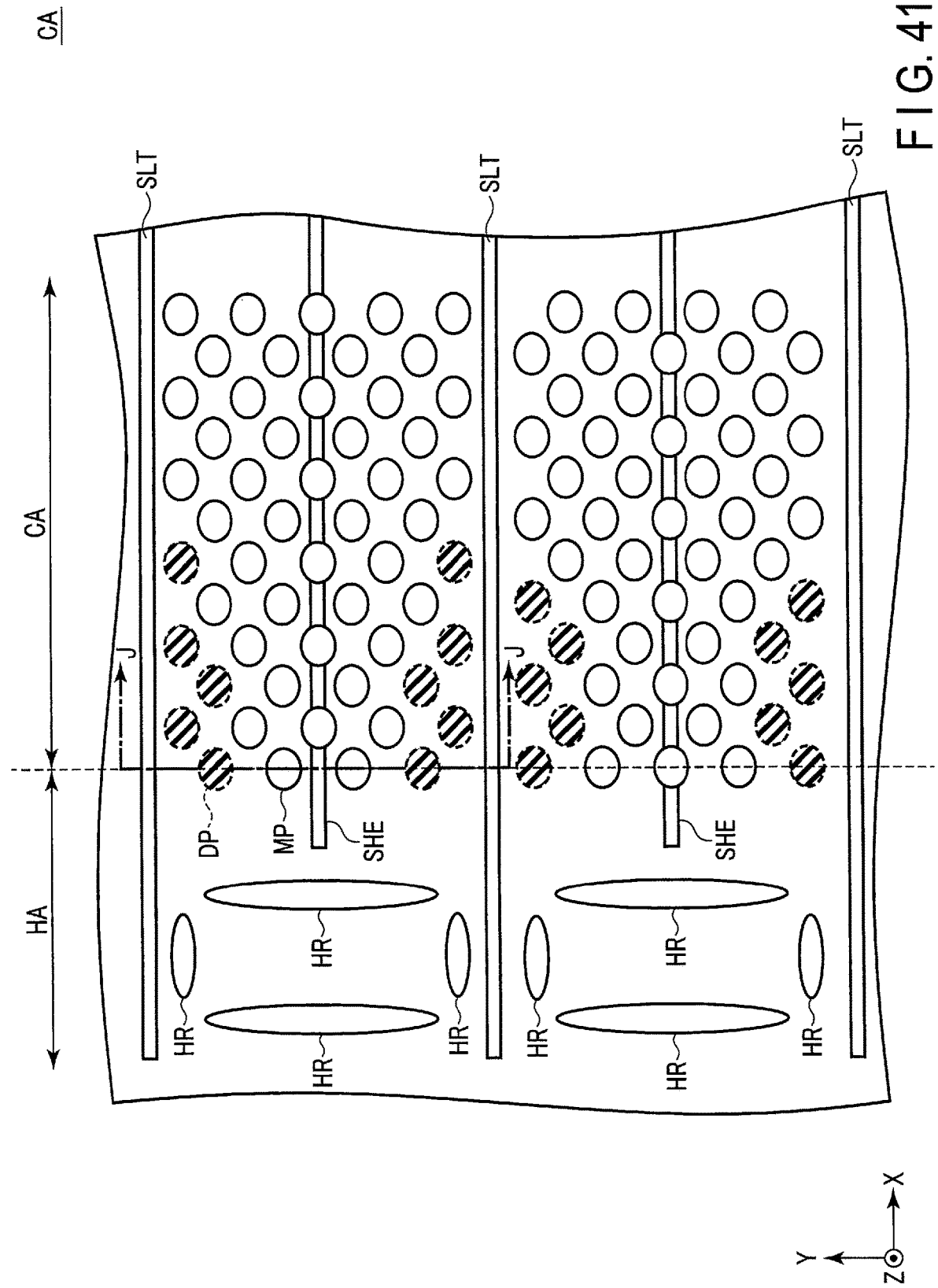
FIG. 41 illustrates an example of the planar layout during the manufacture of the semiconductor memory device according to the second embodiment.
Figure 42:
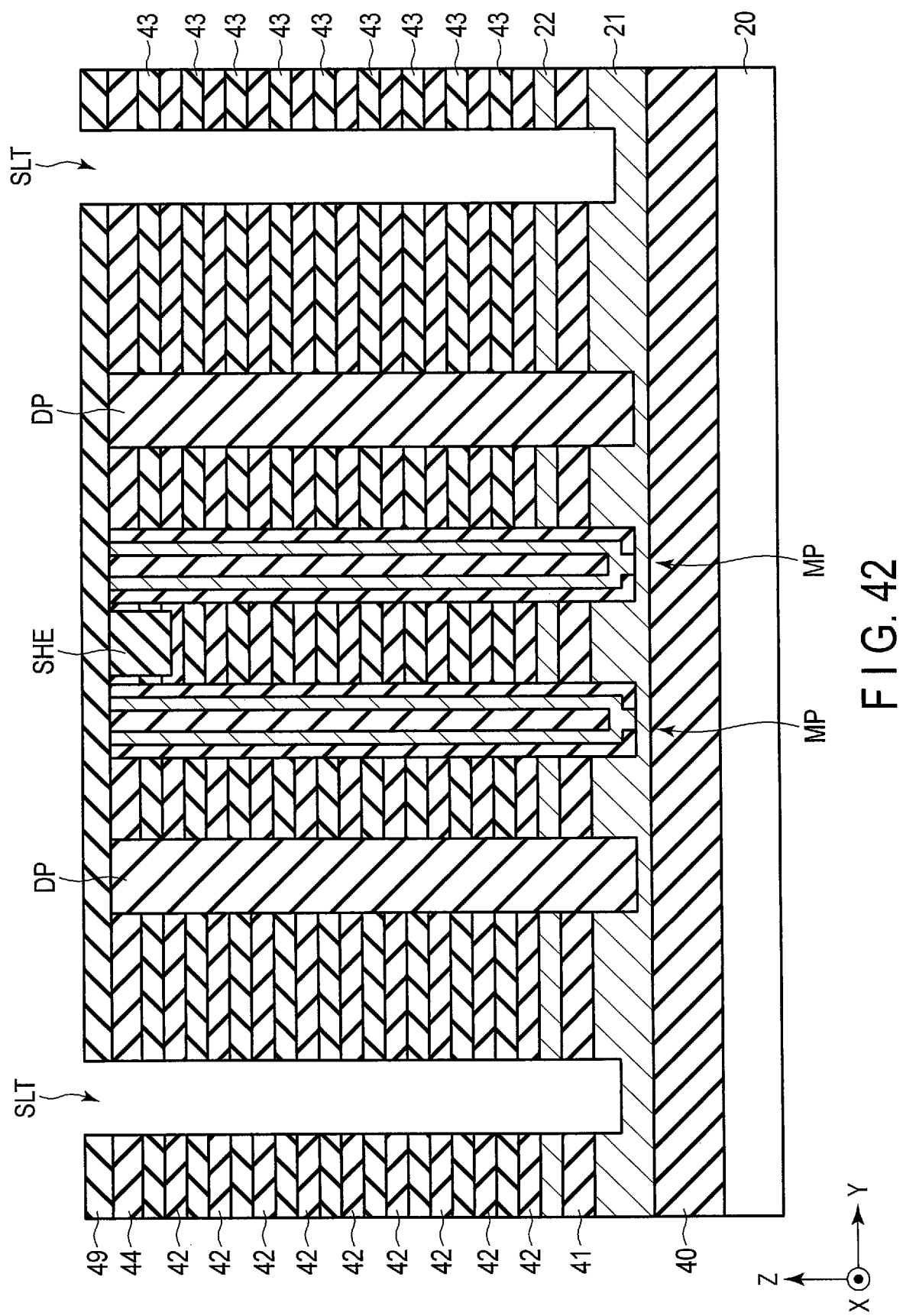
FIG. 42 is a cross-sectional view taken along line J-J in FIG. 41, illustrating an example of a cross-sectional structure during the manufacture of the semiconductor memory device.

Referring to FIG. 41 and FIG. 42, step S1007 is described. FIG. 41 illustrates an example of the planar layout during the manufacture of the semiconductor memory device 1 according to the second embodiment. FIG. 42 is a cross-sectional view taken along line J-J in FIG. 41, illustrating an example of a cross-sectional structure during the manufacture of the semiconductor memory device 1. In FIG. 41, the depiction of the insulating layer 49 provided on the insulating layer 44 is omitted for the purpose of easier understanding of the drawing.

Next, by a process of step S1007, slits SLT are formed. Specifically, to begin with, by photolithography or the like, a mask with openings in areas corresponding to the slits SLT is formed. Then, by anisotropic etching using the formed mask, the slits SLT illustrated in FIG. 41 and FIG. 42 are formed.

The slit SLT formed in this step divides the insulating layers 41, 42, 44 and 49 and the sacrificial members 43. A bottom part of the slit SLT stops, for example, in a layer in which the conductive layer 21 is provided. In the present example, the bottom part of the slit SLT reaches at least a layer in which the insulating layer 41 is formed. The anisotropic etching in this step is, for example, RIE.

[S1008]

Referring to FIG. 41, and FIG. 43 to FIG. 46, step S1008 is described. Each of FIG. 43 to FIG. 46 is a cross-sectional view taken along line J-J in FIG. 41, illustrating an example of a cross-sectional structure during the manufacture of the semiconductor memory device 1.

Figure 43:
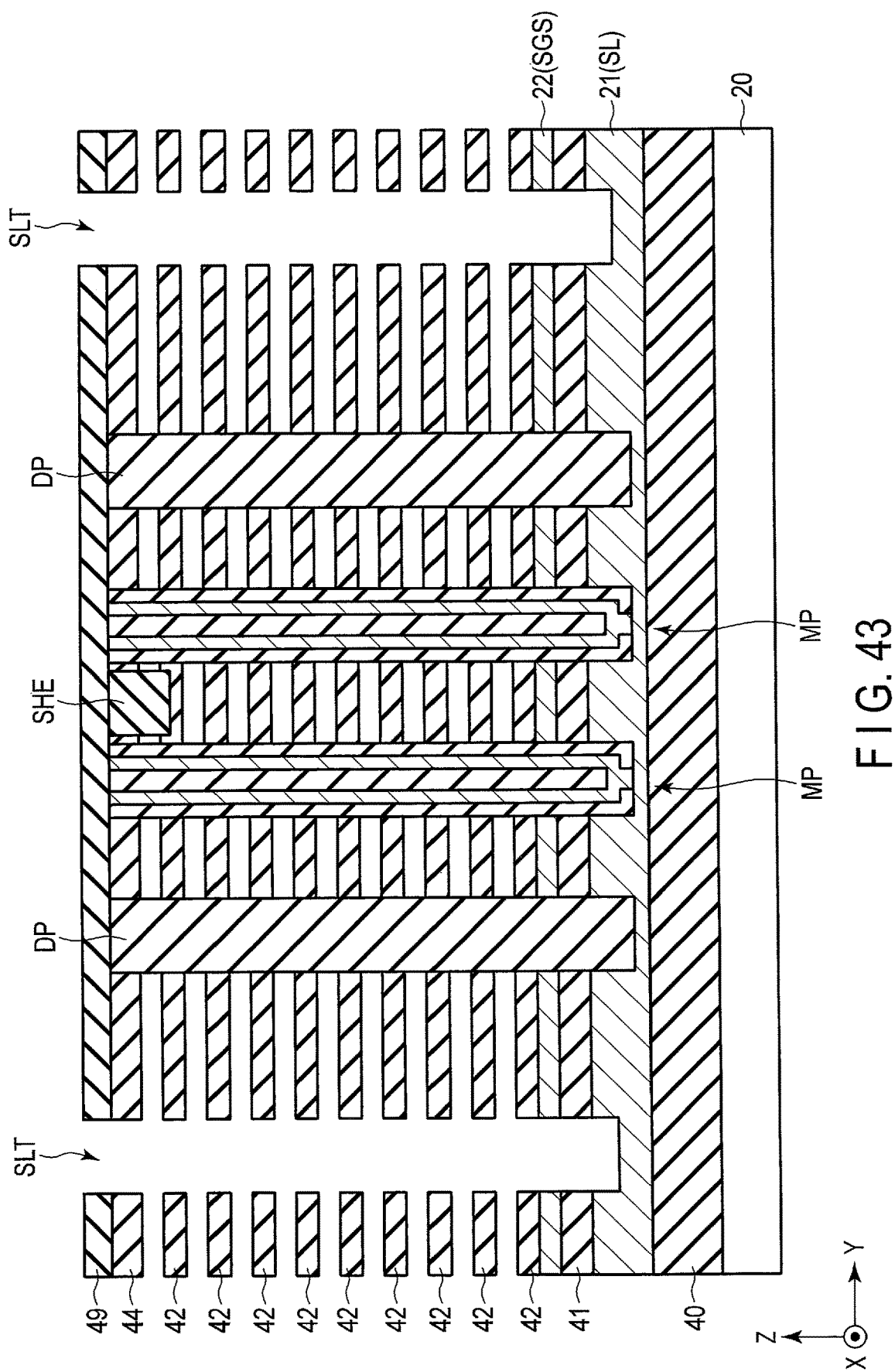
FIG. 43 is a cross-sectional view taken along line J-J in FIG. 41, illustrating an example of a cross-sectional structure during the manufacture of the semiconductor memory device.

Next, by a process of step S1008, a replacement process of stacked interconnects is executed. Specifically, to begin with, for example, by wet etching using hot phosphoric acid, the sacrificial members 43 are selectively removed as illustrated in FIG. 41 and FIG. 43. A structure body, from which the sacrificial members 43 are removed, has its three-dimensional structure maintained by the memory pillars MP, protection pillars DP, support pillars HR and the like.

Figure 44:
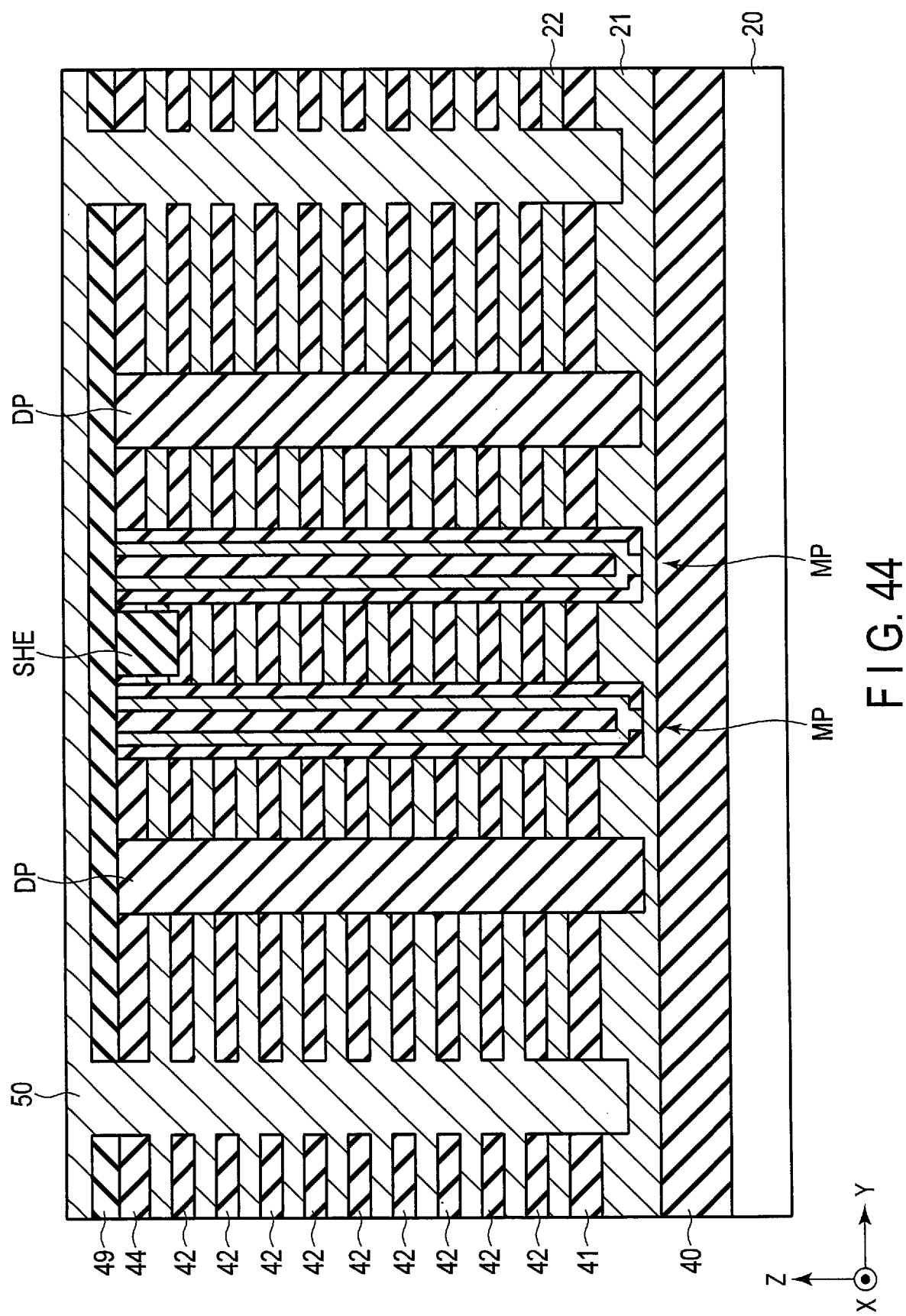
FIG. 44 is a cross-sectional view taken along line J-J in FIG. 41, illustrating an example of a cross-sectional structure during the manufacture of the semiconductor memory device.

Subsequently, as illustrated in FIG. 44, a conductor is buried, via the slits SLT, in the space from which the sacrificial members 43 are removed. In the formation of the conductor in this step, for example, CVD is used.

Figure 45:
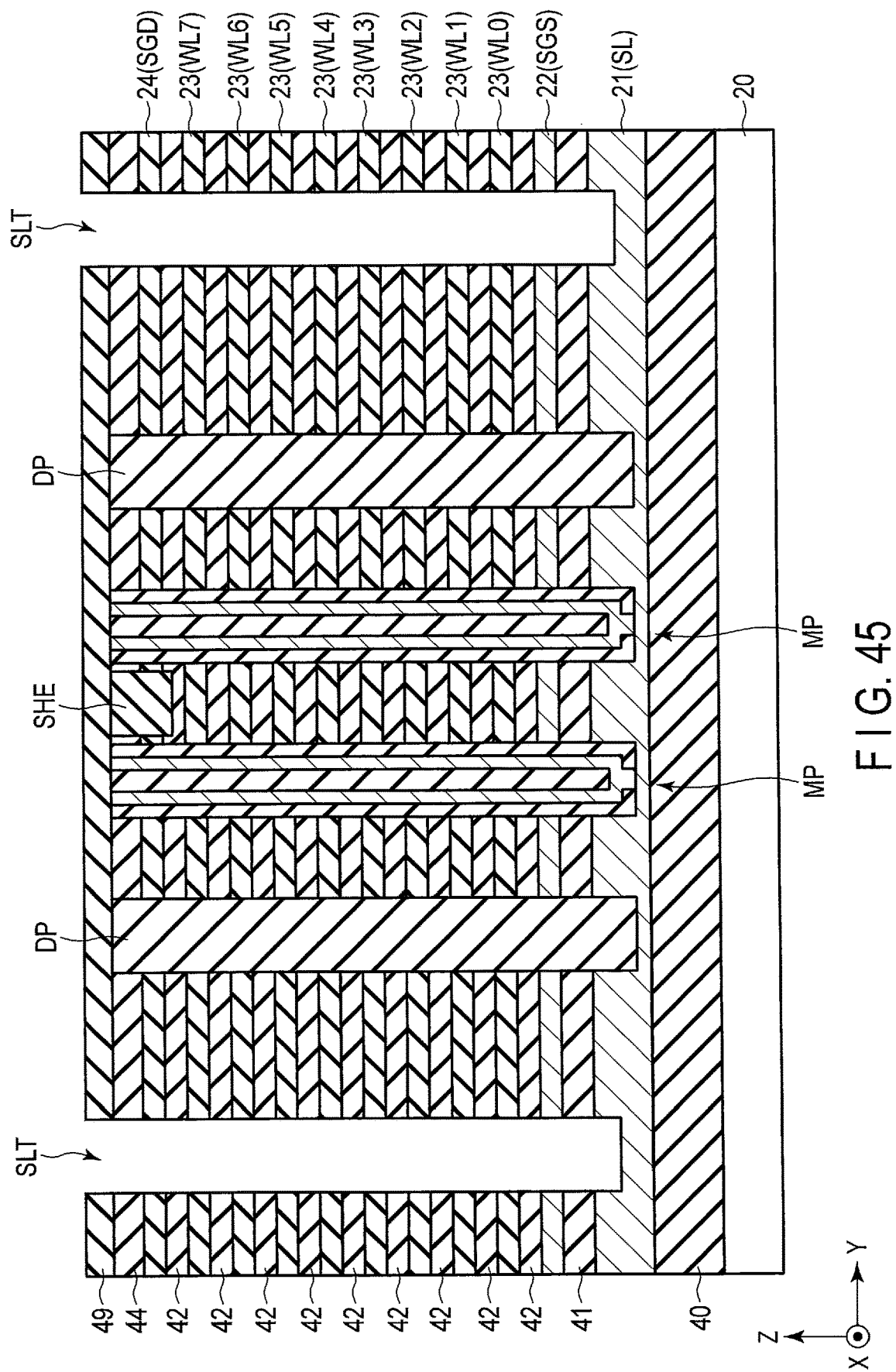
FIG. 45 is a cross-sectional view taken along line J-J in FIG. 41, illustrating an example of a cross-sectional structure during the manufacture of the semiconductor memory device.

Thereafter, as illustrated in FIG. 45, by an etch-back process, the conductor formed in the slits SLT and on the top surface of the insulating layer 49 is removed. In the present step, conductors formed in mutually neighboring interconnect layers are isolated at least in the slits SLT.

Thereby, conductive layers 23 corresponding to the word lines WL0 to WL7 and a conductive layer 24 corresponding to the select gate line SGD are formed. The conductive layers 23 and 24 formed in the present step may include barrier metals. In this case, in the formation of the conductor after the removal of the sacrificial member 43, for example, a film of titanium nitride is formed as a barrier metal, and then tungsten is formed.

Figure 46:
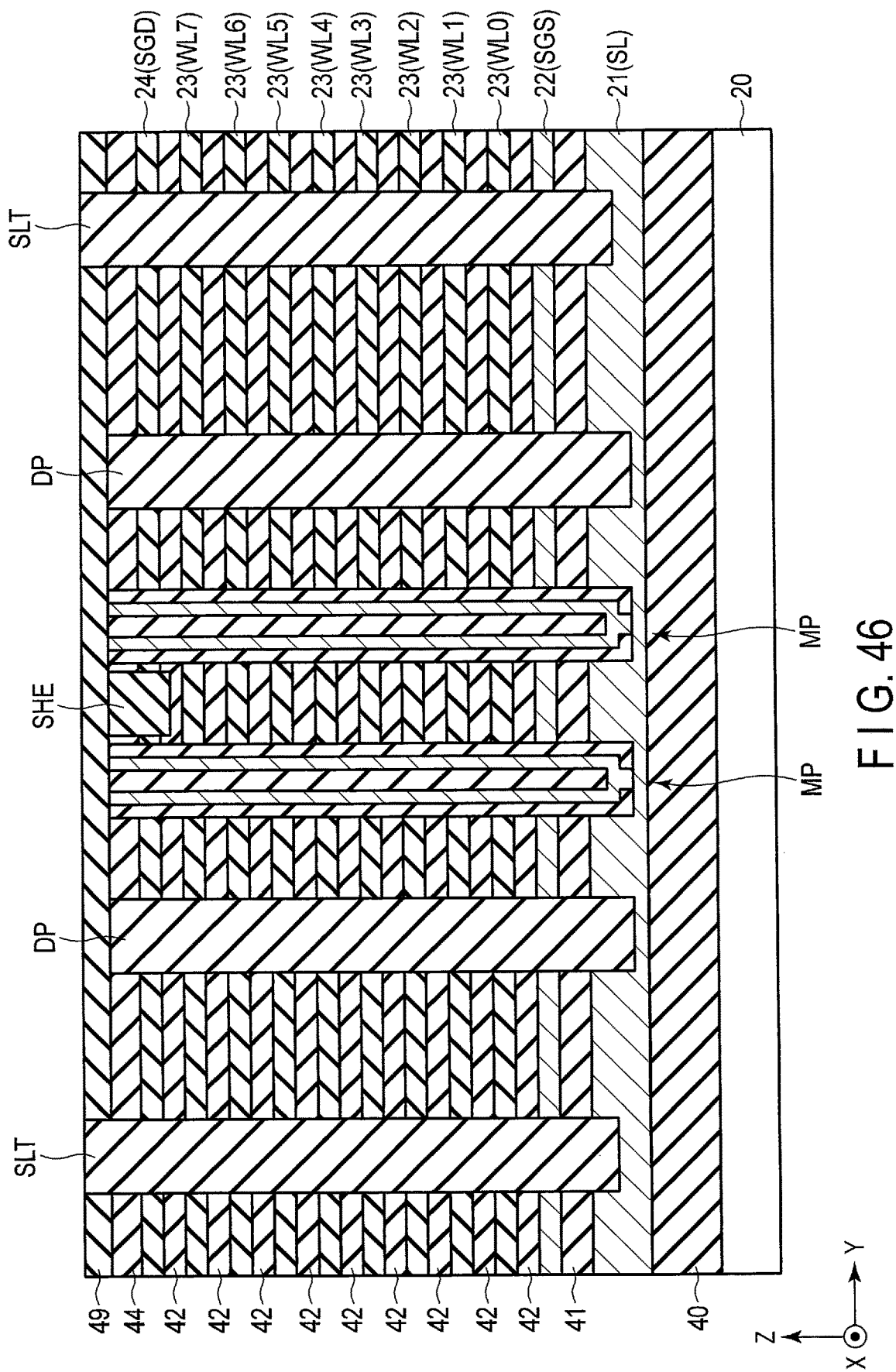
FIG. 46 is a cross-sectional view taken along line J-J in FIG. 41, illustrating an example of a cross-sectional structure during the manufacture of the semiconductor memory device.

As illustrated in FIG. 46, after stacked interconnects are formed, an insulator is buried in the slits SLT used in this step.

By the above-described fabrication steps of the semiconductor memory device 1 according to the second embodiment, the memory pillars MP, the source line SL connected to the memory pillars MP, the word lines WL, and the select gate lines SGD and SGS are formed. The above-described fabrication steps are merely examples, and other processes may be inserted between the fabrication steps.

<2-2-2> Second Example

Hereinafter, referring to FIG. 47 to FIG. 56 as needed, a description is given of an example of serial fabrication steps relating to the formation of a stacked interconnect structure in the memory cell array 10 in the semiconductor memory device 1 according to the second embodiment. FIG. 47 is a flowchart illustrating a second example of the manufacturing method of the semiconductor memory device 1 according to the second embodiment. Each of FIG. 48 to FIG. 56 illustrates an example of a planar layout or a cross-sectional structure during the manufacture of the semiconductor memory device 1 according to the second embodiment. In the description below of the manufacturing method, plan views which are to be referred to correspond to the area illustrated in FIG. 16.

[S2001] to [S2003]

Steps S2001 to S2003 are the same as the above-described steps S1001 to S1003, and a description thereof is omitted.

[S2004]

Figure 48:
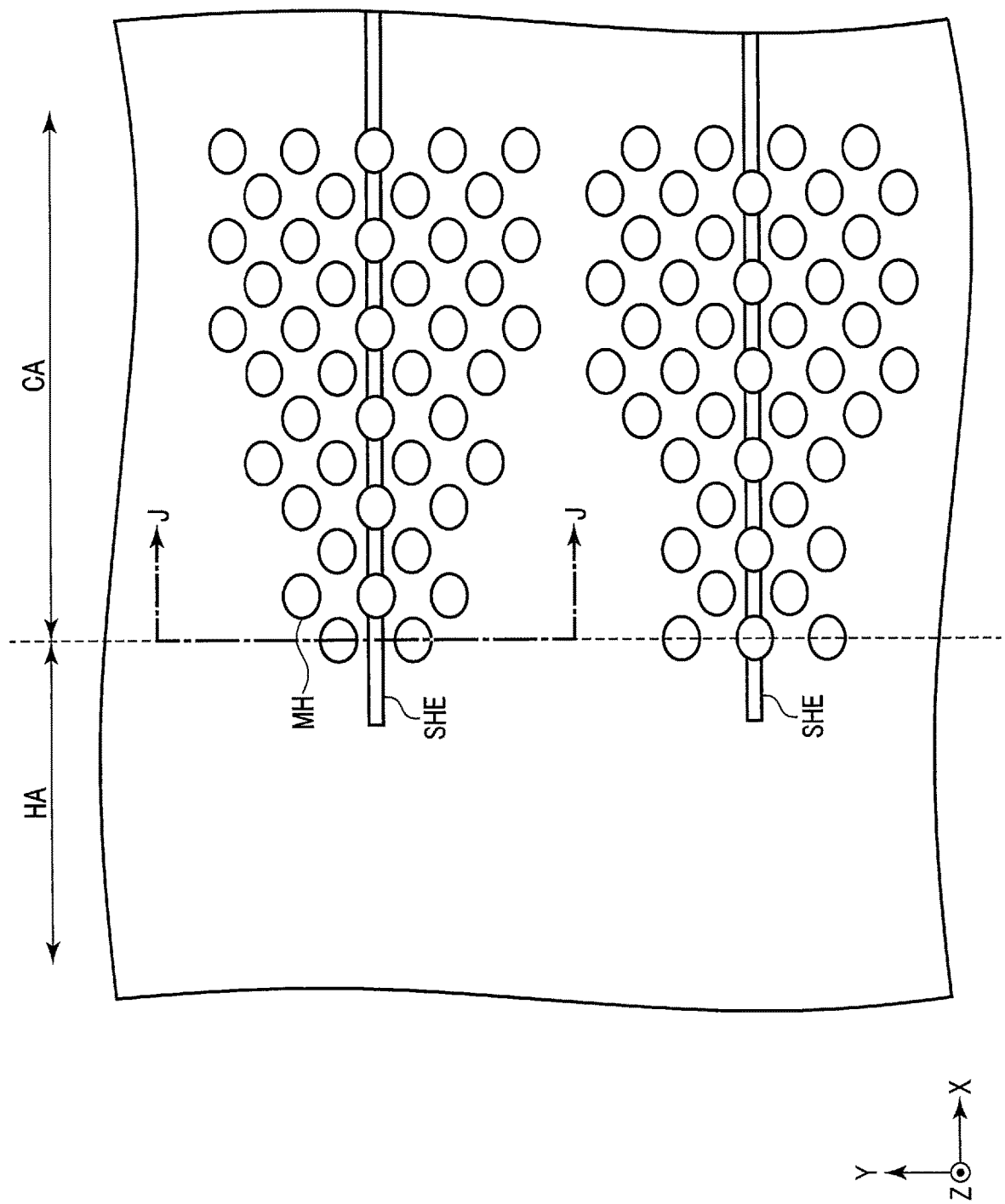
FIG. 48 illustrates an example of the planar layout during the manufacture of the semiconductor memory device according to the second embodiment.
Figure 49:
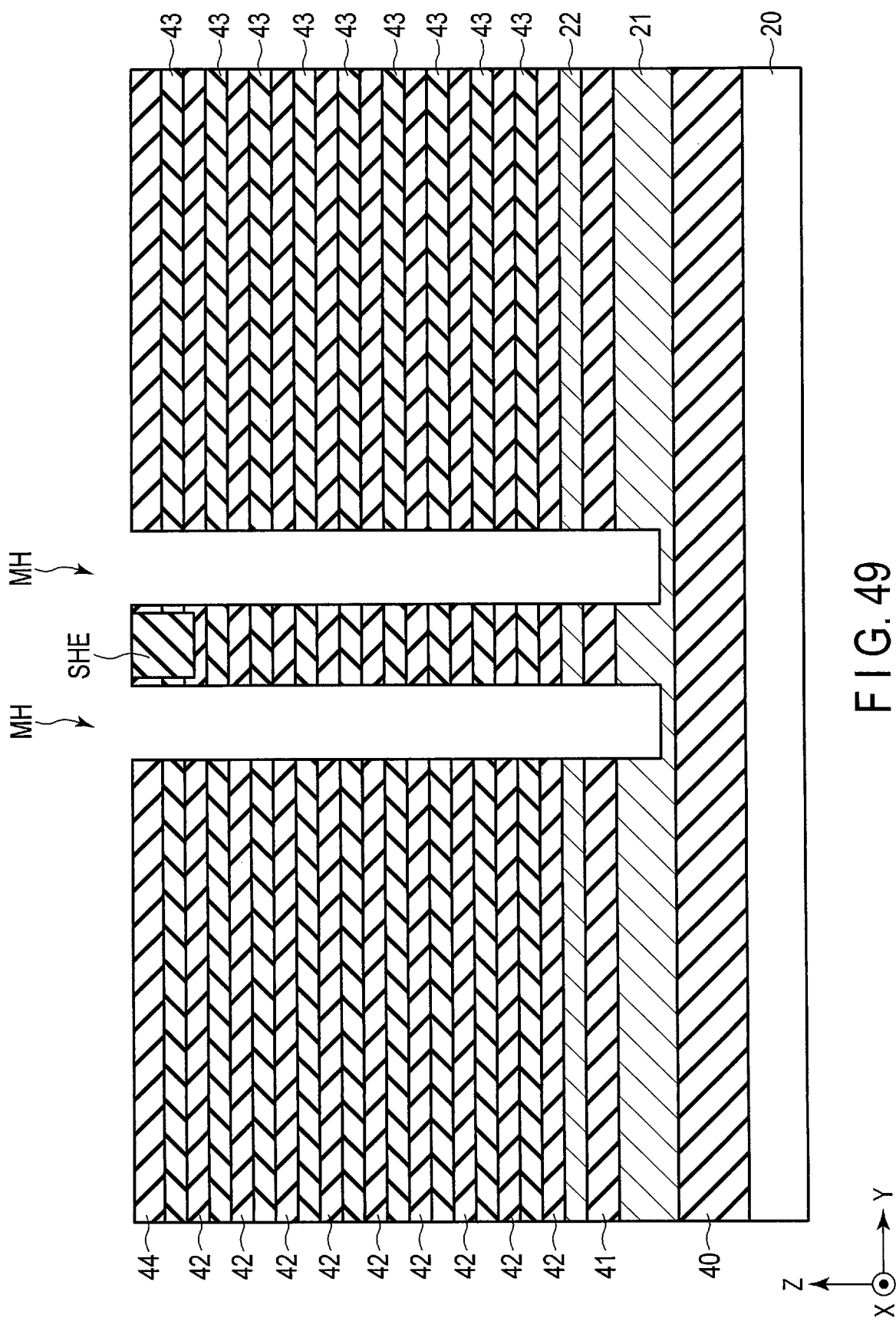
FIG. 49 is a cross-sectional view taken along line J-J in FIG. 48, illustrating an example of a cross-sectional structure during the manufacture of the semiconductor memory device.

Referring to FIG. 48 and FIG. 49, step S2004 is described. FIG. 48 illustrates an example of the planar layout during the manufacture of the semiconductor memory device 1 according to the second embodiment. FIG. 49 is a cross-sectional view taken along line J-J in FIG. 48, illustrating an example of a cross-sectional structure during the manufacture of the semiconductor memory device 1.

By a process of step S2004, memory holes MH, which are opened in shapes of memory pillars MP, are formed as illustrated in FIG. 48 and FIG. 49. Specifically, to begin with, by photolithography or the like, a mask with openings in areas corresponding to the memory holes MH are formed. Then, by anisotropic etching using the formed mask, the memory holes MH are formed.

[S2005]

Figure 51:
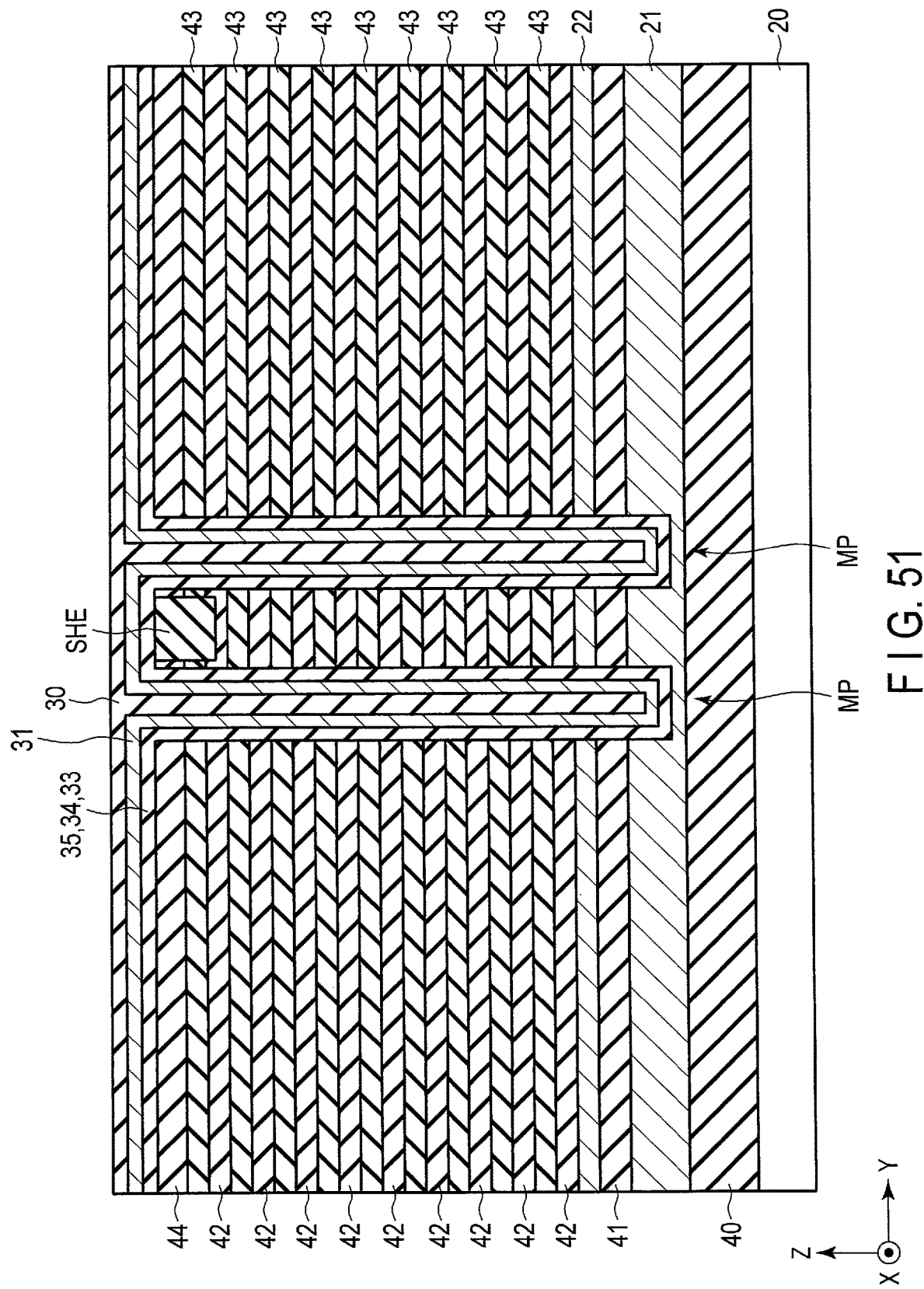
FIG. 51 is a cross-sectional view taken along line J-J in FIG. 50, illustrating an example of a cross-sectional structure during the manufacture of the semiconductor memory device.

Referring to FIG. 50 to FIG. 52, step S2005 is described. FIG. 50 illustrates an example of the planar layout during the manufacture of the semiconductor memory device 1 according to the second embodiment. Each of FIG. 51 and FIG. 52 is a cross-sectional view taken along line J-J in FIG. 50, illustrating an example of a cross-sectional structure during the manufacture of the semiconductor memory device 1. In FIG. 50, for the purpose of easier understanding of the drawing, the depiction of the block insulation film 35, insulating film 34, tunnel insulation film 33, semiconductor layer 31 and core member 30, which are provided on the insulating film 44, is omitted.

Next, by a process of step S2005, memory pillars MP are formed in the memory holes MH. Specifically, as illustrated in FIG. 50 and FIG. 51, the block insulation film 35, insulating film 34 and tunnel insulation film 33 are successively formed on the side surface and bottom surface of the memory hole MH and on the top surface of the insulating layer 44.

Subsequently, the semiconductor layer 31 and core member 30 are successively formed, and the core member 30 is buried in the memory hole MH.

As illustrated in FIG. 52, the block insulation film 35, insulating film 34, tunnel insulation film 33, semiconductor layer 31 and core member 30, which are left in layers above the insulating layer 44 in the present step, are removed by, for example, CMP. Thereby, a structure body corresponding to the memory pillar MP is formed in the memory hole MH.

[S2006]

Figure 53:
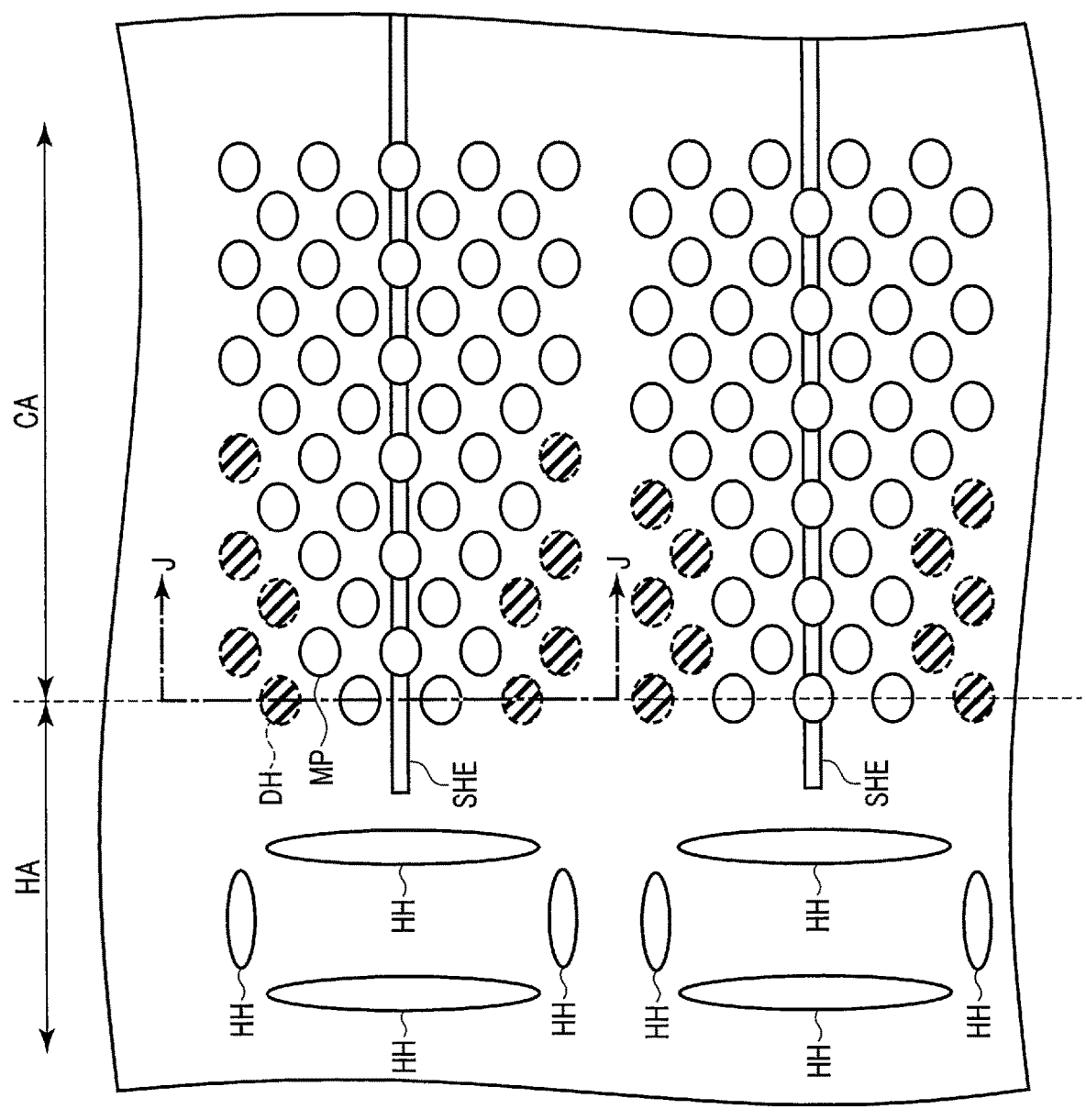
FIG. 53 illustrates an example of the planar layout during the manufacture of the semiconductor memory device according to the second embodiment.
Figure 54:
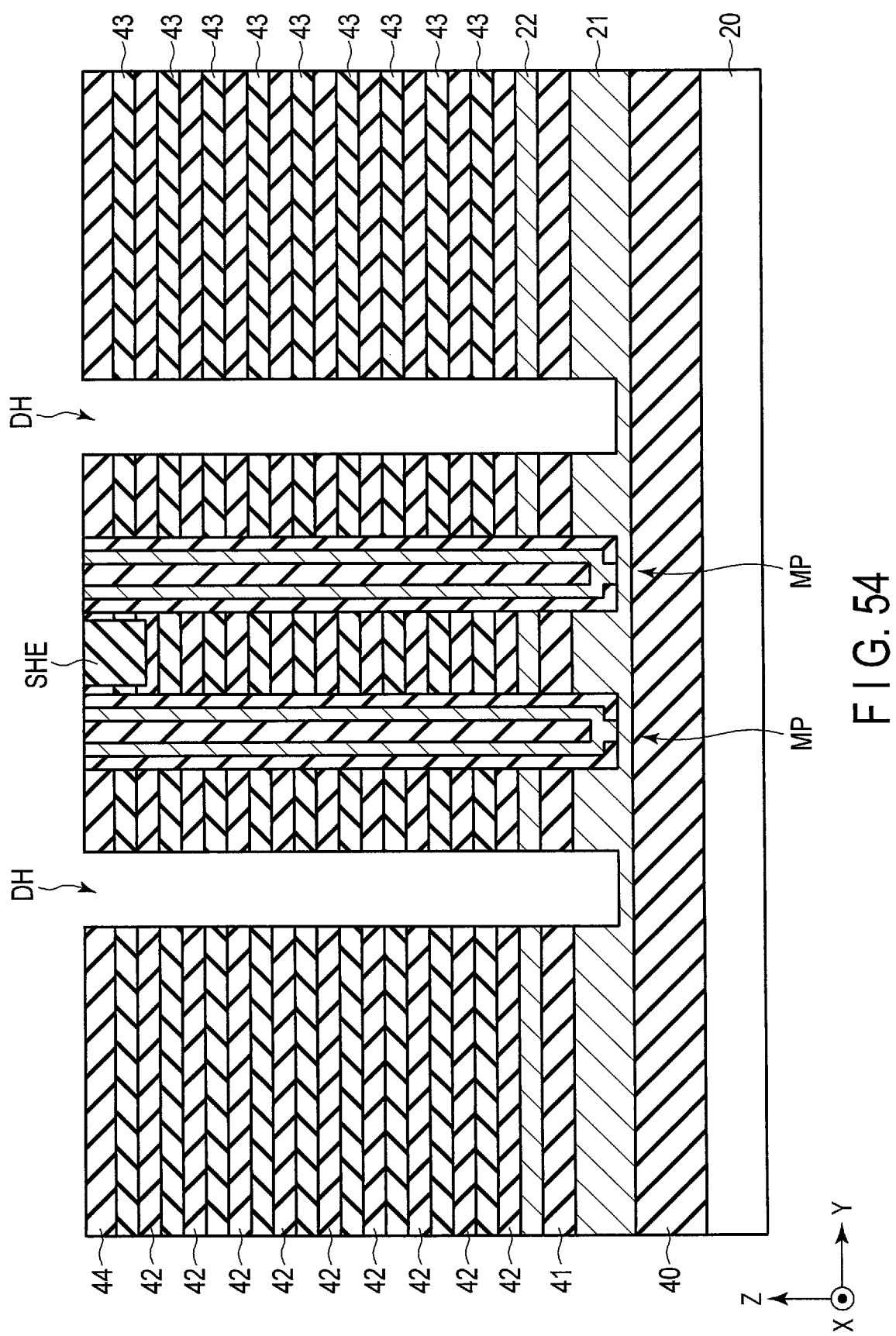
FIG. 54 is a cross-sectional view taken along line J-J in FIG. 53, illustrating an example of a cross-sectional structure during the manufacture of the semiconductor memory device.

Referring to FIG. 53 and FIG. 54, step S2006 is described. FIG. 53 illustrates an example of the planar layout during the manufacture of the semiconductor memory device 1 according to the second embodiment. FIG. 54 is a cross-sectional view taken along line J-J in FIG. 53, illustrating an example of a cross-sectional structure during the manufacture of the semiconductor memory device 1.

By a process of step S2006, protection holes DH which are opened in shapes of protection pillars DP, and support pillar holes HH which are opened in shapes of support pillars HR, are formed as illustrated in FIG. 53 and FIG. 54. Specifically, to start with, by photolithography or the like, a mask with openings in areas corresponding to the protection holes DH and support pillar holes HH is formed. Then, by anisotropic etching using the formed mask, the protection holes DH and support pillar holes HH are formed.

[S2007]

Figure 55:
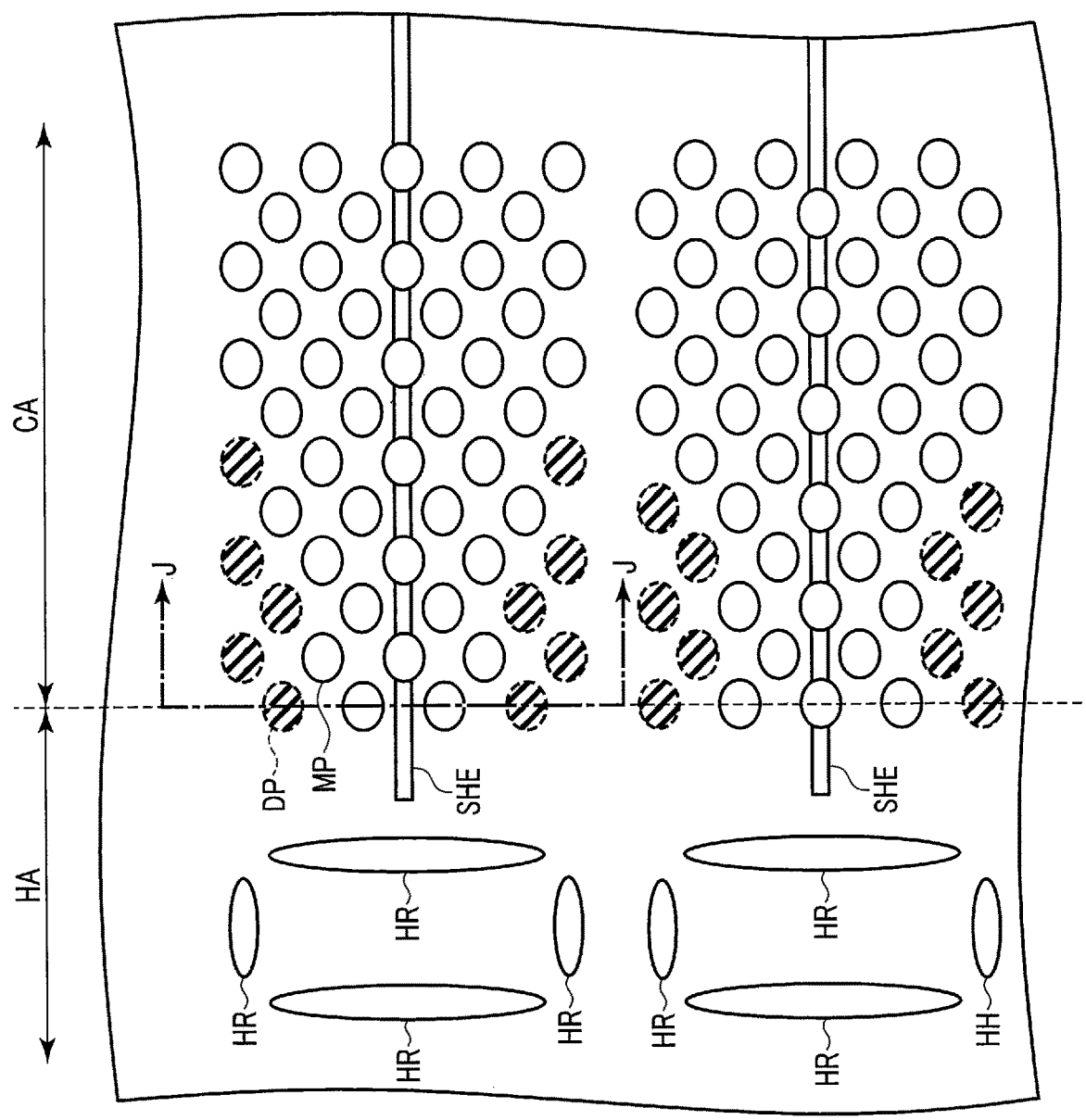
FIG. 55 illustrates an example of the planar layout during the manufacture of the semiconductor memory device according to the second embodiment.
Figure 56:
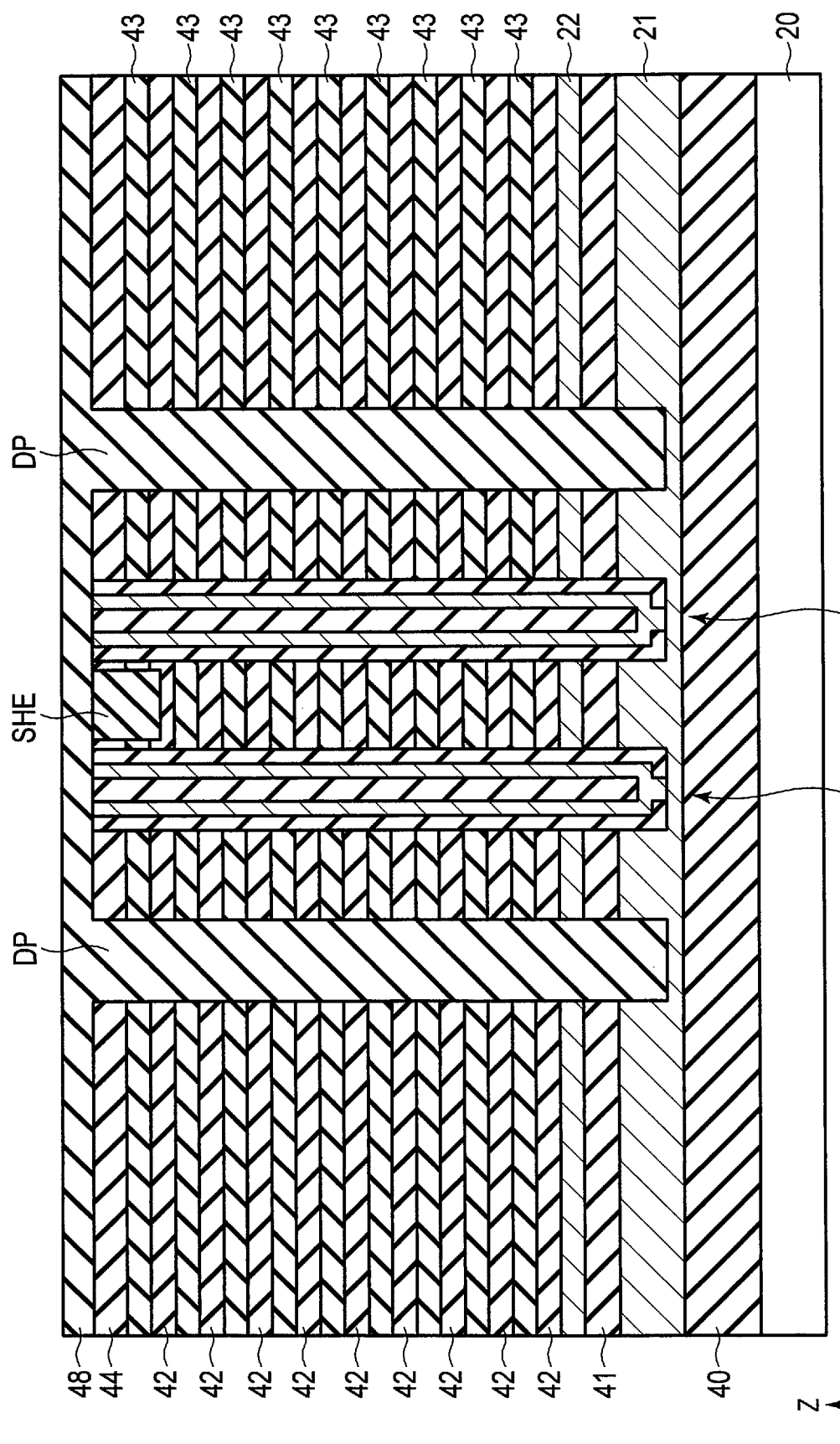
FIG. 56 is a cross-sectional view taken along line J-J in FIG. 55, illustrating an example of a cross-sectional structure during the manufacture of the semiconductor memory device.

Referring to FIG. 55 and FIG. 56, step S2007 is described. FIG. 55 illustrates an example of the planar layout during the manufacture of the semiconductor memory device 1 according to the second embodiment. FIG. 56 is a cross-sectional view taken along line J-J in FIG. 55, illustrating an example of a cross-sectional structure during the manufacture of the semiconductor memory device 1. In FIG. 55, the depiction of the insulating layer 48 provided on the insulating layer 44 is omitted for the purpose of easier understanding of the drawing.

By a process of step S2007, protection pillars DP and support pillars HR are formed. Specifically, as illustrated in FIG. 55 and FIG. 56, an insulating layer 48 is formed in the protection holes DH and support pillar holes HH and on the insulating layer 44.

Then, as illustrated in FIG. 34 and FIG. 35, for example, by CMP or the like, the insulating layer 48 formed on the insulating layer 44 is removed. Thereby, the protection pillars DP and support pillars HR, which are configured such that the insulating layer 48 is buried in the protection holes DH and support pillar holes HH, are formed.

[S2008] [S2009]

Steps S2008 and S2009 are the same as the above-described steps S1007 and S1008, and a description thereof is omitted.

<2-3> Advantageous Effects

According to the above-described second embodiment, the number of memory pillars MP near the array end of the cell area CA is decreased. There is a case in which electric charge, which is used in the manufacturing process of the memory cell array 10, is accumulated in the insulating film 34, semiconductor layer 31 or the like of the memory pillar MP. On the other hand, the protection pillar DP, which is provided in place of the memory pillar MP, includes a material different from the insulating film 34 or semiconductor layer 31 (an insulating material having a less amount of fixed charge than the insulating film 34, or an insulating material having a charge amount which does not become greater than in the insulating film 34 at the time of the manufacture of the semiconductor memory device). Thus, in the manufacturing process of the semiconductor memory device 1, electric charge is not easily accumulated in the protection pillar DP which is provided in place of the memory pillar MP. Thereby, even if the protection pillar DP is provided in place of the memory pillar MP, electric charge is not accumulated in the protection pillar DP in the manufacturing process of the memory cell array 10. Thus, a distortion in electric field distribution in the array end and in the formation area of the slit SLT can be suppressed. As a result, the problem described in the comparative example of the first embodiment can be suppressed. Thus, the same advantageous effects as in the first embodiment can be obtained.

<3> Other Modifications and the Like

In the above-described embodiments, the structure of the memory cell array 10 may be other structures. For example, the memory pillar MP may have such a structure that a plurality of pillars are coupled in the Z direction.

In the above embodiments, the case was exemplarily described in which the semiconductor memory device 1 has such a structure that circuitry, such as the sense amplifier module 16, is provided under the memory cell array 10. However, the embodiments are not limited to this. For example, the semiconductor memory device 1 may have such a structure that the memory cell array 10 and sense amplifier module 16 are formed on the semiconductor substrate 20. Further, the semiconductor memory device 1 may have such a structure that a chip, on which the sense amplifier module 16 and the like are provided, and a chip, on which the memory cell array 10 is provided, are attached to each other.

In the above embodiments, the case was described in which the word line WL and select gate line SGS neighbor each other, and the word line WL and select gate line SGD neighbor each other. However, the embodiments are not limited to this. For example, a dummy word line may be provided between the uppermost-layer word line WL and select gate line SGD. Similarly, a dummy word line may be provided between the lowermost-layer word line WL and select gate line SGS. In addition, in the case of the structure in which a plurality of pillars are coupled, a conductive layer near a coupled part may be used as a dummy word line.

In the drawings used in the description of the embodiments, the case is illustrated in which the outside diameters and cross-sectional areas of the memory holes MH, protection holes DH, etc. are fixed regardless of stacking positions. However, the embodiments are not limited to this. For example, the memory hole MH, protection hole DH or support pillar hole HH may have a taper shape, or may have such a shape that an intermediate portion in the Z direction bulges.

In the above-described second embodiment, the protection pillars DP are provided in the area where the memory pillars MP are thinned out. However, the protection pillars DP are not always necessary. For example, when the sacrificial members 43 are selectively removed by the process of step S1008 described in the second embodiment, if the three-dimensional structure is maintained by the memory pillars MP, support pillars HR and the like, the protection pillars DP are needless. In addition, by the process of step S1001 described in the second embodiment, the sacrificial members 43 that are replaced in the process of step S1008 are provided. When the conductive layers 23 and 24, and not the sacrificial members 43, are stacked in step S1001, a structure for maintaining the three-dimensional structure is needless since the conductive layers 23 and 24 are not removed. As a result, the protection pillars DP and support pillars HR become unnecessary. In the above-described second embodiment, such a structure may be adopted that the protection pillars DP are not provided.

In the present specification, the term "connection" means an electrical connection, and does not exclude, for example, a connection with another element being interposed. In addition, the expression "electrically connected" may also mean "electrically connected via an insulator" if the same operation as "electrically connected" is enabled. The expression "successively provided" means the formation by the same fabrication step. No boundary is formed in a successively provided part in a certain constituent element. The expression "successively provided" has the same meaning as a continuous film from a first portion to a second portion in a certain film or layer. The expression "film thickness" means, for example, a difference between an inside diameter and an outside diameter of a constituent element formed in the memory hole. The expressions "inside diameter", "outside diameter" and "cross-sectional area" mean an inside diameter, an outside diameter and an area in a cross section parallel to the semiconductor substrate 20. The expression "substantially identical" at a time when materials of pillars, cross-sectional areas, distances, etc. are the same may include a case in which there is a variance occurring in a fabrication step due to a position of formation or the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. A semiconductor memory device comprising:
a first stacked body in which a plurality of first conductive layers are stacked at intervals in a first direction above a semiconductor substrate;
a second stacked body in which a plurality of second conductive layers are stacked at intervals in the first direction above the semiconductor substrate;
a first slit extending in a second direction perpendicular to the first direction, the first slit isolating the first stacked body and the second stacked body in a third direction perpendicular to the first and second directions;
a first pillar group including a plurality of first pillars which penetrate the first stacked body in the first direction and are formed of a substantially identical material with a substantially identical cross-sectional area; and
a second pillar group including a plurality of second pillars which penetrate the second stacked body in the first direction and are formed of a substantially identical material to the material of the first pillars with a substantially identical cross-sectional area to the cross-sectional area of the first pillars,
the first stacked body including:
a first area in which the first pillar group is not provided;
a second area which neighbors the first area in the second direction and in which the first pillar group is provided; and
a third area which neighbors the second area in the second direction and in which the first pillar group is provided, the third area being configured such that an intersection portion between the first pillar and the first conductive layer functions as a memory cell transistor, and
the second stacked body including:
a fourth area in which the second pillar group is not provided;
a fifth area which neighbors the fourth area in the second direction and in which the second pillar group is provided; and
a sixth area which neighbors the fifth area in the second direction and in which the second pillar group is provided, the sixth area being configured such that an intersection portion between the second pillar and the second conductive layer functions as a memory cell transistor, wherein
the first pillar and the second pillar, which neighbor the first slit in the third direction, are provided in the third direction at positions which are included in the second and fifth areas and neighbor the first and fourth areas, and a distance to the first slit from the first pillar neighboring the first slit in the third direction and a distance to the first slit from the second pillar neighboring the first slit in the third direction are substantially identical, and
the first pillar and the second pillar, which neighbor the first slit in the third direction, are provided in the third direction in the third and sixth areas, and a distance to the first slit from the first pillar neighboring the first slit in the third direction and a distance to the first slit from the second pillar neighboring the first slit in the third direction are different.

2. The semiconductor memory device of claim 1, wherein a distance between the first pillars, which are provided in the second area and in a row along the second direction varies in accordance with a distance from the third area.

3. The semiconductor memory device of claim 2, wherein a distance between the second pillars, which are provided in the fifth area and in another row along the second direction varies in accordance with a distance from the sixth area.

4. The semiconductor memory device of claim 1, wherein a density of the first pillar group of the second area is different from a density of the first pillar group of the third area, and
a density of the first pillar group of the second area is different from a density of the second pillar group of the fifth area.

5. The semiconductor memory device of claim 1, wherein a pitch in the second direction between the first pillars of the first pillar group of the second area gradually increases towards the first area.

6. The semiconductor memory device of claim 5, wherein a pitch in the second direction between the second pillars of the second pillar group of the fifth area gradually increases towards the fourth area.

7. The semiconductor memory device of claim 1, wherein the first pillar group disposed in a column included in the second area and neighboring the first area and the second pillar group disposed in the column included in the fifth group and neighboring the fourth area are arranged line-symmetric, with the first slit being interposed.

8. The semiconductor memory device of claim 7, wherein the first pillar group in the third area and the second pillar group in the sixth area are arranged asymmetric, with the first slit being interposed.

9. The semiconductor memory device of claim 1, further comprising:
a third pillar in the first area, the third pillar penetrating the first stacked body in the first direction and formed to include a material different from the material of the first pillars; and
a fourth pillar in the fourth area, the fourth pillar penetrating the second stacked body in the first direction and formed to include a material different from the material of the second pillars.

10. The semiconductor memory device of claim 1, wherein each of the first pillars and the second pillars includes a core member provided in a central part thereof, a semiconductor layer surrounding a side surface of the core member, a first insulating film surrounding a side surface of the semiconductor layer, a second insulating film surrounding a side surface of the first insulating film, and a third insulating film surrounding a side surface of the second insulating film.

* * * * *